US009605875B2

(12) United States Patent
Boyle et al.

(10) Patent No.: US 9,605,875 B2
(45) Date of Patent: Mar. 28, 2017

(54) HYBRID SOLAR COLLECTOR

(75) Inventors: Richard Boyle, Crowborough (GB); Christophe Williams, New Malden (GB); Norman Cottington, Willingdon Eastbourne (GB)

(73) Assignee: Naked Energy Ltd, Guildford (GB)

( * ) Notice: Subject to any disclaimer, the term of this patent is extended or adjusted under 35 U.S.C. 154(b) by 0 days.

(21) Appl. No.: 13/426,306

(22) Filed: Mar. 21, 2012

(65) Prior Publication Data
US 2012/0318328 A1    Dec. 20, 2012

(30) Foreign Application Priority Data

Mar. 21, 2011 (GB) .................................. 1104722.2

(51) Int. Cl.
    *F24J 2/05*    (2006.01)
    *F24J 2/32*    (2006.01)
    (Continued)

(52) U.S. Cl.
    CPC ................. *F24J 2/055* (2013.01); *F24J 2/32* (2013.01); *F24J 2/4621* (2013.01); *F28D 15/0233* (2013.01); *F28D 15/0266* (2013.01); *F28F 13/187* (2013.01); *H01L 31/0521* (2013.01); *H02S 40/44* (2014.12); *Y02B 10/12* (2013.01); *Y02B 10/14* (2013.01); *Y02B 10/22* (2013.01);
    (Continued)

(58) Field of Classification Search
CPC .. F24J 2/055; F24J 2/032; F24J 2/04–2/0345; F24J 2/4621; H02S 40/44; H01L 31/0521; Y02B 10/20; Y02B 10/22; Y02B 10/70; Y02B 10/12; Y02B 10/14; Y02E 10/40; Y02E 10/44; Y02E 10/60; Y02E 10/52; F28D 15/0233; F28D 15/0266; F28F 13/187
USPC ........................... 136/243–265; 126/569–713
See application file for complete search history.

(56) References Cited

U.S. PATENT DOCUMENTS 4,102,325 A    7/1978   Cummings
4,119,085 A   10/1978   Knowles et al.
(Continued)

FOREIGN PATENT DOCUMENTS

AU      199524885 B2    1/1977
AU       95/24885 B2    1/1997
(Continued)

OTHER PUBLICATIONS

Human translation for JP 57-204754.*
(Continued)

*Primary Examiner* — James Lin
*Assistant Examiner* — Liesl C Baumann
(74) *Attorney, Agent, or Firm* — Wolf, Greenfield & Sacks, P.C.

(57) ABSTRACT

A solar energy converter comprising: a solar energy absorber, the solar energy absorber comprising a photovoltaic element; a heat transfer element in thermal contact with the solar energy absorber; a primary heat exchanger in thermal contact with the heat transfer element; a secondary heat exchanger; and a heat transfer control element; wherein the heat transfer control element is arranged to selectively place the secondary heat exchanger either in thermal contact with the heat transfer element or out of thermal contact with the heat transfer element.

21 Claims, 15 Drawing Sheets

(51) Int. Cl.
  *F24J 2/46* (2006.01)
  *F28D 15/02* (2006.01)
  *H01L 31/052* (2014.01)
  *F28F 13/18* (2006.01)
  *H02S 40/44* (2014.01)

(52) U.S. Cl.
  CPC .............. *Y02B 10/70* (2013.01); *Y02E 10/44* (2013.01); *Y02E 10/52* (2013.01); *Y02E 10/60* (2013.01)

(56) References Cited

U.S. PATENT DOCUMENTS

| | | | |
|---|---|---|---|
| 4,162,684 A | | 7/1979 | Loveless, Jr. |
| 4,184,895 A | * | 1/1980 | Oster, Jr. .................. 136/247 |
| 4,207,744 A | | 6/1980 | Takeshita et al. |
| 4,217,882 A | | 8/1980 | Feldman, Jr. |
| 4,240,405 A | * | 12/1980 | French ..................... 126/637 |
| 4,366,807 A | | 1/1983 | Barber, Jr. |
| 4,527,545 A | * | 7/1985 | Bertels ..................... 126/636 |
| 4,552,208 A | * | 11/1985 | Sorensen ................. 165/104.22 |
| 4,687,048 A | * | 8/1987 | Edelstein et al. ............ 165/301 |
| 6,889,756 B1 | | 5/2005 | Hou |
| 2002/0121298 A1 | | 9/2002 | Konold |
| 2004/0055631 A1 | * | 3/2004 | Szymocha et al. .......... 136/243 |
| 2005/0183847 A1 | | 8/2005 | Wong |
| 2008/0127967 A1 | | 6/2008 | Kimura et al. |
| 2010/0084001 A1 | | 4/2010 | Tsunomura et al. |
| 2010/0218803 A1 | * | 9/2010 | Maltby, Jr. .................. 136/244 |
| 2011/0203776 A1 | * | 8/2011 | McAlister ................ 165/104.26 |
| 2012/0318355 A1 | * | 12/2012 | Boyle et al. ................. 136/259 |

FOREIGN PATENT DOCUMENTS

| | | |
|---|---|---|
| AU | 711669 | 10/1999 |
| CN | 101090766 A | 12/2007 |
| CN | 101319823 A | 12/2008 |
| DE | 29813325 U1 | 1/1977 |
| DE | 29813325 U1 | 2/1999 |
| EP | 0767890 B1 | 12/1978 |
| EP | 767890 B1 | 12/1998 |
| FR | 2577024 A1 | 8/1986 |
| GB | 1533804 | 11/1978 |
| GB | 2054826 A | 2/1981 |
| GB | 2086563 A | 5/1982 |
| GB | 2484326 A | 10/2010 |
| GB | 1104722.2 | 4/2011 |
| GB | 1104722.2 | 7/2011 |
| GB | 1204978.9 | 7/2012 |
| GB | 1204980.5 | 7/2012 |
| GB | 1204978.9 | 7/2013 |
| GB | 1204980.5 | 7/2013 |
| JP | 56087742 A | 12/1979 |
| JP | 56-87742 A | 7/1981 |
| JP | 56087742 A | 7/1981 |
| JP | 56-142387 A | 11/1981 |
| JP | 58-22841 A | 2/1982 |
| JP | 58-142159 A | 2/1982 |
| JP | 58142159 A | 2/1982 |
| JP | 58-182054 A | 4/1982 |
| JP | 58182054 A | 4/1982 |
| JP | 1982204754 | 5/1982 |
| JP | 1982105544 | 6/1982 |
| JP | 57153162 A | 9/1982 |
| JP | 57-204754 | 12/1982 |
| JP | 57-204754 A | 12/1982 |
| JP | 57204754 A | 12/1982 |
| JP | 58-115264 A | 7/1983 |
| JP | 58-127050 A | 7/1983 |
| JP | 58182054 A | 10/1983 |
| JP | 1983198648 | 11/1983 |
| JP | 6-44769 A | 3/1985 |
| JP | 60044769 A * | 3/1985 |
| JP | 1988238361 | 4/1988 |
| JP | 1988045027 | 9/1989 |
| JP | 1991043563 | 9/1991 |
| JP | 3039163 U * | 7/1997 |
| JP | 1999037570 | 12/1999 |
| JP | 2008101822 A2 | 5/2008 |
| KR | 10-2009-0094521 A | 9/2009 |
| KR | 200994521 A | 9/2009 |
| MX | MX/a/2013/010838 | 10/2015 |
| NL | 1009011 | 4/1998 |
| NL | 1009011 C | 4/1998 |
| RU | 2154172 C2 | 5/1997 |
| WO | WO 2008/143482 A | 11/2008 |
| WO | WO 2008/143482 A2 | 11/2008 |
| WO | WO 2010/128251 A1 | 11/2010 |

OTHER PUBLICATIONS

Human translation for JP 60-044769.*
Human translation for NL 1009011.*
Australian Sun Energy, "Evacuated Tube Technology", Sep. 2009, obtained Jan. 6, 2014. http://web.archive.org/web/20090908013732/http://www.australiansunenergy.com.au/evacuated_tube.html.*
International Further Search Report for International Application No. GB1104722.2 dated Jul. 15, 2011.
International Search Report for International Application No. GB1104722.2 dated Apr. 15, 2011.
International Combined Search and Examination Report for International Application No. GB1204978.9 dated Jul. 9, 2012.
International Combined Search and Examination Report for International Application No. GB1204980.5 dated Jul. 6, 2012.
International Search Report and Written Opinion for International Application No. PCT/GB2012/050620 dated Aug. 31, 2012.
International Search Report and Written Opinion for nternational Application No. PCT/GB2012/050621 dated Aug. 31, 2012.
U.S. Appl. No. 13/426,253, filed Mar. 21, 2012, Richard Boyle et al.
Office Action for Chinese Application No. 201280024142.0, dated Jul. 21, 2015.
Office Action for Chinese Application No. 201280024142.0, dated Jun. 1, 2016.
Office Action for Mexican Application No. MX/a/2013/010841, dated May 10, 2016.
Eiamsa-Ard et al., Turbulent flow heat transfer and pressure loss in a double pipe heat exchanger with louvered strip inserts. International Communications in Heat and Mass Transfer. Feb. 29, 2008;35(2):120-9.
Szokolay S.V.; "Solar Energy and Building" British Edition SBN 0851395694—US Edition ISBN 0470843047—Solar Stirling Circuit.

* cited by examiner

HYBRID SOLAR COLLECTOR

RELATED APPLICATIONS

This application is a U.S. Utility patent Application which claims priority to British patent Application No. GB 1104722.2, filed on Mar. 21, 2011, the entirety of which is herein incorporated by reference.

FIELD OF THE INVENTION

This invention relates to solar energy converter devices and in particular to devices which convert incident solar energy into heat and electricity.

Devices converting solar energy into electricity are known. One means of converting solar energy into electricity is the use of photovoltaic arrays. Photovoltaic arrays generally consist of semi-conductor materials appropriately encapsulated, and arranged to generate electricity when exposed to solar radiation.

Separately, devices converting solar energy into useable heat are known. A variety of thermal collection devices are known which absorb heat energy when exposed to solar radiation. These thermal collectors heat up as they absorb heat energy from solar radiation and this heat energy may then be extracted for use, for example by pumping a liquid flow, such as water, through the thermal collector in order to heat the liquid.

It has been proposed to combine these two technologies to provide a hybrid solar energy collector converting solar energy simultaneously into both electricity and heat. Such hybrid devices have been found to suffer from the problem that the elements of the photovoltaic array become hot when the device is operating. In general, the efficiency of photovoltaic elements drops as their temperature increases. Also, in general, photovoltaic elements subject to high temperatures may suffer degradation resulting in a permanent decrease in efficiency. As a result, in use, the electricity generating efficiency of the photovoltaic arrays of such hybrid devices tends to be low, and tends to reduce over time.

SUMMARY OF THE INVENTION

A first aspect provides a solar energy converter comprising:
a solar energy absorber, the solar energy absorber comprising a photovoltaic element;
a heat transfer element in thermal contact with the solar energy absorber;
a primary heat exchanger in thermal contact with the heat transfer element;
a secondary heat exchanger; and
a heat transfer control element;
wherein the heat transfer control element is arranged to selectively place the secondary heat exchanger either in thermal contact with the heat transfer element or out of thermal contact with the heat transfer element.

Preferably, the solar energy absorber is located within an envelope.

Preferably, the envelope is a tube.
Preferably, the envelope has a circular cross-section.
Preferably, the envelope has an elliptical cross-section.
Preferably, the envelope is at least partially transparent.
Preferably, the envelope is at least partially evacuated.
Preferably, the envelope is at a pressure of $10^{-3}$ mbar or less.

Preferably, the envelope is at a pressure of $10^{-6}$ mbar or less.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the heat transfer element.

Preferably, the one or more of the thermally conductive layers is also an electrically insulating layer.

Preferably, the one or more of the thermally conductive layers comprise an adhesive.

Preferably, the adhesive is a flexible adhesive.
Preferably, the adhesive comprises an epoxy resin.
Preferably, the adhesive comprises a double sided adhesive tape.

Preferably, the heat transfer element is substantially rigid.
Preferably, the solar energy absorber comprises a plurality of photovoltaic elements.

Preferably, the primary heat exchanger transfers heat from the heat transfer element to a first fluid.

Preferably, the first fluid is water.
Preferably, the secondary heat exchanger transfers heat from the heat transfer element to a second fluid.

Preferably, the second fluid is air.
Preferably, the second fluid is water.
Preferably, the heat transfer control element is arranged to selectively place the secondary heat exchanger either in thermal contact with the heat transfer element or out of thermal contact with the heat transfer element in response to a sensed temperature.

Preferably, the sensed temperature is a temperature of the primary heat exchanger.

A second aspect provides a solar energy converter according to any preceding claim, wherein the heat transfer element comprises a heat transfer device comprising:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means; whereby heat energy is transported from the first surface to the second surface.

Preferably, the heat transfer element comprises a heat transfer device comprising:
a first fluid flow channel inclined to the horizontal and containing a liquid;
a second fluid flow channel connected to the first fluid flow channel and containing the liquid; and
a first surface in thermal contact with the liquid in the first fluid flow channel;
wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel;
whereby heat energy is transported away from the first surface.

Preferably, the heat transfer element comprises a heat transfer device comprising:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;
whereby, when the first surface is hotter than the second surface, heat energy from the first surface causes liquid in the first fluid flow channel to vaporize;
the vapor travels upwardly along the first fluid flow channel and through the tube, and
condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface.

Preferably, the heat transfer element comprises a heat transfer device comprising:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface.

Preferably, the heat transfer element comprises a heat transfer device having a working fluid capable of circulating around a fluid flow path, the circulation around the fluid flow path bringing the working fluid in and out of thermal contact with a heat source, the heat transfer device comprising:
a fluid containing portion internally defining a working fluid flow path;
a heat source at least partially in thermal contact with the fluid containing portion;
a gas substance generator at least partially within the fluid containing portion, and arranged to generate bubbles of vapor capable of driving the working fluid along a portion of the working fluid flow path in thermal contact with the heat source;
wherein, in use, the driven working fluid absorbs heat from the heat source and transports the heat away from the heat source; and
the driven working fluid returns to the gas substance generator to be recycled about the fluid flow path.

Preferably, the fluid flow means, tube, or fluid containing portion of the heat transfer device extends from the solar energy absorber through the primary heat exchanger and into the secondary heat exchanger.

Preferably, the heat transfer control element is arranged to selectively block the fluid flow means, or tube, of the heat transfer device.

A second aspect provides a solar energy converter comprising:
a solar energy absorber, the solar energy absorber comprising a photovoltaic element; and
a heat transfer device in thermal contact with the solar energy absorber;
wherein the heat transfer device is in thermal contact with the photovoltaic element; and
the heat transfer device is arranged to transfer heat energy away from the photovoltaic element to cool the photovoltaic element.

Preferably, the heat transfer device comprises:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means;
whereby heat energy is transported from the first surface to the second surface.

Preferably, the heat transfer device comprises:
a first fluid flow channel inclined to the horizontal and containing a liquid;
a second fluid flow channel connected to the first fluid flow channel and containing the liquid; and
a first surface in thermal contact with the liquid in the first fluid flow channel;

wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel;
whereby heat energy is transported away from the first surface.

Preferably, the heat transfer device comprises:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;
whereby, when the first surface is hotter than the second surface, heat energy from the first surface causes liquid in the first fluid flow channel to vaporize;
the vapor travels upwardly along the first fluid flow channel and through the tube, and
condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface.

Preferably, the heat transfer device comprises:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface.

Preferably, the heat transfer device has a working fluid capable of circulating around a fluid flow path, the circulation around the fluid flow path bringing the working fluid in and out of thermal contact with a heat source and a second surface, the heat transfer device comprising:
a fluid containing portion internally defining a working fluid flow path;
a heat source at least partially in thermal contact with the fluid containing portion;
a gas substance generator at least partially within the fluid containing portion, and arranged to generate bubbles of gas or vapor capable of driving the working fluid along a portion of the working fluid flow path in thermal contact with the heat source;
wherein, in use, the driven working fluid absorbs heat from the heat source and transports the heat away from the heat source; and
the driven working fluid returns to the gas substance generator to be recycled about the fluid flow path.

Preferably, the solar energy converter further comprises:
a heat exchanger in thermal contact with the heat transfer device;
wherein the second surface is in thermal contact with the heat exchanger and the heat transfer device is arranged to transfer heat energy from the photovoltaic element to the heat exchanger to cool the photovoltaic element.

Preferably, the heat exchanger comprises the second surface.

Preferably, the solar energy absorber is located within an envelope.

Preferably, the envelope is a tube.

Preferably, the envelope has a circular cross-section.

Preferably, the envelope has an elliptical cross-section.

Preferably, the envelope is at least partially transparent.

Preferably, the envelope is at least partially evacuated.

Preferably, the envelope is at a pressure of $10^{-3}$ mbar or less.

Preferably, the envelope is at a pressure of $10^{-6}$ mbar or less.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the heat transfer element.

Preferably, the one or more of the thermally conductive layers is also an electrically insulating layer.

Preferably, the one or more of the thermally conductive layers comprise an adhesive.

Preferably, the adhesive is a flexible adhesive.

Preferably, the adhesive comprises an epoxy resin.

Preferably, the adhesive comprises a double sided adhesive tape.

Preferably, the heat transfer element is substantially rigid.

Preferably, the solar energy absorber comprises a plurality of photovoltaic elements.

A third aspect provides a solar energy converter comprising:
a photovoltaic element; and
a cooled element having a substantially isothermal cooled surface; the photovoltaic element being located in thermal contact with the substantially isothermal cooled surface of the cooled element.

Preferably, the solar energy converter further comprises:
a heat transfer device comprising:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means;
whereby heat energy is transported from the first surface to the second surface;
wherein the substantially isothermal cooled surface of the cooled element is the first surface.

Preferably, the solar energy converter further comprises:
a heat transfer device comprising:
a first fluid flow channel inclined to the horizontal and containing a liquid;
a second fluid flow channel connected to the first fluid flow channel and containing the liquid; and
a first surface in thermal contact with the liquid in the first fluid flow channel;
wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel;
whereby heat energy is transported away from the first surface.

Preferably, the solar energy converter further comprises:
a heat transfer device comprising:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;
whereby, when the first surface is hotter than the second surface, heat energy from the first surface causes liquid in the first fluid flow channel to vaporize;
the vapor travels upwardly along the first fluid flow channel and through the tube, and condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface;
wherein the substantially isothermal cooled surface of the cooled element is the first surface.

Preferably, the solar energy converter further comprises:
a heat transfer device comprising:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface;
wherein the substantially isothermal cooled surface of the cooled element is the first surface.

Preferably, the solar energy converter further comprises:
a heat transfer device having a working fluid capable of circulating around a fluid flow path, the circulation around the fluid flow path bringing the working fluid in and out of thermal contact with a heat source, the heat transfer device comprising:
a fluid containing portion internally defining a working fluid flow path;
a heat source at least partially in thermal contact with a first surface of the fluid containing portion;
a gas substance generator at least partially within the fluid containing portion, and arranged to generate bubbles of gas or vapor capable of driving the working fluid along a portion of the working fluid flow path in thermal contact with the heat source;
wherein, in use, the driven working fluid absorbs heat from the heat source and transports the heat away from the heat source to a second surface; and
the driven working fluid returns to the gas substance generator to be recycled about the fluid flow path;
wherein the substantially isothermal cooled surface of the cooled element is the first surface.

Preferably, the solar energy converter further comprises:
a heat exchanger in thermal contact with the heat transfer device;
wherein the second surface is in thermal contact with the heat exchanger and the heat transfer device is arranged to transfer heat energy from the photovoltaic element to the heat exchanger to cool the photovoltaic element.

Preferably, the heat exchanger comprises the second surface.

Preferably, the solar energy absorber is located within an envelope.

Preferably, the envelope is a tube.
Preferably, the envelope has a circular cross-section.
Preferably, the envelope has an elliptical cross-section.
Preferably, the envelope is at least partially transparent.
Preferably, the envelope is at least partially evacuated.
Preferably, the envelope is at a pressure of $10^{-3}$ mbar or less.
Preferably, the envelope is at a pressure of $10^{-6}$ mbar or less.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the substantially isothermal cooled surface.

Preferably, the one or more of the thermally conductive layers is also an electrically insulating layer.

Preferably, the one or more of the thermally conductive layers comprise an adhesive.

Preferably, the adhesive is a flexible adhesive.

Preferably, the adhesive comprises an epoxy resin.

Preferably, the adhesive comprises a double sided adhesive tape.

Preferably, the heat transfer device is substantially rigid.

Preferably, the solar energy absorber comprises a plurality of photovoltaic elements.

A fourth aspect provides a solar energy converter comprising:
a solar energy absorber; and
a heat transfer device arranged to cool the solar energy absorber; and
a cooling control element arranged to control the degree of cooling applied to the solar energy absorber by the heat transfer device.

Preferably, the heat transfer device comprises:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means;
whereby heat energy is transported from the first surface to the second surface.

Preferably, the heat transfer device comprises:
a first fluid flow channel inclined to the horizontal and containing a liquid;
a second fluid flow channel connected to the first fluid flow channel and containing the liquid; and
a first surface in thermal contact with the liquid in the first fluid flow channel;
wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel;
whereby heat energy is transported away from the first surface.

Preferably, the heat transfer device comprises:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;
whereby, when the first surface is hotter than the second surface, heat energy from the first surface causes liquid in the first fluid flow channel to vaporize; the vapor travels upwardly along the first fluid flow channel and through the tube, and condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface.

Preferably, the heat transfer device comprises:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface.

Preferably, the heat transfer device has a working fluid capable of circulating around a fluid flow path, the circulation around the fluid flow path bringing the working fluid in and out of thermal contact with a heat source, the heat transfer device comprising:
a fluid containing portion internally defining a working fluid flow path;
a heat source at least partially in thermal contact with the fluid containing portion;
a gas substance generator at least partially within the fluid containing portion, and arranged to generate bubbles of gas or vapor capable of driving the working fluid along a portion of the working fluid flow path in thermal contact with the heat source;
wherein, in use, the driven working fluid absorbs heat from the heat source and transports the heat away from the heat source; and
the driven working fluid returns to the gas substance generator to be recycled about the fluid flow path.

Preferably, the cooling control element is arranged to change the degree of cooling by changing the vacuum pressure within the heat transfer device.

Preferably, the solar energy converter further comprises:
a heat exchanger in thermal contact with the heat transfer device;

wherein the heat exchanger transfers heat energy from the heat transfer device to an operating fluid; and the cooling control element is arranged to change the degree of cooling by changing a flow rate of the operating fluid through the heat exchanger.

Preferably, the solar energy absorber is located within an envelope.

Preferably, the envelope is a tube.

Preferably, the envelope has a circular cross-section.

Preferably, the envelope has an elliptical cross-section.

Preferably, the envelope is at least partially transparent.

Preferably, the envelope is at least partially evacuated.

Preferably, the envelope is at a pressure of $10^{-3}$ mbar or less.

Preferably, the envelope is at a pressure of $10^{-6}$ mbar or less.

Preferably, the cooling control element is arranged to change the degree of cooling of the solar energy absorber by changing the pressure within the envelope.

Preferably, the solar energy converter further comprises an orientation control element arranged to control the orientation of the solar energy absorber;

wherein the cooling control element is arranged to change the orientation of the solar energy absorber to change the amount of solar energy incident on the solar energy absorber.

Preferably, the solar energy converter further comprises an insolation control element arranged to control the amount of solar energy impinging on the solar energy absorber;

wherein the cooling control element is arranged to change the amount of solar energy impinging on the solar energy absorber.

Preferably, the solar energy absorber comprises a photovoltaic element.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the heat transfer device.

Preferably, the one or more of the thermally conductive layers is also an electrically insulating layer.

Preferably, the one or more of the thermally conductive layers comprise an adhesive.

Preferably, the adhesive is a flexible adhesive.

Preferably, the adhesive comprises an epoxy resin.

Preferably, the adhesive comprises a double sided adhesive tape.

Preferably, the heat transfer device is substantially rigid.

Preferably, the solar energy absorber comprises a plurality of photovoltaic elements.

A fifth aspect provides a solar energy converter comprising:

a photovoltaic element;

a cooled element having a cooled surface with an adjustable temperature;

a temperature sensor; and a temperature control element arranged to adjust the temperature of the cooled surface of the cooled element;

the photovoltaic element being located in thermal contact with the cooled surface of the cooled element; and the temperature control element being arranged adjust the temperature of the cooled surface of the cooled element in response to the temperature sensed by the temperature sensor.

Preferably, the temperature sensor is arranged to sense the temperature of the cooled surface.

Preferably, the temperature sensor is arranged to sense the temperature of the photovoltaic element.

Preferably, the solar energy converter further comprises a heat transfer device comprising:

a fluid flow means extending between a first surface and a second surface, at least a part of the fluid flow means being inclined to the horizontal;

the fluid flow means being partially filled with a liquid and being arranged so that the first surface is in thermal contact with the liquid in at least a first part of the fluid flow means inclined to the horizontal and containing the liquid; and the first part of the fluid flow means being divided into a first fluid flow channel and a second fluid flow channel arranged so that the liquid in the first fluid flow channel is in better thermal contact with the first surface than the liquid in the second fluid flow channel;

wherein the part of the fluid flow means above the surface of the liquid is at least partially evacuated;

whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;

vapor travels from the surface of the liquid to the second surface and condenses at the second surface; and condensed liquid returns from the second surface to the first part of the fluid flow means;

whereby heat energy is transported from the first surface to the second surface.

Preferably, the solar energy converter further comprises a heat transfer device comprising:

a first fluid flow channel inclined to the horizontal and containing a liquid;

a second fluid flow channel connected to the first fluid flow channel and containing the liquid; and a first surface in thermal contact with the liquid in the first fluid flow channel;

wherein heat energy from the first surface causes liquid in the first fluid flow channel to vaporize;

the vapor travels upwardly along the first fluid flow channel; and the vapor drives a flow of liquid from the second fluid flow channel to the first fluid flow channel and upwardly along the first fluid flow channel;

whereby heat energy is transported away from the first surface.

Preferably, the solar energy converter further comprises a heat transfer device comprising:

a first surface;

a second surface;

a liquid reservoir in thermal contact with the first surface and containing a liquid; and a tube connecting the liquid reservoir to the second surface;

wherein the liquid reservoir comprises a first fluid flow channel inclined to the horizontal and containing the liquid and a second fluid flow channel connected to the first fluid flow channel and containing the liquid;

the first surface is in thermal contact with the liquid in the first fluid flow channel; and at least a part of the tube is at least partially evacuated;

whereby, when the first surface is hotter than the second surface, heat energy from the first surface causes liquid in the first fluid flow channel to vaporize;

the vapor travels upwardly along the first fluid flow channel and through the tube, and condenses at the second surface; the vapor drives a flow of liquid from the second fluid flow channel to the first fluid flow channel and upwardly along the first fluid flow channel; and condensed liquid returns from the second surface to the liquid reservoir;

whereby heat energy is transported away from the first surface to the second surface.

Preferably, the solar energy converter further comprises a heat transfer device comprising:

a first surface;

a second surface;

a liquid reservoir in thermal contact with the first surface and containing a liquid; and a tube connecting the liquid reservoir to the second surface; wherein at least a part of the tube is at least partially evacuated;

whereby, when the first surface is hotter than the second surface, heat energy from the first surface causes liquid in the liquid reservoir to vaporize;

the vapor travels through the tube and condenses at the second surface; and condensed liquid returns from the second surface to the liquid reservoir;

whereby heat energy is transported from the first surface to the second surface.

Preferably, the solar energy converter further comprises a heat transfer device having a working fluid capable of circulating around a fluid flow path, the circulation around the fluid flow path bringing the working fluid in and out of thermal contact with a heat source, the heat transfer device comprising:

a fluid containing portion internally defining a working fluid flow path;

a heat source at least partially in thermal contact with the fluid containing portion;

a gas substance generator at least partially within the fluid containing portion, and arranged to generate bubbles of gas or vapor capable of driving the working fluid along a portion of the working fluid flow path in thermal contact with the heat source; wherein, in use, the driven working fluid absorbs heat from the heat source and transports the heat away from the heat source; and the driven working fluid returns to the gas substance generator to be recycled about the fluid flow path.

Preferably, the temperature control element is arranged to adjust the temperature of the cooled surface by changing the vacuum pressure within the heat transfer device.

Preferably, the solar energy converter further comprises:

a heat exchanger in thermal contact with the heat transfer device;

wherein the heat exchanger transfers heat energy from the heat transfer device to an operating fluid; and the temperature control element is arranged to adjust the temperature of the cooled surface by changing a flow rate of the operating fluid through the heat exchanger.

Preferably, the solar energy absorber is located within an envelope.

Preferably, the envelope is a tube.

Preferably, the envelope has a circular cross-section.

Preferably, the envelope has an elliptical cross-section.

Preferably, the envelope is at least partially transparent.

Preferably, the envelope is at least partially evacuated.

Preferably, the envelope is at a pressure of $10^{-3}$ mbar or less.

Preferably, the envelope is at a pressure of $10^{-6}$ mbar or less.

Preferably, the temperature control element is arranged to adjust the temperature of the cooled surface by changing the pressure within the envelope.

Preferably, the solar energy converter further comprises an orientation control element arranged to control the orientation of the photovoltaic element;

wherein the cooling control element is arranged to adjust the temperature of the cooled surface by changing the orientation of the photovoltaic element to change the amount of solar energy incident on the photovoltaic element.

Preferably, the solar energy converter further comprises an insolation control element arranged to control the amount of solar energy impinging on the photovoltaic element;

wherein the temperature control element is arranged to adjust the temperature of the cooled surface by changing the amount of solar energy impinging on the photovoltaic element.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the cooled surface with an adjustable temperature.

Preferably, the one or more of the thermally conductive layers is also an electrically insulating layer.

Preferably, the one or more of the thermally conductive layers comprise an adhesive.

Preferably, the adhesive is a flexible adhesive.

Preferably, the adhesive comprises an epoxy resin.

Preferably, the adhesive comprises a double sided adhesive tape.

Preferably, the heat transfer device is substantially rigid.

Preferably, the solar energy absorber comprises a plurality of photovoltaic elements.

A sixth aspect provides a solar energy converter comprising:

a photovoltaic element; and a heat transfer device arranged to transfer heat from the photovoltaic element to a fluid to cool the photovoltaic element and heat the fluid; and a temperature control element arranged to control the temperature of the photovoltaic element;

wherein the temperature control element is arranged to control the temperature of the photovoltaic element to vary the relative amounts of electrical energy output by the photovoltaic element and useable heat energy output in the heated fluid.

Preferably, the temperature control element is arranged to control the temperature of the photovoltaic element to a lower temperature value and increase the amount of electrical energy output by the photovoltaic element.

Preferably, the temperature control element is arranged to control the temperature of the photovoltaic element to a lower temperature value and decrease the temperature of the heated fluid.

Preferably, the temperature control element is arranged to control the temperature of the photovoltaic element to a higher temperature value and decrease the amount of electrical energy output by the photovoltaic element.

Preferably, the temperature control element is arranged to control the temperature of the photovoltaic element to a higher temperature value and increase the temperature of the heated fluid.

Preferably, the heat transfer element comprises a heat transfer device comprising:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means;
whereby heat energy is transported from the first surface to the second surface.

Preferably, the heat transfer element comprises a heat transfer device comprising:
a first fluid flow channel inclined to the horizontal and containing a liquid;
a second fluid flow channel connected to the first fluid flow channel and containing the liquid; and
a first surface in thermal contact with the liquid in the first fluid flow channel;
wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel;
whereby heat energy is transported away from the first surface.

Preferably, the heat transfer element comprises a heat transfer device comprising:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;

whereby, when the first surface is hotter than the second surface, heat energy from the first surface causes liquid in the first fluid flow channel to vaporize;
the vapor travels upwardly along the first fluid flow channel and through the tube, and condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface.

Preferably, the heat transfer element comprises a heat transfer device comprising:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface.

Preferably, the heat transfer element comprises a heat transfer device having a working fluid capable of circulating around a fluid flow path, the circulation around the fluid flow path bringing the working fluid in and out of thermal contact with a heat source, the heat transfer device comprising:
a fluid containing portion internally defining a working fluid flow path;
a heat source at least partially in thermal contact with the fluid containing portion;
a gas substance generator at least partially within the fluid containing portion, and arranged to generate bubbles of vapor capable of driving the working fluid along a portion of the working fluid flow path in thermal contact with the heat source;
wherein, in use, the driven working fluid absorbs heat from the heat source and transports the heat away from the heat source; and
the driven working fluid returns to the gas substance generator to be recycled about the fluid flow path.

Preferably, the temperature control element is arranged to adjust the temperature of the cooled surface by changing the vacuum pressure within the heat transfer device.

Preferably, tjhe solar energy converter further comprises:
a heat exchanger in thermal contact with the heat transfer device;
wherein the heat exchanger transfers heat energy from the heat transfer device to an operating fluid; and
the temperature control element is arranged to adjust the temperature of the cooled surface by changing a flow rate of the operating fluid through the heat exchanger.

Preferably, the solar energy absorber is located within an envelope.

Preferably, the envelope is a tube.
Preferably, the envelope has a circular cross-section.
Preferably, the envelope has an elliptical cross-section.
Preferably, the envelope is at least partially transparent.
Preferably, the envelope is at least partially evacuated.

Preferably, the envelope is at a pressure of $10^{-3}$ mbar or less.

Preferably, the envelope is at a pressure of $10^{-6}$ mbar or less.

Preferably, the temperature control element is arranged to adjust the temperature of the cooled surface by changing the pressure within the envelope.

Preferably, the solar energy converter further comprises an orientation control element arranged to control the orientation of the photovoltaic element;
wherein the cooling control element is arranged to adjust the temperature of the cooled surface by changing the orientation of the photovoltaic element to change the amount of solar energy incident on the photovoltaic element.

Preferably, the solar energy converter further comprises an insolation control element arranged to control the amount of solar energy impinging on the photovoltaic element;
wherein the temperature control element is arranged to adjust the temperature of the cooled surface by changing the amount of solar energy impinging on the photovoltaic element.

Preferably, the photovoltaic element is arranged to generate electrical energy when exposed to solar radiation.

Preferably, the solar energy converter further comprises conductors arranged to output generated electrical energy.

Preferably, the photovoltaic element comprises a semiconductor material.

Preferably, the photovoltaic element comprises silicon.

Preferably, the photovoltaic element comprises gallium arsenide.

Preferably, one or more thermally conductive layers are disposed between the photovoltaic element and the heat transfer device.

Preferably, the one or more of the thermally conductive layers is also an electrically insulating layer.

Preferably, the one or more of the thermally conductive layers comprise an adhesive.

Preferably, the adhesive is a flexible adhesive.

Preferably, the adhesive comprises an epoxy resin.

Preferably, the adhesive comprises a double sided adhesive tape.

Preferably, the heat transfer device is substantially rigid.

Preferably, the solar energy absorber comprises a plurality of photovoltaic elements.

Preferably, the solar energy converter is a hybrid solar energy converter arranged to output electrical energy and useable heat energy.

A seventh aspect provides a solar energy converter array comprising a plurality of solar energy converters.

An eighth aspect provides a solar energy converter comprising:
a solar energy absorber;
a heat transfer element in thermal contact with the solar energy absorber;
a primary heat exchanger in thermal contact with the heat transfer element;
a secondary heat exchanger; and
a heat transfer control element;
wherein the heat transfer control element is arranged to selectively place the secondary heat exchanger either in thermal contact with the heat transfer element or out of thermal contact with the heat transfer element.

Preferably, the solar energy absorber is located within an envelope.

Preferably, the envelope is a tube.

Preferably, the envelope has a circular cross-section.

Preferably, the envelope has an elliptical cross-section.

Preferably, the envelope is at least partially transparent.

Preferably, the envelope is at least partially evacuated.

Preferably, the envelope is at a pressure of $10^{-3}$ mbar or less.

Preferably, the envelope is at a pressure of $10^{-6}$ mbar or less.

Preferably, the primary heat exchanger transfers heat from the heat transfer element to a first fluid.

Preferably, the first fluid is water.

Preferably, the secondary heat exchanger transfers heat from the heat transfer element to a second fluid.

Preferably, the second fluid is air.

Preferably, the heat transfer control element is arranged to selectively place the secondary heat exchanger either in thermal contact with the heat transfer element or out of thermal contact with the heat transfer element in response to a sensed temperature.

Preferably, the sensed temperature is a temperature of the primary heat exchanger.

Preferably, the heat transfer element comprises a heat transfer device comprising:
a fluid flow means extending between a first surface and a second surface, at least a part of the fluid flow means being inclined to the horizontal;
the fluid flow means being partially filled with a liquid and being arranged so that the first surface is in thermal contact with the liquid in at least a first part of the fluid flow means inclined to the horizontal and containing the liquid; and
the first part of the fluid flow means being divided into a first fluid flow channel and a second fluid flow channel arranged so that the liquid in the first fluid flow channel is in better thermal contact with the first surface than the liquid in the second fluid flow channel;
wherein the part of the fluid flow means above the surface of the liquid is at least partially evacuated;
whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel;
vapor travels from the surface of the liquid to the second surface and condenses at the second surface; and
condensed liquid returns from the second surface to the first part of the fluid flow means;
whereby heat energy is transported from the first surface to the second surface;
the solar energy absorber comprising the first surface and the primary heat exchanger and secondary heat exchanger comprising the second surface.

Preferably, the heat transfer element comprises a heat transfer device comprising:
a first fluid flow channel inclined to the horizontal and containing a liquid;
a second fluid flow channel connected to the first fluid flow channel and containing the liquid; and
a first surface in thermal contact with the liquid in the first fluid flow channel;
wherein heat energy from the first surface causes liquid in the first fluid flow channel to vaporize;
the vapor travels upwardly along the first fluid flow channel; and
the vapor drives a flow of liquid from the second fluid flow channel to the first fluid flow channel and upwardly along the first fluid flow channel; and
the vapor condenses on a second surface;

whereby heat energy is transported away from the first surface to the second surface; the solar energy absorber comprising the first surface and the primary heat exchanger and secondary heat exchanger comprising the second surface.

Preferably, the heat transfer element comprises a heat transfer device comprising:

a first surface;

a second surface;

a liquid reservoir in thermal contact with the first surface and containing a liquid; and a tube connecting the liquid reservoir to the second surface; wherein the liquid reservoir comprises a first fluid flow channel inclined to the horizontal and containing the liquid and a second fluid flow channel connected to the first fluid flow channel and containing the liquid;

the first surface is in thermal contact with the liquid in the first fluid flow channel; and at least a part of the tube is at least partially evacuated;

whereby, when the first surface is hotter than the second surface, heat energy from the first surface causes liquid in the first fluid flow channel to vaporize;

the vapor travels upwardly along the first fluid flow channel and through the tube, and condenses at the second surface;

the vapor drives a flow of liquid from the second fluid flow channel to the first fluid flow channel and upwardly along the first fluid flow channel; and condensed liquid returns from the second surface to the liquid reservoir;

whereby heat energy is transported away from the first surface to the second surface; the solar energy absorber comprising the first surface and the primary heat exchanger and secondary heat exchanger comprising the second surface.

Preferably, the heat transfer element comprises a heat transfer device comprising:

a first surface;

a second surface;

a liquid reservoir in thermal contact with the first surface and containing a liquid; and a tube connecting the liquid reservoir to the second surface; wherein at least a part of the tube is at least partially evacuated;

whereby, when the first surface is hotter than the second surface, heat energy from the first surface causes liquid in the liquid reservoir to vaporize;

the vapor travels through the tube and condenses at the second surface; and condensed liquid returns from the second surface to the liquid reservoir;

whereby heat energy is transported from the first surface to the second surface;

the solar energy absorber comprising the first surface and the primary heat exchanger and secondary heat exchanger comprising the second surface.

Preferably, the heat transfer element comprises a heat transfer device having a working fluid capable of circulating around a fluid flow path, the circulation around the fluid flow path bringing the working fluid in and out of thermal contact with a heat source, the heat transfer device comprising:

a fluid containing portion internally defining a working fluid flow path;

a heat source at least partially in thermal contact with a first surface of the fluid containing portion;

a gas substance generator at least partially within the fluid containing portion, and arranged to generate bubbles of gas or vapor capable of driving the working fluid along a portion of the working fluid flow path in thermal contact with the heat source;

wherein, in use, the driven working fluid absorbs heat from the heat source and transports the heat away from the heat source to a second surface of the fluid containing portion; and the driven working fluid returns to the gas substance generator to be recycled about the fluid flow path;

the solar energy absorber comprising the first surface and the primary heat exchanger and secondary heat exchanger comprising the second surface.

Preferably, the solar energy converter is arranged to allow passage of vapor through the primary heat exchanger and into the secondary heat exchanger.

Preferably, the heat transfer control element is arranged to selectively block passage of vapor through the primary heat exchanger and into the secondary heat exchanger.

A ninth aspect provides a solar energy converter array comprising a plurality of solar energy converters.

A tenth aspect provides a solar energy converter comprising:

a solar energy absorber; and a heat transfer device in thermal contact with the solar energy absorber;

wherein the heat transfer device is in thermal contact with the solar energy absorber; and the heat transfer device is arranged to transfer heat energy away from the solar energy absorber.

Preferably, the heat transfer device comprises:

a fluid flow means extending between a first surface and a second surface, at least a part of the fluid flow means being inclined to the horizontal;

the fluid flow means being partially filled with a liquid and being arranged so that the first surface is in thermal contact with the liquid in at least a first part of the fluid flow means inclined to the horizontal and containing the liquid; and the first part of the fluid flow means being divided into a first fluid flow channel and a second fluid flow channel arranged so that the liquid in the first fluid flow channel is in better thermal contact with the first surface than the liquid in the second fluid flow channel;

wherein the part of the fluid flow means above the surface of the liquid is at least partially evacuated;

whereby, when the first surface is hotter than the second surface, heat energy from the first surface causes the liquid in the first fluid flow channel to vaporize, and the vapor travels through the liquid in the first fluid flow channel to the surface of the liquid, such that the liquid circulates around the first fluid flow channel and the second fluid flow channel; vapor travels from the surface of the liquid to the second surface and condenses at the second surface; and condensed liquid returns from the second surface to the first part of the fluid flow means;

whereby heat energy is transported from the first surface to the second surface.

Preferably, the heat transfer device comprises:

a first fluid flow channel inclined to the horizontal and containing a liquid;

a second fluid flow channel connected to the first fluid flow channel and containing the liquid; and a first surface in thermal contact with the liquid in the first fluid flow channel;

wherein heat energy from the first surface causes liquid in the first fluid flow channel to vaporize;

the vapor travels upwardly along the first fluid flow channel; and the vapor drives a flow of liquid from the second fluid flow channel to the first fluid flow channel and upwardly along the first fluid flow channel;
whereby heat energy is transported away from the first surface.

Preferably, the heat transfer device comprises:
a first surface;
a second surface;
a liquid reservoir in thermal contact with the first surface and containing a liquid; and
a tube connecting the liquid reservoir to the second surface;
wherein the liquid reservoir comprises a first fluid flow channel inclined to the horizontal and containing the liquid and a second fluid flow channel connected to the first fluid flow channel and containing the liquid;
the first surface is in thermal contact with the liquid in the first fluid flow channel; and
at least a part of the tube is at least partially evacuated;
whereby, when the first surface is hotter than the second surface, heat energy from the first surface causes liquid in the first fluid flow channel to vaporize;
the vapor travels upwardly along the first fluid flow channel and through the tube, and
condenses at the second surface;
the vapor drives a flow of liquid from the second fluid flow channel to the first fluid flow channel and upwardly along the first fluid flow channel; and
condensed liquid returns from the second surface to the liquid reservoir;
whereby heat energy is transported away from the first surface to the second surface.

Preferably, the heat transfer device comprises:
a first surface;
a second surface;
a liquid reservoir in thermal contact with the first surface and containing a liquid; and
a tube connecting the liquid reservoir to the second surface;
wherein at least a part of the tube is at least partially evacuated;
whereby, when the first surface is hotter than the second surface, heat energy from the first surface causes liquid in the liquid reservoir to vaporize;
the vapor travels through the tube and condenses at the second surface; and
condensed liquid returns from the second surface to the liquid reservoir;
whereby heat energy is transported from the first surface to the second surface.

Preferably, the heat transfer device has a working fluid capable of circulating around a fluid flow path, the circulation around the fluid flow path bringing the working fluid in and out of thermal contact with a heat source and a second surface, the heat transfer device comprising:
a fluid containing portion internally defining a working fluid flow path;
a heat source at least partially in thermal contact with the fluid containing portion;
a gas substance generator at least partially within the fluid containing portion, and arranged to generate bubbles of gas or vapor capable of driving the working fluid along a portion of the working fluid flow path in thermal contact with the heat source;
wherein, in use, the driven working fluid absorbs heat from the heat source and transports the heat away from the heat source; and
the driven working fluid returns to the gas substance generator to be recycled about the fluid flow path.

Preferably, the solar energy converter further comprises:
a heat exchanger in thermal contact with the heat transfer device;
wherein the second surface is in thermal contact with the heat exchanger and the heat transfer device is arranged to transfer heat energy from the solar energy absorber to the heat exchanger.

Preferably, the heat exchanger comprises the second surface.

Preferably, the solar energy absorber is located within an envelope.

Preferably, the envelope is a tube.
Preferably, the envelope has a circular cross-section.
Preferably, the envelope has an elliptical cross-section.
Preferably, the envelope is at least partially transparent.
Preferably, the envelope is at least partially evacuated.
Preferably, the envelope is at a pressure of $10^{-3}$ mbar or less.
Preferably, the envelope is at a pressure of $10^{-6}$ mbar or less.

An eleventh aspect provides a solar energy converter array comprising a plurality of hybrid solar energy converters.

A twelfth aspect provides solar energy converter array comprising at least one solar energy converter according to the first aspect, and at least one solar energy converter according to the tenth aspect.

A thirteenth aspect provides a solar energy converter comprising:
a solar energy absorber, the solar energy absorber comprising a photovoltaic element;
a heat transfer element in thermal contact with the solar energy absorber;
a heat exchanger in thermal contact with the heat transfer element; and
an at least partially evacuated tube;
wherein the solar energy absorber is inside the evacuated tube.

A fourteenth aspect provides a solar energy converter comprising:
a solar energy absorber;
a heat transfer element in thermal contact with the solar energy absorber;
a heat exchanger in thermal contact with the heat transfer element; and
an at least partially evacuated envelope;
wherein the solar energy absorber is inside the evacuated envelope.

Preferably, the first fluid flow channel is closer to the first surface than the second fluid flow channel.

Preferably, at least a part of the first fluid flow channel is located between the first surface and the second fluid flow channel.

Preferably, the first fluid flow channel lies between the first surface and the second fluid flow channel.

Preferably, each of the first and second fluid flow channels has a section bounded by a perimeter, and a proportion of the perimeter of the first fluid flow channel which is in thermal contact with the first surface is greater than a proportion of the perimeter of the second fluid flow channel which is in thermal contact with the first surface.

Preferably, the cross sectional area of the first fluid flow channel and the cross sectional area of the second fluid flow channel are equal.

Preferably, the first fluid flow channel is in thermal contact with the first surface across a greater area than the second fluid flow channel.

Preferably, the first part of the fluid flow means is inclined to the horizontal by an angle of up to 90°.

Preferably, at least a portion of at least one surface of the first fluid flow channel in thermal contact with the first surface comprises features arranged to promote vapor bubble nucleation.

Preferably, at least a portion of at least one surface of the first fluid flow channel in thermal contact with the first surface has a surface texture adapted to promote vapor bubble nucleation.

Preferably, said portion of at least one surface has a roughened surface texture.

Preferably, the roughened surface texture is provided by a solder layer.

Preferably, the first part of the fluid flow means is divided into a plurality of first fluid flow channels.

Preferably, the first part of the fluid flow means is divided into a plurality of first fluid flow channels and a plurality of second fluid flow channels.

Preferably, the number of first fluid flow channels is the same as the number of second fluid flow channels.

Preferably, the first and second fluid flow channels are located side by side with first fluid flow channels and second fluid flow channels interleaved.

Preferably, the or each first and second fluid flow channel has an upper end and a lower end, and the lower ends of the first and second fluid flow channels are connected together.

Preferably, the or each first and second fluid flow channel has an upper end and a lower end, and the upper ends of the first and second fluid flow channels are connected together.

Preferably, the upper ends of the first and second fluid flow channels are connected together by a manifold.

Preferably, the upper ends of the first and second fluid flow channels are connected together by a vapor manifold.

Preferably, vapor traveling from the surface of the liquid to the second surface passes through the manifold.

Preferably, condensed liquid returning from the second surface to the first part of the fluid flow means passes through the manifold.

Preferably, the liquid comprises water.

Preferably, the liquid comprises ethanol.

Preferably, the liquid comprises a mixture of water and ethanol.

Preferably, the mixture comprises up to 25% ethanol.

Preferably, the second surface is located above the first surface such that the condensed liquid returns from the second surface to the first part of the fluid flow means by gravity.

Preferably, at least a portion of a surface of the first fluid flow channel in thermal contact with the first surface has a dimpled surface profile.

Preferably, the dimpled surface profile comprises a regular array of dimples.

Preferably, the regular array of dimples comprises dimples arranged in rows separated by flat strips without dimples.

Preferably, the first and second fluid flow channels are located between first and second spaced apart plates.

Preferably, the first plate is in thermal contact with the first surface and forms a surface of the or each first fluid flow channel.

Preferably, there are a plurality of first fluid flow channels and a plurality of second fluid flow channels located side by side with first fluid flow channels and second fluid flow channels arranged alternately, and each first fluid flow channel is separated from an adjacent second fluid flow channel by a partition extending between and attached to the first plate and the second plate.

Preferably, the first plate has a dimpled surface profile comprising a regular array of dimples arranged in rows separated by flat strips without dimples, and each partition is attached to the first plate at a position located in one of the flat strips.

Preferably, the part of each partition extending between the first plate and the second plate is substantially flat.

Preferably, a plurality of the partitions are formed by a third plate.

Preferably, all of the partitions are formed by a single third plate.

Preferably, the third plate is corrugated.

Preferably, each of the plates comprises a metal or a metal alloy material.

Preferably, each of the first plate, second plate and third plate comprises mild steel.

Preferably, each of the first plate, second plate and third plate comprises tin coated mild steel.

Preferably, the plates are bonded together by a bonding technique including at least one of: soldering; spot welding; roller welding; and an adhesive.

Preferably, the first plate, second plate and third plate are bonded together by solder joints and at least a part of the first plate forming a surface of each first fluid flow channel is coated with solder.

Preferably, the heat transfer device comprises a substantially rigid heat conducting structure.

Preferably, the part of the fluid flow means above the surface of the liquid is at a pressure of 40 mbar or less.

Preferably, the part of the fluid flow means above the surface of the liquid is at a pressure of 2 mbar or less.

Preferably, the part of the fluid flow means above the surface of the liquid is at a pressure of 1 mbar or less.

Preferably, the part of the fluid flow means above the surface of the liquid is at a pressure of $10^{-2}$ mbar or less.

Preferably, the part of the fluid flow means above the surface of the liquid is at a pressure of $10^{-3}$ mbar or less.

Preferably, the part of the fluid flow means above the surface of the liquid is at a pressure of $10^{-6}$ mbar or less.

Preferably, the heat transfer device further comprises:
a second surface;
at least one vapor channel connecting the first and second fluid flow channels to the second surface;
whereby, when the first surface is hotter than the second surface, vapor travels from a surface of the liquid to the second surface through the vapor channel and condenses at the second surface; and
condensed liquid returns from the second surface to the first and second fluid flow channels;
whereby heat energy is transported away from the first surface to the second surface.

Preferably, the first plate, second plate and third plate are attached together by solder joints Preferably, the liquid reservoir comprises a plurality of first fluid flow channels.

Preferably, at least a portion of a surface of the fluid reservoir in thermal contact with the first surface comprises features arranged to promote vapor bubble nucleation.

Preferably, at least a portion of a surface of the fluid reservoir in thermal contact with the first surface has a surface texture adapted to promote vapor bubble nucleation.

Preferably, said portion of the surface has a roughened surface texture.

Preferably, the roughened surface texture is provided by a solder layer.

Preferably, condensed liquid returning from the second surface to the fluid reservoir travels through the tube.

Preferably, the second surface is located above the first surface such that the condensed liquid returns from the second surface to the fluid reservoir by gravity.

Preferably, at least a portion of a surface of the fluid reservoir in thermal contact with the first surface has a dimpled surface profile.

Preferably, the dimpled surface profile comprises a regular array of dimples.

Preferably, the regular array of dimples comprises dimples arranged in rows separated by flat strips without dimples.

Preferably, the tube is at a pressure of 40 mbar or less.
Preferably, the tube is at a pressure of 2 mbar or less.
Preferably, the tube is at a pressure of 1 mbar or less.
Preferably, the tube is at a pressure of $10^{-2}$ mbar or less.
Preferably, the tube is at a pressure of $10^{-3}$ mbar or less.
Preferably, the tube is at a pressure of $10^{-6}$ mbar or less.

Preferably, the gas substance generator comprises a hot vapor generation surface configured to at least partially heat-vaporize the working fluid such that gas or vapor bubbles generated within the working fluid drive the working fluid along the fluid flow path defined internally of the fluid containing portion.

Preferably, the heat source is the hot vapor generation surface of the gas substance generator.

Preferably, the fluid flow path defined internally of the fluid containing portion is arranged such that the driving of the working fluid along the portion of the working fluid flow path in thermal contact with the heat source is unimpeded by the returning of the driven working fluid to the gas substance generator.

Preferably, the fluid flow path comprises a plurality of portions of the working fluid flow path in thermal contact with the heat source.

Preferably, the fluid flow path comprises a plurality of return portions returning the driven working fluid to the gas substance generator.

Preferably, the heat transfer device is configured so that the driven working fluid travels with an upward component of direction along the portion of the working fluid flow path in thermal contact with the heat source, and returns to the gas substance generator at least partially under the action of gravity.

Preferably, at least a partial vacuum is maintained in the fluid containing portion above the working fluid.

Preferably, the rate of gas substance generation is determined, at least in part, by an operating temperature of the heat transfer device.

Preferably, the heat transfer device is configured so that the operating temperature achieving a predetermined rate of gas substance generation is controllable by means of varying a pressure level in the fluid containing portion above the working fluid.

Preferably, the heat transfer device is configured such that the heat source maintains a substantially uniform temperature across the predetermined area.

Preferably, the heat transfer device further comprises a heat exchanger configured so that, in use, the heat exchanger cools the working fluid.

Preferably, the heat transfer device is configured so that, in use, the working fluid is at least partially heat-vaporized to generate vapor, the vapor passes through the fluid containing portion to the heat exchanger and condenses at the heat exchanger, whereby the heat exchanger cools the working fluid.

Preferably, the heat transfer device is configured so that, in use, the heat exchanger is at least partially in contact with the working fluid.

The invention further provides systems, devices and articles of manufacture for implementing any of the aforementioned aspects of the invention.

DESCRIPTION OF FIGURES

The invention will now be described in detail with reference to the following figures in which.

DETAILED DESCRIPTION OF THE INVENTION

First Embodiment

Figure 1:
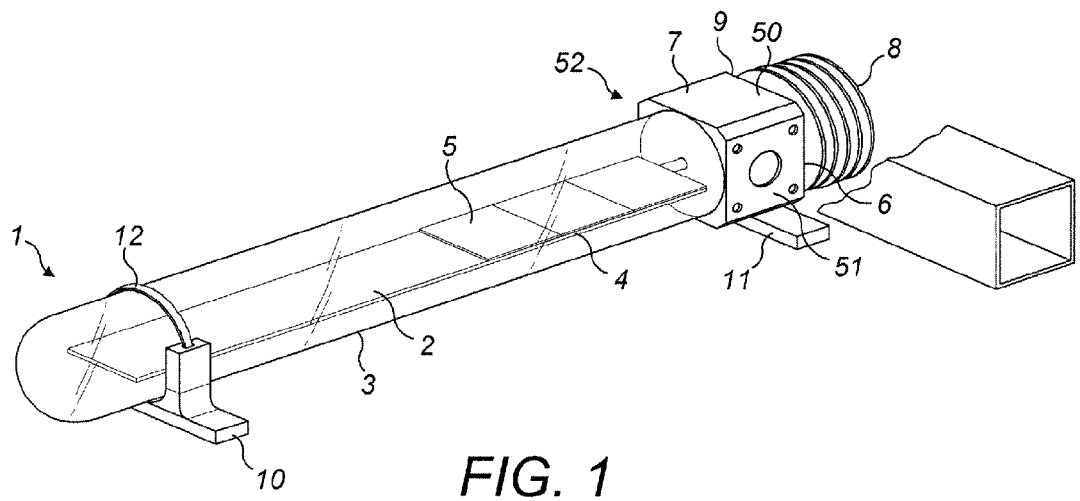
FIG. 1 is a diagram of a first embodiment of a hybrid solar energy converter according to the invention.

Apparatus according to a first embodiment of the present invention is illustrated in FIG. 1. FIG. 1 shows a general exterior view of a first embodiment of a hybrid solar energy converter 1 according to the present invention.

Overview

In the first embodiment, the hybrid solar energy converter 1 includes a solar energy collector assembly 2 housed within a sealed transparent tube 3. The solar energy collector assembly 2 includes a heat transport element 4 and an array of photovoltaic elements 5 mounted on an upper surface of the heat transport element 4. The hybrid solar energy converter 1 also includes a heat exchange assembly 6 at one end of the transparent tube 3. One end of the solar energy collector assembly 2 is connected to the heat exchange assembly 6. In one example the photovoltaic elements 5 may be formed of silicon. In another example the photovoltaic elements 5 may be formed of gallium arsenide. In other examples, photovoltaic elements formed of other semiconductor materials may be used. In other examples organic photovoltaic elements may be used. In other examples hybrid photovoltaic elements may be used.

Photovoltaic elements may also be referred to as photovoltaic cells, solar cells or photoelectric cells. For the avoidance of doubt, in the present application the term photovoltaic element is used to refer to any element which converts incident electromagnetic radiation into electrical energy.

In the first embodiment, the heat exchange assembly 6 includes a primary heat exchanger 7 arranged to transfer heat energy from the heat transport element 4 to a first fluid, and a secondary heat exchanger 8 arranged to transfer heat energy from the heat transport element 4 to a second fluid. The primary heat exchanger 7 and the secondary heat exchanger 8 are separated by a heat transfer control valve 9 able to selectively allow, or prevent, the transfer of heat energy from the heat transport element 4 to the secondary heat exchanger 8.

In one possible example, in use the hybrid solar energy converter 1 may be mounted on a roof. In the illustrated embodiment mounting brackets 10 and 11 are provided. Mounting bracket 10 supports the transparent tube 3 and mounting bracket 11 is attached to the heat exchange assembly 6. The transparent tube 3 is secured to the mounting bracket 10 by a strap or clip 12 of a plastics material in order to reduce the risk of accidental damage to the transparent tube 3.

An overview of operation of the hybrid solar energy converter 1 is that the solar energy, in other words sunlight, incident on the hybrid solar energy converter 1 passes through the sealed transparent tube 3 and is incident on the photovoltaic elements 5 of the solar energy collector assembly 2. The photovoltaic elements 5 convert a part of the energy of the incident solar energy into electrical energy, and convert a part of the energy of the incident solar energy into heat energy. A further part of the incident solar energy may be incident on any parts of the solar energy collector assembly 2 which are not covered by the photovoltaic elements 5. This further part of the incident solar energy may also be converted into heat energy. In general, it is desirable to maximize the proportion of the surface of the solar energy collector assembly 2 exposed to incident solar energy which is covered by the photovoltaic elements 5, and to minimize the proportion which is not so covered. However, in some circumstances it may be preferred to leave some parts of this exposed surface uncovered, for example to simplify manufacture and/or assembly of the solar energy collector assembly 2 and attachment of the photovoltaic elements 5 to the solar energy collector assembly 2. Usually, in the first embodiment the surface of the solar energy collector assembly exposed to incident solar energy will be the upper surface.

The electrical energy produced by the photovoltaic elements 5 is carried along the heat transport element 4 by electrical conductors (not shown in FIG. 1) and away from the solar energy converter 1 for use. The heat energy absorbed by the photovoltaic elements 5 is transferred into the heat transport element 4, cooling the photovoltaic elements 5, and then carried to the heat exchange assembly 6.

As explained above, the heat transfer control valve 9 is able to selectively allow, or prevent, the transfer or transport of heat energy from the heat transport element 4 to the secondary heat exchanger 8. Accordingly, at the heat exchange assembly 6 the heat energy from the heat transfer element 4 is selectively passed under the control of the heat transfer control valve 9 either to the primary heat exchanger 7 only, or to both the primary heat exchanger 7 and the secondary heat exchanger 8. By selecting whether the heat energy is transferred to the primary heat exchanger 7 only, or to both the primary heat exchanger 7 and the secondary heat exchanger 8 the degree of cooling applied to the photovoltaic elements 5 can be varied.

In one typical arrangement, the hybrid solar energy converter 1 may be used in a domestic situation, such as on a household roof, to generate electricity for household use and/or for export, and to generate hot water for a domestic hot water and/or heating system. In this arrangement the heat energy transferred to the primary heat exchanger 7 is transferred into a pumped water supply flowing through the primary heat exchanger 7 to heat the water. This heated water is then used by the domestic hot water and heating system, and the electrical energy produced by the photovoltaic elements is supplied to a domestic electrical supply system. In this arrangement the heat energy transferred to the secondary heat exchanger 8 is transferred into ambient air and allowed to escape into the atmosphere. The secondary heat exchanger 8 is used, under the selective control of the heat transfer control valve 9, to release heat energy into the atmosphere in order to regulate the temperature of the solar energy collector assembly 2.

The efficiency of semiconductor photovoltaic elements generally drops as the temperature of the semiconductor material rises. The temperature above which efficiency drops with increasing temperature and the rate at which efficiency drops with increasing temperature will vary for different semiconductor materials and different designs of photovoltaic element. For silicon photovoltaic elements the efficiency of electrical energy generation generally drops by about 0.35% to 0.5% for each degree centigrade of temperature increase above 25° C.

Transparent Tube

Figure 2:
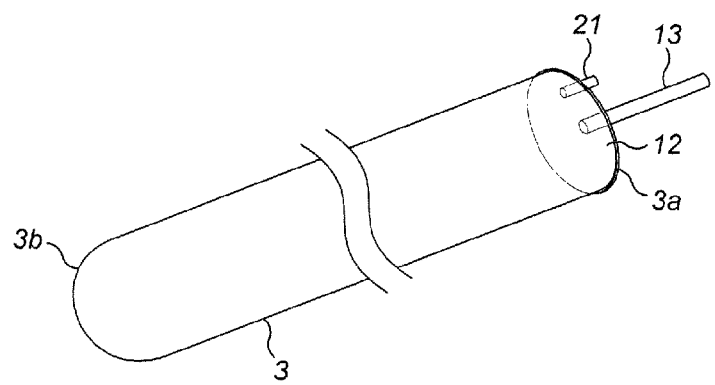
FIG. 2 is a diagram of a tube useable in the hybrid solar energy converter of FIG. 1.

In the first embodiment illustrated in FIG. 1 the sealed transparent tube 3 is formed by a cylindrical glass tube having one open end 3a and one closed domed end 3b. The sealed transparent tube 3 is illustrated in more detail in FIG. 2. The open end 3a of the cylindrical glass tube is sealed by a metal cap 12 which is bonded to the glass tube with adhesive to form an air tight seal. The interior of the tube 3 is at least partially evacuated. That is, the interior of the tube is at a pressure below normal atmospheric pressure. The pressure of the vacuum within the tube 3 may be $10^{-3}$ mbar.

The open end 3a of the cylindrical glass tube sealed by the cap 12 is attached to the heat exchange assembly 6 and the closed domed end 3b is remote from the heat exchange assembly 6.

Insulated electrical conductors 21 pass through the metal cap 12 to carry the electrical energy generated by the photovoltaic elements 5 away from the solar energy collector assembly 3. The heat transport element 4 of the solar energy collector assembly 2 has a projecting tube 13 which passes through the metal cap 12 in order to carry heat energy from the solar energy collector assembly 3 to the heat exchange assembly 6.

As discussed above, the solar energy collector assembly 2 housed within the transparent tube 3 includes photovoltaic elements 5. Typically, photovoltaic devices are made from semiconductor materials which may suffer from oxidation and other environmental effects adversely affecting their performance and lifetime when exposed to the atmosphere. The use of an evacuated tube 3 may protect the semiconductor materials of the photovoltaic elements 5 from such environmental damage. This may allow the cost of encapsulating the photovoltaic elements to be avoided.

The use of an evacuated tube may also increase the efficiency with which heat can be collected from incident solar energy by the solar energy collector assembly 2. Having the solar energy collector assembly 2 surrounded by an evacuated tube 3 may reduce or effectively prevent convective heat loss from the solar energy collector assembly 2 into the material of the transparent tube 3 and the air around the hybrid solar energy converter 1.

In alternative example a different vacuum pressure may be used. In some examples the vacuum pressure may be in the range $10^{-2}$ mbar to $10^{-6}$ mbar. In general, it is expected that lower vacuum pressure, or in other words a harder vacuum, will provide greater insulating benefits. Further, it is expected that lower vacuum pressure, or in other words a harder vacuum, will provide greater protection from environmental damage in examples where the photovoltaic elements are not encapsulated. In practice the benefits of using a lower vacuum pressure may need to be balanced against the increased cost of achieving a lower vacuum pressure. In some examples a vacuum pressure of $10^{-2}$ mbar, or lower, may be used.

In an alternative example the sealed transparent tube 3 may be filled with an inert gas instead of being evacuated. In particular, the inert gas may be nitrogen.

In another alternative example the sealed transparent tube 3 may be filled with an inert gas at a reduced pressure. In some examples this may be achieved by filling the tube 3 with the inert gas and then evacuating the tube 3. In particular, the inert gas may be nitrogen.

In the illustrated first embodiment the tube 3 is cylindrical having a circular cross section. The use of a circular cross section shape may increase the strength of the evacuated tube to resist the atmospheric pressure acting on the evacuated tube. In alternative examples the tube may have other shapes. In some examples the cross sectional size and/or shape of the tube may vary at different positions along its length.

In an alternative example the tube may have an elliptical cross section. In particular, the tube 3 may have an elliptical cross section with the long axis of the ellipse aligned with the plane of the solar energy collector assembly 2. The use of a tube 3 having an elliptical cross-section with the long axis of the ellipse aligned with the plane of the solar energy collector assembly may reduce the amount of glass required by the tube 3 and may reduce reflection losses due to the reflection of incident solar energy from the tube 3.

In the illustrated first embodiment the tube 3 is formed of glass. The use of glass may allow the vacuum within the tube 3 to be maintained longer because the rate of migration of gas molecules from the atmosphere through glass is, in practice, effectively zero. In alternative examples suitable transparent plastics materials or laminated structures may be used to form the tube 3.

In the illustrated first embodiment the tube 3 is transparent. In alternative examples the tube may be only partially transparent.

In the illustrated first embodiment the metal end cap 12 is bonded to the glass tube 3 by adhesive. In other examples alternative glass to metal bonding techniques may be used, for example welding, brazing or soldering.

In the illustrated first embodiment the tube 3 has a metal end cap 12 at one end. In alternative examples the end cap 12 may be made of other materials. In some examples the end cap 12 may be made of glass. This may reduce conductive heat losses from the collector assembly 2.

Collector Assembly

Figure 3:
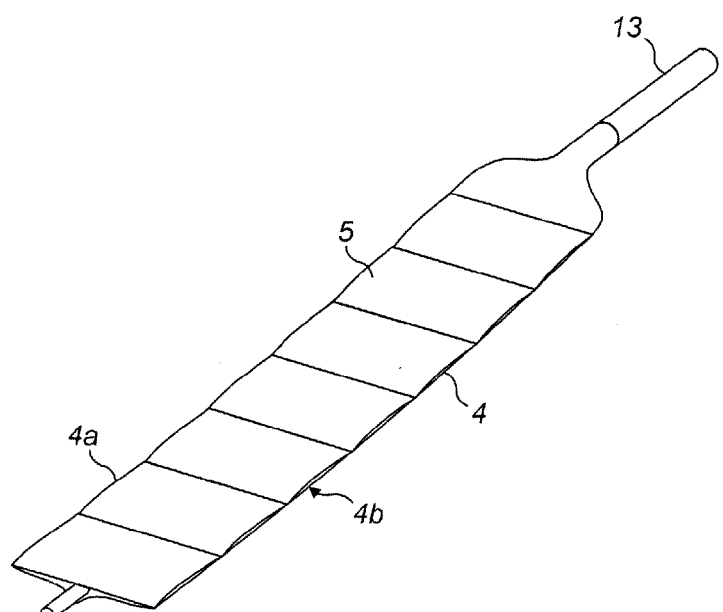
FIG. 3 is a diagram of a solar energy collector assembly useable in the hybrid solar energy converter of FIG. 1.
Figure 4:
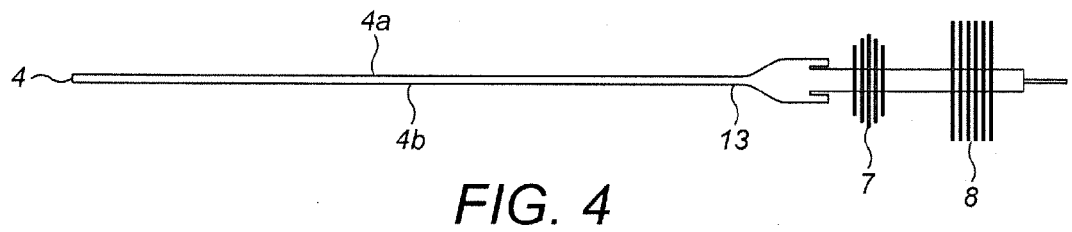
FIG. 4 is a side view of the solar energy collector assembly of FIG. 3.

The solar energy collector assembly 2 according to the first embodiment is illustrated in FIGS. 3 and 4. The solar energy collector assembly 2 includes a heat transport element 4 and an array of photovoltaic elements 5 mounted on one surface of the heat transport element 4. In order to allow radiant solar energy to be incident on the photovoltaic elements 5 the array of photovoltaic elements 5 will usually be mounted on the surface of the heat transport element 4 exposed to the incident radiant solar energy in operation of the hybrid solar energy converter 1. This will usually be the upper surface of the heat transport element 4.

In some arrangements the surface of the heat transport element 4 exposed to the incident radiant solar energy may not be the upper surface. In particular, this would be the case if the solar energy collector assembly 2 was located in a vertical, or substantially vertical, plane, or if the incident solar radiant energy was incident horizontally or from below, for example after redirection by an optical system, such as a mirror. Accordingly, references to upper and lower surfaces, and similar directional terminology in this description, should be understood as referring to the situation illustrated in the figures where the solar energy collector assembly is in a plane at an angle to the horizontal and radiant solar energy is incident from above.

In the illustrated example of the first embodiment, the solar energy collector assembly 2 is supported by a cylindrical tube 13 of the heat transport element 4. The cylindrical tube 13 passes through the end cap 12 and into the heat exchange assembly 6, as will be explained in more detail below. Where the cylindrical tube 13 passes through the end cap 12 the cylindrical tube 13 is soldered to the end cap 12 to retain the cylindrical tube 13 in place and support the solar energy collector assembly 2.

In alternative examples the cylindrical tube 13 may be secured to the end cap 12 in other ways. In one example the cylindrical tube 13 may be welded to the end cap 12.

The supporting of the solar energy collector assembly 2 by a single physical connection through the cylindrical tube 13 may increase the efficiency with which heat can be collected from incident solar energy by the solar energy collector assembly 2. Having the solar energy collector assembly 2 supported by a single physical connection through the cylindrical tube 13 may reduce conductive heat loss from the solar energy collector assembly 2 into the supporting structure outside the transparent tube.

In the first embodiment, the heat transport element 4 is substantially trapezoid in cross section, having a substantially flat upper surface 4a and a substantially flat lower surface 4b. Each of the photovoltaic elements 5 is square, and the width of the heat transport element 4 is the same as the width of each square photovoltaic element 5. In the illustrated embodiment, seven square photovoltaic elements 5 are mounted side by side to one another along the length of the heat transport element 4. Substantially the entire upper face of the heat transport element 4 is covered by the photovoltaic elements 5. Covering a large proportion of the heat transport element with photovoltaic elements may increase the efficiency of the hybrid solar energy converter.

Figure 7:
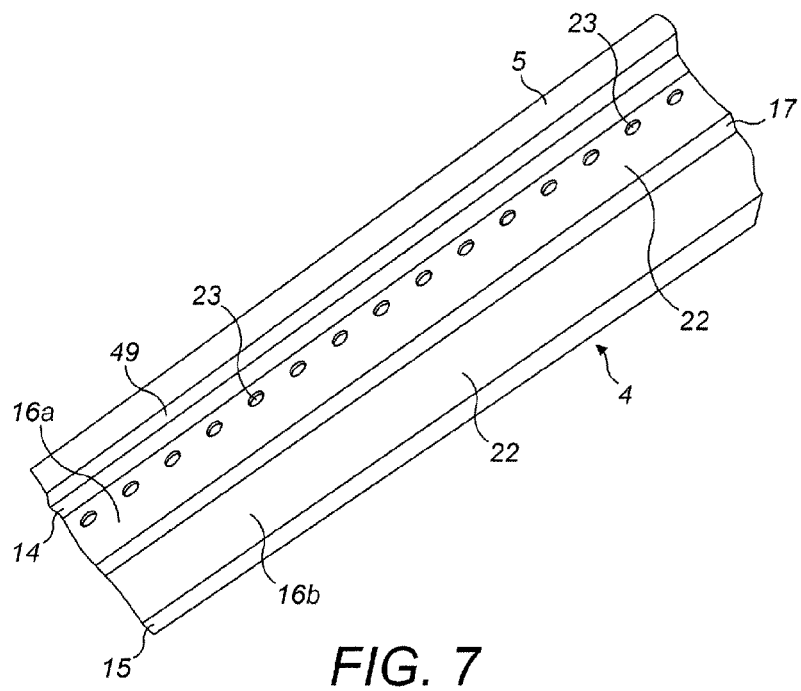
FIG. 7 is a longitudinal cross-sectional diagram of the solar energy collector assembly of FIG. 3.

The photovoltaic elements 5 are bonded to the substantially flat upper surface 4a of the heat transport element 4 using a layer 49 of heat conducting adhesive. This thermally conductive adhesive bonding layer 49 is shown in FIG. 7. The adhesive bonding layer 49 is electrically insulating. The adhesive bonding layer 49 between the photovoltaic elements 5 and the heat transport element 4 is arranged to be thin. This may improve the degree of thermal conduction between the photovoltaic elements 5 and the heat transport element 4. This may increase the rate of heat transfer laterally across the photovoltaic elements 5. An adhesive material loaded with solid spheres of a predetermined size may be used to form the adhesive bonding layer 49. This may allow a thin adhesive layer 49 to be consistently and reliably formed. The adhesive bonding layer 49 is formed of a flexible or "forgiving" adhesive material. This may relieve stresses in the assembled solar energy collector assembly 2 and reduce any stress applied to the photovoltaic elements 5.

The photovoltaic elements 5 are semiconductor photovoltaic elements formed of silicon. In one embodiment the photovoltaic elements are formed of single-crystal silicon. In one embodiment the photovoltaic elements are formed of amorphous silicon. In one embodiment the photovoltaic elements are formed of polycrystalline silicon, or polysilicon. In other embodiments alternative types of semiconductor photovoltaic elements may be used.

As discussed above, in operation of the hybrid solar energy converter 1 the photovoltaic elements 5 are cooled by the heat transport element 4. This cooling may allow the temperature of the photovoltaic elements 5 to be maintained at a desired value.

This cooling may provide the advantage that the appearance of hot spots or regions in the photovoltaic elements 5 can be reduced or eliminated, and the temperature of the photovoltaic elements 5 maintained at a uniform desired value. Such hot spots or regions may for example be produced by heating by incident solar radiation, by inhomogeneities or faults in the photovoltaic elements 5, or by a combination of, or interaction between, these causes.

Such hot spots or regions can reduce the efficiency of the photovoltaic elements 5. It is believed that hot spots in the photovoltaic elements 5 may reduce the efficiency of the photovoltaic elements 5 in the short term, and may also degrade the performance of the photovoltaic elements 5 in the longer term. As discussed above, the efficiency of photovoltaic elements reduces as the temperature increases. In the short term a hot spot in a photovoltaic element may reduce the output of the photovoltaic element because the material forming the hot spot is at a higher temperature than the rest of the photovoltaic element, and so has a reduced efficiency compared to the rest of the photovoltaic element.

Further, in the longer term the degrading of the performance of the photovoltaic element may also take place more rapidly at a hot spot because the material forming the hot spot is at a higher temperature than the rest of the photovoltaic element.

Accordingly, maintaining the photovoltaic elements 5 at a more uniform temperature value and reducing, or eliminating, hot spots or regions may improve the efficiency of the photovoltaic elements 5 at a specific temperature, and may reduce the amount of degradation of the photovoltaic elements 5 caused by higher temperatures.

This may allow the photovoltaic elements 5 to operate at a higher overall temperature than would otherwise be the case. This may be understood by considering that where hot spots exist in the photovoltaic elements 5 it may be the temperature induced reduction in efficiency and temperature induced degradation in these hot spots that limits the maximum operating temperature of the photovoltaic element 5 as a whole. As a result, reducing, or eliminating, these hotspots may allow the maximum operating temperature of the photovoltaic element 5 as a whole to be raised.

The illustrated example of the first embodiment has a solar energy collector assembly 2 supported by a single physical connection through the cylindrical tube 13. In other examples alternative supporting arrangements may be used. In some examples the solar energy collector assembly 2 may be supported by two physical connections, one at each end of the solar energy collector assembly 2. In some examples, one of the two physical connections may be the through the cylindrical tube. In general, it is advantageous to minimize the number of physical supports in order to minimize the escape of heat from the solar energy collector assembly by conduction through the physical supports.

In other examples the number of photovoltaic elements 5 mounted on the heat transport element 4 may be different. In one example, twelve photovoltaic elements 5 may mounted on the heat transport element 4. In one example, eighteen photovoltaic elements 5 may mounted on the heat transport element 4. In other examples the relative sizes of the photovoltaic elements 5 and the heat transport element 4 may be different.

In some examples the adhesive layer 49 may comprise an epoxy resin which remains non-brittle after curing.

In other examples the adhesive layer 49 may be formed by a double sided adhesive tape.

Heat Transport Element

Figure 5:
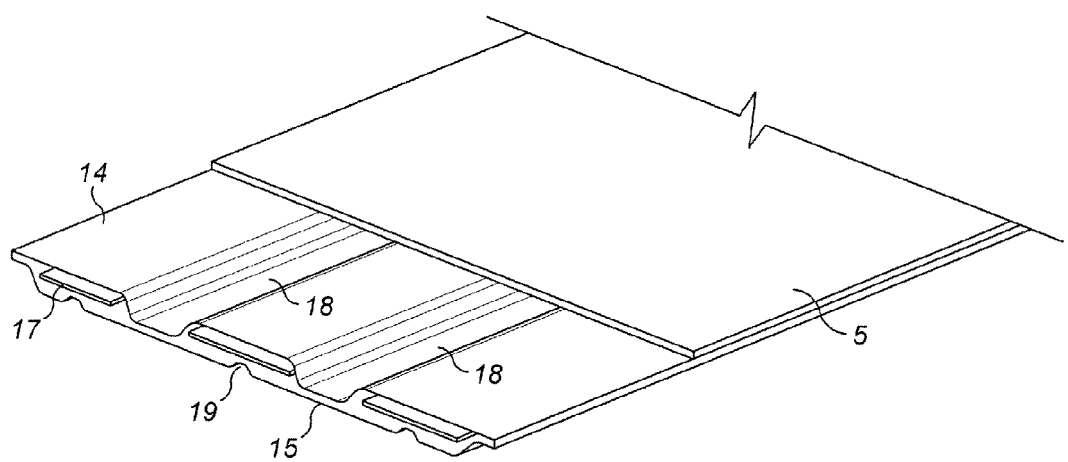
FIG. 5 is a cut away diagram of the solar energy collector assembly of FIG. 3.
Figure 6:
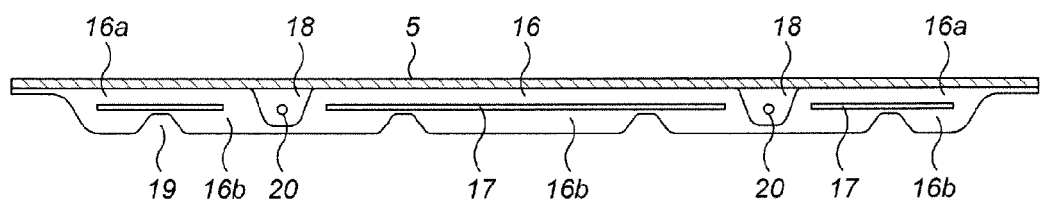
FIG. 6 is a transverse cross-sectional diagram of the solar energy collector assembly of FIG. 3.

The heat transport element 4 according to the first embodiment is shown in more detail in a cut away view in FIG. 5, and in transverse and longitudinal cross-sectional views in FIGS. 6 and 7 respectively.

In the first embodiment, the heat transport element 4 is substantially trapezoid in cross section and has an upper surface 4a formed by an upper sheet 14 and a lower surface 4b formed by a lower sheet 15. The sides of the heat transport element 4 are formed by upwardly bent parts of the lower sheet 15. The photovoltaic elements 5 are bonded to the upper sheet 14. The upper sheet 14 and the lower sheet 15 are sealed together around their respective edges by welding and define three fluid passages 16 between them. The upper sheet 14 and the lower sheet 15 are separated by 1 mm so that each of the passages 16 is 1 mm thick. Each of the passages 16 is divided into an upper portion 16a and a lower portion 16b by a partition sheet 17. The partition sheets 17 tend to guide fluid flow along the passages 16 along either the upper portions 16a or the lower portions 16b of the passages 16. However, the partition sheets 17 do not extend entirely across the passages 16. The upper portion 16a and the lower portion 16b of each fluid passage 16 are not sealed from one another. The partition sheets 17 are located and secured in place by being spot welded to dimples 19 projecting upwardly from the lower sheet 15.

The heat transport element 4 is a substantially rigid structure. This may reduce the physical stress applied to the photovoltaic elements 5 by flexing of the heat transport element. This may extend the working life of the photovoltaic elements 5.

In the illustrated example of the first embodiment the upper, lower and partition sheets 14, 15 and 17 are formed of 0.2 mm thick tin coated mild steel. The use of mild steel may avoid or reduce problems produced by differential thermal expansion of the silicon semiconductor photovoltaic elements 5 and the heat transport element 4 because the coefficients of thermal expansion of silicon and mild steel are similar.

The upper sheet 14 is bent to form two longitudinal recesses in its upper surface which forming two parallel troughs 18 running along the upper surface 4a of the heat transport element 4. In these recesses the upper sheet 14 contacts the lower sheet 15 and the two sheets 14 and 15 are bonded together. This may increase the rigidity of the heat transport element 4. Electrically conductive ribbons or wires 20 run along the troughs 18 between the heat transport element 4 and the photovoltaic elements 5. The wires 20 are electrically connected to the photovoltaic elements 5 and to the conductors 21 which pass through the cap 12 to provide a conductive path to carry the electrical power generated by the photovoltaic elements 5 out of the sealed transparent tube 2. This electrical power may be supplied to an inverter for voltage conversion and/or for conversion to alternating current for supply to a domestic or mains electrical system.

At an end of the heat transport element 4 adjacent the open end of the glass tube 3 and the end cap 12 the generally trapezoid cross sectional shape of most of the length of the heat transport element 4 transitions to a projecting cylindrical tube 13. The upper and lower sheets 14 and 15 are sealed to the cylindrical tube 13 so that the interior of the heat transport element 4 is sealed. The cylindrical tube 13 passes through the end cap 12 and into the heat exchange assembly 6. The central bore of the cylindrical tube 13 is connected to the passages 16 and acts to carry heat energy from the heat transport element 4 to the heat exchange assembly 6, as will be explained below. The cylindrical tube 13 physically supports the solar energy collector assembly 2 within the sealed transparent tube 3.

The passages 16 are filled with degassed distilled water 22 as a working fluid and the interior of the heat transport element 4 including the passages 16 and the tube 13 is at least partially evacuated. That is, the interior of the heat transport element 4 is at a pressure below normal atmospheric pressure. The interior of the heat transport element may be under a vacuum at a pressure of $10^{-3}$ mbar. The heat transport element 4 is arranged to be inclined to the horizontal with the end of the heat transport element 4 adjacent the heat exchange assembly 6 higher than the end of the heat transport element 4 remote from the heat exchange assembly 6. As a result, the passages 16 within the heat transport element 4 are similarly inclined to the horizontal. The amount of water 22 in the passages 16 is sufficient that the lower surface of the upper sheet 14, that is, the surface forming the top of the passages 16, is below the surface of the water 22 at a position corresponding to the location of the nearest part of any of the photovoltaic elements 5 to the tube 13. The inclination angle to the horizontal may be small. The inclination angle may be 5° or more. An inclination angle of about 5° is sufficient. Larger angles of inclination may be used if desired. An angle of inclination up to and including 90° may be used, i.e. the heat transport element 4 may be arranged longitudinally vertically.

The heat transport element 4 is a substantially rigid structure. This may minimize changes in the level of the surface of the water 22 due to flexing of the components of the heat transport element 4, such as the upper and lower sheets 14 and 15. Such changes in the level of the surface of the water 22 may affect the efficiency of the cooling of the photovoltaic elements 5.

In operation of the first embodiment, when the solar energy collector assembly 2 is exposed to incident solar radiative energy the photovoltaic elements 5 absorb some of this energy, converting a part of the absorbed energy into electrical energy. The remainder of the absorbed energy is converted into heat energy, raising the temperature of the photovoltaic elements 5. The absorbed heat energy flows from the photovoltaic elements 5 into the heat transport element 4, flowing through the upper sheet 14 and into the water 22 inside the channels 16, which water is in contact with the lower surface of the upper sheet 14.

The liquid water 22 inside the passages 16 absorbs the heat energy and vaporizes, producing bubbles 23 of steam or water vapor. The liquid water may vaporize and produce bubbles as a result of either or both of convection boiling and nucleation. At the vacuum pressure of $10^{-3}$ mbar inside the passages 16 the water boils from around 0° C., so that the water 22 vaporizes readily at the normal operating temperatures of the hybrid solar energy converter 1. The bubbles 23 of water vapor are less dense than the liquid water 22. As explained above, the passages 16 are inclined to the horizontal, and as a result, this density difference causes the bubbles 23 of water vapor to travel upwards along the passages 16 towards the upper surface of the water 22. The roughening of the surface of the sheet 14 produced by the tin coating may provide nucleation sites, increasing the tendency of the liquid water 22 to vaporize and form bubbles 23 of water vapor.

When a bubble 23 of water vapor reaches the surface of the water 22 the vapor is released into the vacuum above the water 22. The bursting of the bubbles of water vapor at the water surface may generate droplets of liquid water and may project at least some of these water droplets upwardly from the water surface into the vacuum above the water surface. As a result, the heat transfer mechanism may be a multi-phase system comprising liquid water, water vapor and droplets of liquid water, and not just a two-phase system comprising liquid water and water vapor only. The presence of such droplets of water in the vacuum may enhance the rate of vaporization by increasing the surface area of the liquid water exposed to the vacuum.

The water vapor in the vacuum travels at a very high speed through the vacuum along the cylindrical tube 13 and into the heat exchange assembly 6. The travel speed of the hot water vapor in the vacuum is very fast, approximating to the thermal speed of the water vapor molecules. Inside the heat exchange assembly 6 the water vapor condenses on a heat exchange surface of one of the primary and secondary heat exchangers 7 and 8. The condensed water flows back out of the heat exchange assembly 6 down the tube 13 and back into the water 22 within the passages 16.

The bubbles 23 of water vapor will tend to move upwardly through the liquid water 22 in the passages 16 because of the lower density of the water vapor compared to the liquid water, which will result in an upward buoyancy force on each bubble 23. Further, the movement of the bubbles 23 of water vapor will tend to drive the liquid water 22 in the passages 16 upwardly. As a result, the bubbles 23 in combination with the partition sheet 17 cause the water 22 in each passage 16 to circulate with relatively hot water 22 and bubbles 23 of water vapor flowing upwards along the upper portion 16a of the passage 16 and relatively cool water 22 flowing downwards along the lower portion 16b of the passage 16. This circulation is driven primarily by the difference in density between the water vapor of the bubbles 23 and the liquid water. However, this circulation may also be driven by convection as a result of the difference in density between the relatively hot water in passage 16a and the relatively cool water in passage 16b, in a similar manner to a thermosiphon. This density driven circulation may form a highly effective heat transport mechanism because water has a relatively high enthalpy of vaporization, so that the bubbles 23 of water vapor may carry a large amount of heat energy additional to the heat energy carried by the circulation of the relatively hot water in passage 16a and the relatively cool water in passage 16b.

As the bubbles 23 of water vapor travel upwardly along the passages 16 the pressure head acting on the bubbles 23 decreases, so that the bubbles 23 tend to expand. As a result, the tendency of the vapor bubbles 23 to collapse and implode is reduced by the effects of the expansion and decreasing pressure as the bubbles 23 move upwardly. When considering this point, it should be remembered that when the heat transport element 4 is operating the bubbles 23 will be forming within an established density driven circulation fluid flow and will move upwardly carried by this flow in addition to the bubbles movement due to their own buoyancy relative to the liquid water. Further, it is believed that expansion of the bubbles 23 as they move upwardly will further increase the speed of the density driven circulation flow by increasing the buoyancy of the expanding bubbles 23.

In general, the speed of the density driven circulation increases and the effectiveness of the heat transport mechanism increases as the temperature of the upper sheet 14 of the heat transport element 4 increases.

The density driven circulation of the water 22 within the passage 16 is a vapor driven circulating or rolling flow.

The density driven circulation of the water 22 within the passage 16 becomes particularly vigorous, and becomes particularly effective as a heat transport mechanism, when the water 22 within the passage 16 enters a rolling boil state. The effectiveness of the heat transport mechanism significantly increases when rolling boiling of the water 22 commences. In general, when other parameters of the system remain constant, entry into the rolling boil state will take place when the temperature of the upper sheet 14 of the heat transport element 4 reaches a specific temperature.

In the illustrated example using water, the water 22 within passage 16 may enter a rolling boil state at a temperature of about 40° C.

In the illustrated example of the first embodiment the heat transport element 4, the cylindrical tube 13 and the primary and secondary heat exchangers 7 and 8 are all arranged in a straight line. Accordingly, the channels 16 and 17 within the heat transport element 4, the internal passage of the cylindrical tube 13, and the internal passages of the heat exchange assembly 6 are all inclined at the same angle to the horizontal. This is not essential. In some examples it may be preferred to have these components inclined at different angles to the horizontal. In particular, in some examples it may be preferred to have channels 16 and 17 within the heat transport element 4 inclined at a first angle to the horizontal selected to optimize the efficiency of the density driven circulation, and to have the internal passages of the cylindrical tube 13 and the heat exchange assembly 6 inclined at a second angle to the horizontal selected to optimize the return flow of condensed water to the heat transport element 4.

In the illustrated first embodiment three fluid passages 16 are defined within the heat transport element 4. In other examples there may be different numbers of fluid passages. In particular, some examples may have only a single passage.

In the illustrated example of the first embodiment 0.2 mm thick tin coated mild steel sheets are used to form the heat transport element 4. In alternative examples other thicknesses may be used, in particular 0.1 mm thick sheets may be used. The use of a thinner upper sheet may improve the rate of heat energy transfer from the photovoltaic elements to the water inside the channels. In other examples sheets having different thicknesses may be used for the different sheets. In other examples different materials may be used, in particular sheets of other metals or metal alloys, such as copper or brass may be used. In other examples the upper, lower and/or partition sheets may be formed from materials which are not metals. In other embodiments there may be openings in the upper sheet allowing the water inside the channels to directly contact the back surfaces of the photovoltaic elements to maximize heat transfer. In such examples the thickness or material used to form the upper sheet could be selected without having to take thermal conductivity into account.

The sheets used to form the heat transport element 4 may be shaped by pressing.

In the illustrated first embodiment the partition sheets are secured to dimples projecting from the lower sheet 15. In alternative examples other support arrangements may be used. In particular dimples projecting from the partition sheets may be secured to the lower sheet.

In the illustrated first embodiment each of the passages is 1 mm thick. In alternative examples different passage thicknesses may be used. In particular a passage thickness of 0.8 mm may be used. In particular a passage thickness of 1.2 mm may be used.

In the illustrated first embodiment the thickness of each of the portions 16a and 16b of a passage 16 is approximately equal. In alternative examples the thicknesses of the portions 16a and 16b in a passage 16 may be different. In particular the thickness of the portion 16a carrying the bubbles of vapor 23 may be greater than the thickness of the other portion 16b.

In the illustrated first embodiment the upper sheet 14 is flat where it contacts the photovoltaic elements 5. In alternative examples the upper sheet 14 may be patterned to stiffen it, to reduce flexing of the upper sheet 14 due to thermal expansion or contraction when the temperature of the heat transport element 4 changes. Such flexing may place damaging stress on the photovoltaic elements.

In the illustrated first embodiment the different sheets are welded together. In alternative examples different bonding techniques may be used. In some examples the different sheets may be bonded by techniques including spot welding, roller welding, solder or adhesive.

In the illustrated first embodiment the partition sheet 17 dividing each passage 16 into portions 16a and 16b is flat. In alternative examples the partition sheet may have other profiles. In particular the partition sheet may have a corrugated or wave profile. The partition sheet may divide the passage 16 into a plurality of portions 16a and a plurality of portions 16b

In the illustrated first embodiment the heat transport element 4 and the passages 16 are formed by shaped sheets. In alternative examples the heat transport element and the passages may be formed in other ways. In particular, the heat transport element and the passages may be formed by flattened tubes.

In the illustrated first embodiment the tube 13 is a cylindrical tube. In other examples the tube 13 may have other cross sectional shapes. In some examples the tube 13 may have a cross sectional shape that varies along its length.

In the illustrated example of the first embodiment the flow of water vapor and liquid water through the heat transport element 4 tends to keep the cooled upper surface of the heat transport element 4 at a uniform operating temperature during operation. That is, the cooled upper surface of the heat transport element 4 tends to be kept isothermal. The isothermal nature of the cooled upper surface of the heat transport element 4 tends to give rise to isothermal cooling of the photovoltaic elements 5, where hotter parts of the photovoltaic elements 5 tend to be preferentially cooled so that the photovoltaic elements 5 themselves tend to become isothermal.

Such isothermal cooling provides further advantages in addition to those provided by cooling.

Isothermal cooling may provide the advantage that the appearance of hot spots or regions in the photovoltaic elements 5 produced by heating by incident solar radiation can be reduced or eliminated. Such hot spots or regions can reduce the efficiency of the photovoltaic elements 5.

Isothermal cooling may simplify the control and wiring arrangements of the photovoltaic elements 5 by reducing or eliminating any requirement for compensation for differences in the performance of the different parts of the photovoltaic elements 5 that are at different temperatures.

Isothermal cooling tends to reduce, or prevent, the formation of hot spots or regions in the photovoltaic elements 5. As is explained above, this may allow the efficiency of the photovoltaic elements 5 to be improved at a specific temperature. Further, this may reduce the amount of degradation of the photovoltaic elements 5 caused by higher temperatures.

Still further, this may allow the photovoltaic elements 5 to operate with a given degree of efficiency at a higher temperature than would otherwise be the case. This may allow the solar energy collector assembly 2 including the photovoltaic elements 5 to be operated at a higher temperature without reducing the efficiency with which the photovoltaic elements 5 produce electrical energy.

One example of this effect of isothermal cooling is that the general figure quoted above for silicon photovoltaic elements that the efficiency of electrical energy generation generally drops by about 0.35% to 0.5% for each degree centigrade of temperature increase above 25° C. may not apply to silicon photovoltaic elements that are isothermally cooled. Such isothermally cooled silicon photovoltaic elements having hotspots eliminated or reduced may have a higher threshold temperature at which the efficiency of electrical energy generation begins to drop and/or may have a reduced rate of reduction in efficiency for each degree centigrade of temperature increase above the threshold temperature. Further, the temperature at which there is a risk of permanent degradation of the silicon photovoltaic elements may also be increased for isothermally cooled silicon photovoltaic elements. Similar effects may be found in photovoltaic elements formed of other semiconductor materials.

In some examples, one or more layers of heat conductive material may be located between the upper sheet 14 and the photovoltaic elements 5. Such layers of heat conductive material may increase the rate of heat transfer between the photovoltaic elements 5 and the upper sheet 14, and thus the rate of heat transfer between the photovoltaic elements 5 and the liquid within the passages 16. Such layers of heat conductive material may also increase the rate of heat transfer laterally across the photovoltaic elements 5.

Accordingly, providing a layer of heat conductive material may increase the degree of isothermal cooling and further tend to reduce, or eliminate, the formation of hot spots or regions in the photovoltaic elements 5.

Heat Exchange Assembly

Figure 8:
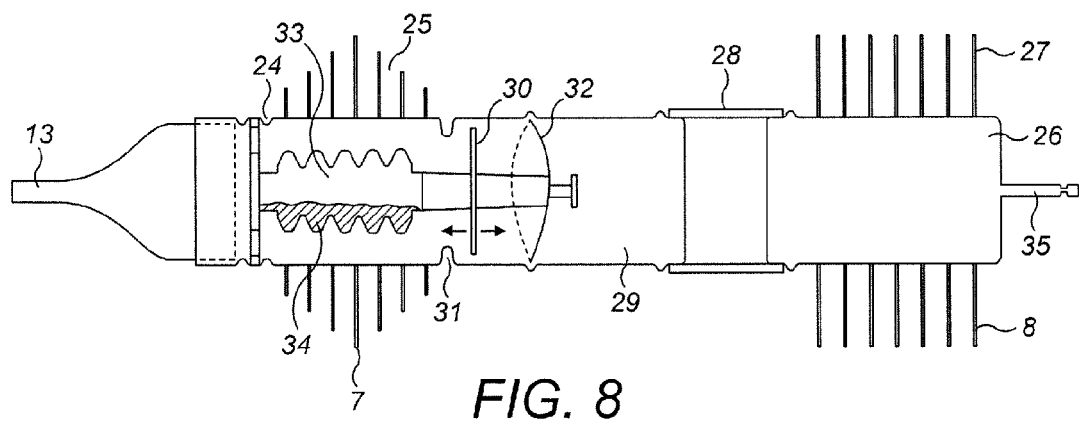
FIG. 8 is a longitudinal cross section diagram of a heat exchange assembly useable in the hybrid solar energy converter of FIG. 1.

FIG. 8 illustrates a cross sectional diagram of the heat exchange assembly 6 according to the first embodiment. As explained above, the heat exchange assembly 6 includes a primary heat exchanger 7 and a secondary heat exchanger 8 separated by a heat transfer control valve 9.

The tube 13 of the heat transport element 4 is connected to the heat exchange assembly 6. The tube 13 is connected to the primary heat exchanger 7. The primary heat exchanger 7 is formed by a cylindrical copper tube 24 having a plurality of heat transfer fins 25 extending outwardly from the tube 24. The heat transfer fins 25 extend into a flow channel carrying a first operating fluid. In the illustrated example of the first embodiment the first operating fluid is a pumped flow of water forming part of a domestic hot water and/or heating system.

The secondary heat exchanger 8 is formed by a cylindrical copper tube 26 having a plurality of heat transfer fins 27 extending outwardly from the tube 26. The heat transfer fins 27 extend into a second operating fluid. In the illustrated example of the first embodiment the second operating fluid is ambient air.

The copper tube 26 of the secondary heat exchanger 8 is separated from the copper tube 24 of the primary heat exchanger 7 by a length of glass tube 28. The glass tube 28 forms a thermal break between the primary and secondary heat exchangers 7 and 8. This thermal break may minimize the conduction of heat energy between the primary and secondary heat exchangers 7 and 8. The copper tube 24 of the primary heat exchanger 7, the glass tube 28 and the copper tube 26 of the secondary heat exchanger 8 define a fluid flow passage 29 extending from the tube 13 through the primary heat exchanger 7 and the heat transfer control valve 9 to the secondary heat exchanger 8.

The interiors of both of the primary and secondary heat exchangers 7 and 8 in communication with the tube 13 are sealed and at a vacuum pressure of $10^{-3}$ mbar. A vacuum pipe 35 is provided at the end of the secondary heat exchanger 8 to allow the primary and secondary heat exchangers 7 and 8 and the connected channels 16 within the heat transport element 4 to be evacuated during manufacture. This vacuum pipe 35 is blocked to provide a seal after the evacuation.

The fluid flow passage 29 is selectively blockable between the primary and secondary heat exchangers 7 and 8 by a valve element 30 of the heat transfer control valve 9. In a closed condition the valve element 30 bears against a valve seat 31 formed by a circumferential inwardly extending ridge in the copper tube 24 of the primary heat exchanger 7, blocking water vapor flow along the fluid flow passage 29. In an open condition the valve element 30 is separated from the valve seat 31 defining an annular gap allowing water vapor flow along the fluid flow passage 29.

The valve element 30 is urged towards the closed position by a toggle spring 32. A bellows 33 partly filled with an actuating liquid 34 is arranged so that as the temperature increases the vapor pressure of the actuating fluid increases and the increased pressure causes the bellows 33 to urge the valve element 30 towards the closed position with a force that increases with increasing temperature. At a predetermined trigger temperature the force applied by the bellows 33 will exceed the force applied by the toggle spring 32 and the valve element 30 will move to the open position, allowing water vapor flow along the fluid flow passage 29. Accordingly, at temperatures below the trigger temperature the fluid flow passage 29 will be closed and at temperatures above the trigger temperature the fluid flow passage 29 will be open. As explained above, the hot water vapor moves very quickly in the vacuum conditions within the fluid flow passage 29 so that when the valve 9 opens the time delay before heat energy is transferred to the secondary heat exchanger 8 may be very short.

In the illustrated embodiment the trigger temperature is the intended maximum temperature of the hot water supplied to the domestic hot water and/or heating system, 65° C.

In operation, when the temperature of the first operating fluid and the primary heat exchanger 7 is below the trigger temperature of the heat transfer control valve 9 the hot water vapor from the heat transport element 4 passes along the tube 13 and into the primary heat exchanger 7. The hot water vapor is prevented from reaching the secondary heat exchanger 8 by the closed control valve element 30. The hot water vapor condenses on an interior surface of the copper tube 24 of the primary heat exchanger 7, releasing heat energy which passes through the heat transfer fins 25 and into the first operating fluid. In the illustrated embodiment the heated first operating fluid provides a flow of heated water to a domestic hot water and/or heating system.

When the temperature of the first operating fluid and the primary heat exchanger 7 reaches or exceeds the trigger temperature of the heat transfer control valve 9, the heat transfer control valve 9 opens, allowing the hot water vapor from the heat transport element 4 to pass along the tube 13 and into both the primary heat exchanger 7 and the secondary heat exchanger 8. Accordingly, in addition to passing into the primary heat exchanger 7 as discussed above, the hot water vapor is also able to reach the secondary heat exchanger 8 through the open control valve element 30. The hot water vapor condenses on an interior surface of the copper tube 26 of the secondary heat exchanger 8, releasing heat energy which passes through the heat transfer fins 27 and into the second operating fluid. In the illustrated embodiment the heated second operating fluid provides a convection flow of heated air carrying heat away from the hybrid solar energy converter 1. This may allow the hybrid solar energy converter 1 to use the atmosphere as a heat sink. This may prevent further heating of the first operating fluid to be reduced or prevented.

This may allow the problem of stagnation encountered in solar water heating systems to be avoided or reduced. In solar water heating systems stagnation may occur when the water being heated reaches a maximum desired temperature. Generally, the pumping of the water to be heated through the solar water heater is then stopped to avoid overheating of the water, which could otherwise result in damage to the system supplied with the heated water. However, when the pumping of the water to be heated is stopped the stationary water near the solar water heater may then be heated to a very high temperature by the solar heater, resulting in undesirable overheating and pressurization of the water system.

The primary heat exchanger 8 is surrounded by a casing 50 including an inlet opening 51 and an outlet opening 52 for the water to be heated as the first operating fluid. Inlet and outlet supply pipes for the water may be attached to the inlet opening 51 and the outlet opening 52. The casing 50 is formed of a foamed plastics material with a hard outer shell to provide thermal insulation of the primary heat exchanger 7 and the first operating fluid and to provide weather resistance.

In some examples the casing 50 may be formed of other materials instead of foamed plastics. In some examples the casing may be formed of an electrically and thermally insulating material with good resistance to water and weathering. In particular, the casing may be formed of glass, ceramic, or concrete.

In one example the primary heat exchanger 8 may include a bleed valve to allow any air trapped within the first operating fluid in the primary heat exchanger 8 to be bled out. In other examples the bleed valve may not be provided. In examples where the first operating fluid is pumped through the primary heat exchanger the primary heat exchanger may be arranged to be pump purged of air by the pumped fluid flow.

As explained above, in the illustrated example of the first embodiment the trigger temperature of the heat transfer control valve 9 is predetermined. In some examples the trigger temperature may be settable in use, or on installation or manufacture of the hybrid solar energy converter 1. In some examples the trigger temperature may be settable to different values depending on the intended maximum water temperature of the water to be heated. In particular, in some examples the trigger temperature may be settable to 65° C. when the hybrid solar energy converter is to be used to heat water for a domestic hot water system and may be settable to 135° C. when the hybrid solar energy converter is to be used to heat water for an industrial hot water system.

In some examples the trigger temperature of the heat transfer control valve may be selected to maximize the generation of electrical energy by the photovoltaic elements 5. In some examples the trigger temperature value may be selected to increase the amount of heat energy transferred to the first operating fluid. In some examples the trigger temperature may be selected to optimize the overall production of energy, taking into account both the amount of electrical energy produced by the photovoltaic elements 5 and the amount of heat energy transferred to the first operating fluid. In some examples the optimizing may maximize the total production of energy. In some examples the optimum overall production of energy may take into account the relative demand for, or value of, the different types of energy, rather than simply maximizing the total amount of energy produced.

As explained above, the isothermal cooling tends to reduce, or prevent, the formation of hot spots or regions in the photovoltaic elements 5. This may allow the solar energy collector assembly 2 including the photovoltaic elements 5 to be operated at a higher temperature without reducing the efficiency with which the photovoltaic elements 5 produce electrical energy. This may allow the temperature of the collector assembly to be increased to produce more useable heat energy without the increase in temperature reducing the efficiency with which the photovoltaic elements 5 produce electrical energy. This may allow the trigger temperature to be increased.

In some examples the trigger temperature may be set to different temperatures during use of the hybrid solar energy converter 1. This may allow the temperature of the collector assembly to be controlled to produce different amounts of useable heat energy or electricity depending upon which type of energy is most in demand at a specific time.

Figure 9:
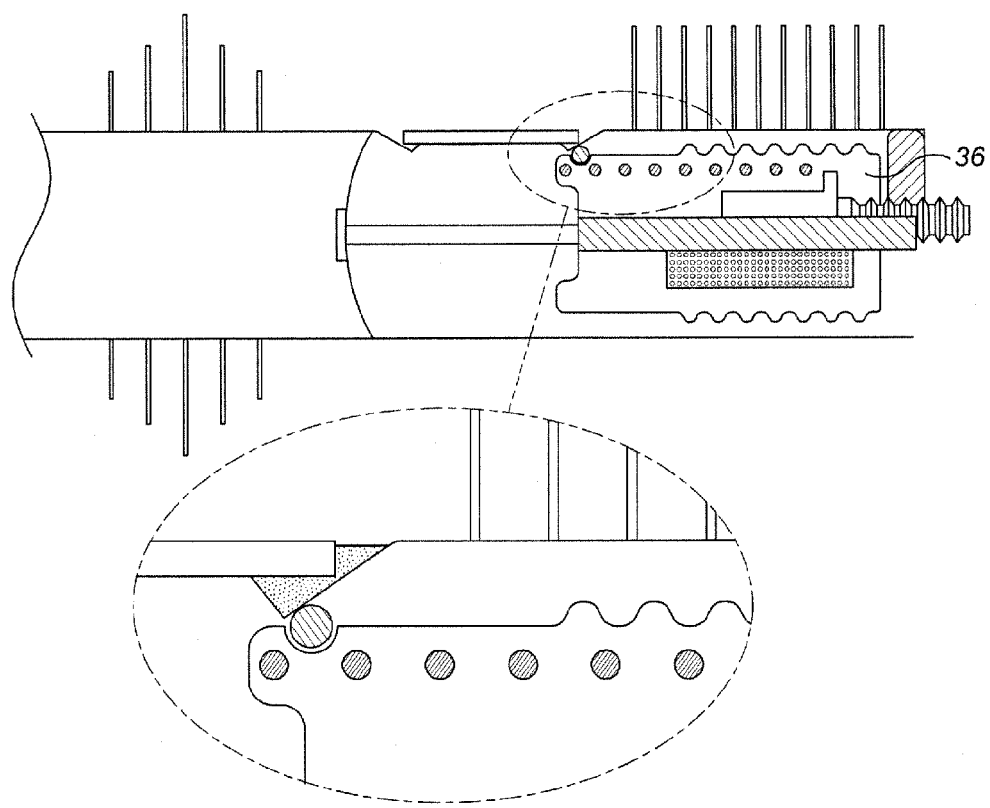
FIG. 9 is a cut away diagram of an alternative arrangement of a part of the heat exchange assembly of FIG. 8.

An alternative arrangement to operate the valve 9 is shown in FIG. 9. In this alternative arrangement the valve element 30 is urged into the closed position by a toggle spring as before. In this arrangement the valve element 30 may be selectively urged into an open position by a solenoid 36. In this alternative arrangement the solenoid may be controlled based on a measured temperature of the primary heat exchanger or of the water to be heated in order to limit the maximum temperature reached.

Alternatively, the solenoid may be controlled in whole, or in part, based upon the current requirements of a user. For example, when hot water is more in demand than electricity the valve 9 may be closed to pass hot water vapor from the heat transport element 4 only to the primary heat exchanger 7 to maximize the amount of heat applied to the water acting as the first operating fluid regardless of any temporary reduction in efficiency of the photovoltaic elements 5 as a result of any resulting increase in temperature of the collector assembly. Further, when hot water is less in demand than electricity, the valve 9 may be opened in order to pass hot water vapor from the heat transport element 4 to both of the primary and secondary heat exchangers 7 and 8 in order to cool the photovoltaic elements as much as possible and maximize the efficiency of electricity generation regardless of the effects on the temperature of the water acting as the first operating fluid.

In the illustrated example of the first embodiment the temperature of the solar energy collector assembly 2, and thus the temperature of the photovoltaic elements 5, is controlled by operating the heat transfer control valve 9 to selectively enable or disable the transfer of heat energy from the solar energy collector assembly 2 to the secondary heat exchanger 8.

In other examples other control methods can be used additionally or alternatively to control the temperature of the solar energy collector assembly 2. In some examples the temperature of the solar energy collector assembly 2 may be controlled by changing the rate of removal of heat energy from the solar energy collector assembly 2.

In some examples the rate of removal of heat energy from the solar energy collector assembly 2 can be controlled by altering the flow rate of the first operating fluid passing through the primary heat exchanger 7. In some examples the rate of removal of heat energy from the solar energy collector assembly 2 can be controlled by altering the surface area over which the first operating fluid is in contact with the primary heat exchanger 7, for example by selectively opening or closing fluid flow passages of the first operating fluid within the primary heat exchanger 2.

In some examples the rate of removal of heat energy from the solar energy collector assembly 2 can be controlled by altering the vacuum pressure within the tube 3. This may change the rate of convective heat loss from the solar energy collector assembly 2 to the tube 3. In general, heat transferred to the tube 3 will be rapidly lost to the outside environment by convection and/or conduction.

In some examples the rate of removal of heat energy from the solar energy collector assembly 2 can be controlled by altering the vacuum pressure within the heat transport element 4. In general, the tendency of the liquid water within the passage 16 to vaporize and form bubbles of vapor 23 will increase as the vacuum pressure is reduced, and the tendency of the liquid water within the passage 16 to vaporize and form bubbles of vapor 23 will decrease as the vacuum pressure is increased. As is explained above, the density driven circulation of water around the passages 16 and the transport of heat energy along the tube 13 are both driven by water vapor. Accordingly, altering the tendency of the liquid water to vaporize by altering the vacuum pressure may allow the rate of removal of heat energy from the solar energy collector assembly 2, and the rate of removal of heat energy from the photovoltaic elements 5 to be controlled, and so allow the temperature of the solar energy collector assembly 2 and photovoltaic elements 5 to be controlled.

Further, the temperature at which rolling boiling of the water 22 within the passage 16 commences will tend to increase as the vacuum pressure is increased, and will tend to decrease as the vacuum pressure is decreased. Accordingly, in examples where the vacuum pressure within the heat transport element 4 is altered the temperature at which the water 22 within the passage 16 commences rolling boiling can be changed.

As is explained above, the density driven circulation of water around the passages 16 becomes particularly vigorous, and becomes particularly effective as a heat transport mechanism, when the water 22 within the passage 16 enters a rolling boil state. Accordingly, altering the temperature at which the water 22 within the passage 16 commences rolling boiling by altering the vacuum pressure may allow the rate of removal of heat energy from the solar energy collector assembly 2 and photovoltaic elements 5 to be controlled, and so allow the temperature of the solar energy collector assembly 2 and photovoltaic elements 5 to be controlled.

In some examples the temperature of the solar energy collector assembly 2 may be controlled by changing the amount of solar energy incident on the solar energy collector assembly 2, and so changing the rate of absorption of heat energy by the solar energy collector assembly 2.

In some examples the amount of incident solar energy may be controlled by changing the orientation of the solar energy collector assembly relative to the direction of the incident solar energy. This can be carried out using a drive mechanism able to rotate the solar energy collector assembly about one or more axes.

In some examples the amount of incident solar energy may be controlled using adjustable light intercepting or blocking mechanisms in the path of the incident solar energy. In some examples variable filters, shutters, stops, or the like may be used. In some examples these adjustable light intercepting or blocking mechanisms may comprise physical devices. In some examples these adjustable light intercepting or blocking mechanisms may comprise devices having electronically controlled optical characteristics, such as liquid crystals.

In examples where the temperature of the solar energy collector assembly and/or the photovoltaic elements are to be controlled, a temperature sensor and a temperature controller may be provided, together with a temperature control mechanism arranged to carry out one, some, or all, of the methods of controlling temperature described above.

The temperature sensor is arranged to measure the temperature of the solar energy collector assembly and provide this temperature value to the temperature controller. The temperature controller can then operate the temperature control mechanism in a suitable manner to control the temperature of the solar energy collector assembly to the desired value.

Examples where the temperature of the photovoltaic elements is to be controlled a temperature sensor arranged to measure the temperature of a photovoltaic element or elements and provide this temperature value to the temperature controller may be provided. This may be additional to, or instead of, the temperature sensor arranged to measure the temperature of the solar energy collector assembly. The temperature controller can then operate the temperature control mechanism in a suitable manner to control the temperature of the photovoltaic element or elements to the desired value.

In some examples the temperature sensor can be provided on the upper surface of the solar energy collector assembly. In some examples the temperature sensor can be formed on the same semiconductor wafer as a photovoltaic element.

Conveniently, the temperature controller may be a suitably programmed general purpose computer.

In the illustrated first embodiment copper is used in the heat exchangers. This may enhance the efficiency of the heat exchangers because copper has a relatively high thermal conductivity. In alternative examples other materials may be used.

In alternative examples different types of valve may be used. In particular a valve may be used with a valve element acting as a piston moving within a valve seat acting as a cylinder whereby the valve is closed when the valve element is within the valve seat and the valve is opened when the valve element is outside the valve seat.

In the illustrated first embodiment the fluid flow passage 29, tube 13, and the passages 16 within the heat transport element 4 are evacuated through a vacuum pipe 35 at the end of the secondary heat exchanger 8. In alternative examples a differently located vacuum pipe may be provided. In particular a vacuum pipe may be provided at the end of the heat transport element remote from the heat exchange assembly, as shown in FIG. 3.

The illustrated first embodiment is a hybrid solar energy converter comprising photovoltaic elements and arranged to convert incident solar radiation into outputs of both electrical energy and hot water. In other examples the photovoltaic elements may be omitted to provide a solar energy converter arranged to convert incident solar radiation into an output of hot water.

Second Embodiment

Figure 10:
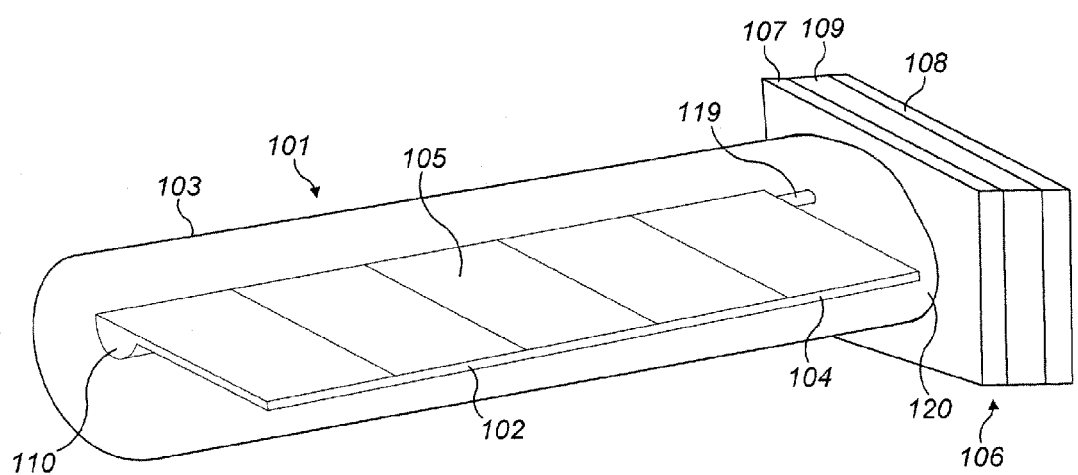
FIG. 10 is a diagram of a second embodiment of a hybrid solar energy converter according to the invention.

Apparatus according to a second embodiment of the present invention is illustrated in FIG. 10. FIG. 10 shows a general exterior view of a second embodiment of a hybrid solar energy converter 101 according to the present invention.

Overview

In the second embodiment, the hybrid solar energy converter 101 includes a solar energy collector assembly 102 housed within a sealed transparent tube 103. The solar energy collector assembly 102 includes a heat transport element 104 and an array of photovoltaic elements 105 mounted on an upper surface of the heat transport element 104. The hybrid solar energy converter 101 also includes a heat exchange assembly 106 at one end of the transparent tube 103. One end of the solar energy collector assembly 102 is connected to the heat exchange assembly 106. Similarly to the first embodiment, in different examples the photovoltaic elements 105 may be formed of silicon, or gallium arsenide, or other suitable semiconductor materials. In other examples organic photovoltaic elements may be used. In other examples hybrid photovoltaic elements may be used.

In the second embodiment, the heat exchange assembly 106 includes a primary heat exchanger 107 arranged to transfer heat energy from the heat transport element 104 to a first fluid, and a secondary heat exchanger 108 arranged to transfer heat energy from the heat transport element 104 to a second fluid. The primary heat exchanger 107 and the secondary heat exchanger 108 are separated by a heat transfer control valve 109 able to selectively allow, or prevent, the transfer of heat energy from the heat transport element 104 to the secondary heat exchanger 108.

In one possible example, in use the hybrid solar energy converter 101 may be mounted on a roof. Accordingly, mounting brackets similar to those of the first embodiment may be provided.

In overview, the operation of the hybrid solar energy converter 101 of the second embodiment is similar to operation of the hybrid solar energy converter 1 of the first embodiment. Solar energy incident on the hybrid solar energy converter 101 passes through the sealed transparent tube 103 and is incident on the photovoltaic elements 105 of the solar energy collector assembly 102. The photovoltaic elements 105 convert a part of the energy of the incident solar energy into electrical energy, and convert a part of the energy of the incident solar energy into heat energy. A further part of the incident solar energy may be incident on any parts of the solar energy collector assembly 102 which are not covered by the photovoltaic elements 105, and this further part of the incident solar energy may also be converted into heat energy. In general, it is desirable to maximize the proportion of the surface of the solar energy collector assembly 102 exposed to incident solar energy which is covered by the photovoltaic elements 105, and to minimize the proportion which is not so covered. However, in some circumstances it may be preferred to leave some parts of this exposed surface uncovered, for example to simplify manufacture and/or assembly of the solar energy collector assembly 102 and attachment of the photovoltaic elements 105 to the solar energy collector assembly 102. Usually, in the second embodiment the surface of the solar energy collector assembly exposed to incident solar energy will be the upper surface.

The electrical energy produced by the photovoltaic elements 105 is carried along the heat transport element 104 by electrical conductors and away from the solar energy converter 101 for use. The heat energy absorbed by the photovoltaic elements 105 is transferred into the heat transport element 104, cooling the photovoltaic elements 105, and then carried to the heat exchange assembly 106.

Similarly to the first embodiment, the heat transfer control valve 109 is able to selectively allow, or prevent, the transfer or transport of heat energy from the heat transport element 104 to the secondary heat exchanger 108. Accordingly, the degree of cooling applied to the photovoltaic elements 105 can be varied.

In one typical arrangement, the hybrid solar energy converter 101 may be used to generate electricity, and to generate hot water. Similarly to the first embodiment, in this arrangement the heat energy transferred to the primary heat exchanger 107 is transferred into a pumped water supply flowing through the primary heat exchanger 107 to heat the water. This heated water is then used by a domestic or industrial hot water system, and the electrical energy produced by the photovoltaic elements 105 is supplied to an electrical supply system. In some arrangements the heat energy transferred to the secondary heat exchanger 108 is transferred into ambient air and allowed to escape and the secondary heat exchanger 108 is used, under the selective control of the heat transfer control valve 109, to release heat energy in order to regulate the temperature of the solar energy collector assembly 102

Transparent Tube

In the second embodiment illustrated in FIG. 10 the sealed transparent tube 103 is similar to the sealed transparent tube 3 of the first embodiment, having one closed domed end and one open end sealed by a metal end cap 120. The interior of the tube 103 is at least partially evacuated. That is, the interior of the tube is at a pressure below normal atmospheric pressure.

The pressure of the vacuum within the tube 103 may be $10^{-3}$ mbar. Other vacuum pressures may be used, as discussed regarding the first embodiment. In some examples the vacuum pressure may be in the range $10^{-2}$ mbar to $10^{-6}$ mbar. In general, it is expected that lower vacuum pressure, or in other words a harder vacuum, will provide greater insulating benefits. Further, it is expected that lower vacuum pressure, or in other words a harder vacuum, will provide greater protection from environmental damage in examples where the photovoltaic elements are not encapsulated. In practice the benefits of using a lower vacuum pressure may need to be balanced against the increased cost of achieving a lower vacuum pressure. In some examples a vacuum pressure of $10^{-2}$ mbar, or lower, may be used.

In an alternative example the sealed transparent tube 103 may be filled with an inert gas instead of being evacuated. In particular, the inert gas may be nitrogen.

In another alternative example the sealed transparent tube 103 may be filled with an inert gas at a reduced pressure. In some examples this may be achieved by filling the tube 103 with the inert gas and then evacuating the tube 103. In particular, the inert gas may be nitrogen.

In the illustrated second embodiment the tube 103 is cylindrical having a circular cross section. Similarly to the first embodiment, in alternative examples the tube 103 may have other shapes. In some examples the cross sectional size and/or shape of the tube 103 may vary at different positions along its length. In an alternative example the tube 103 may have an elliptical cross section. In particular, the tube 103 may have an elliptical cross section with the long axis of the ellipse aligned with the plane of the solar energy collector assembly 102.

In the illustrated first embodiment the tube 103 is formed of glass. In alternative examples suitable transparent plastics materials or laminated structures may be used to form the tube 103.

In the illustrated second embodiment the tube 103 is transparent. In alternative examples the tube may be only partially transparent.

In the illustrated second embodiment the metal end cap 120 may be bonded to the glass tube 103 by adhesive. In other embodiments alternative glass to metal bonding techniques may be used, for example welding, brazing or soldering.

Similarly to the first embodiment the tube 103 has a metal end cap 120 at one end. In alternative examples the end cap 120 may be made of other materials. In some examples the end cap 120 may be made of glass. This may reduce conductive heat losses from the collector assembly 102.

Collector Assembly

In the second embodiment, the solar energy collector assembly 102 includes a heat transport element 104 and an array of photovoltaic elements 105 mounted on a surface of the heat transport element 104. In order to allow radiant solar energy to be incident on the photovoltaic elements 105 the array of photovoltaic elements 105 are mounted on the surface of the heat transport element 104 which is exposed to the incident radiant solar energy in operation of the hybrid solar energy converter 101. This will usually be the upper surface of the heat transport element 104.

In some arrangements the surface of the heat transport element 104 exposed to the incident radiant solar energy may not be the upper surface. In particular, this would be the case if the solar energy collector assembly 102 was located in a vertical, or substantially vertical, plane, or if the incident solar radiant energy was incident horizontally or from below, for example after redirection by an optical system, such as a mirror. Accordingly, references to upper and lower surfaces, and similar directional terminology in this description, should be understood as referring to the situation illustrated in the figures where the solar energy collector assembly is in a plane at an angle to the horizontal and radiant solar energy is incident from above.

In the illustrated example of the second embodiment, the solar energy collector assembly 102 is supported by a cylindrical tube 119 of the heat transport element 104. The cylindrical tube 119 passes through the end cap 120 and into the heat exchange assembly 106, as will be explained in more detail below. Where the cylindrical tube 119 passes through the end cap 120 the cylindrical tube 119 is soldered to the end cap 120 to retain the cylindrical tube 119 in place and support the solar energy collector assembly 102.

In alternative examples the cylindrical tube 119 may be secured to the end cap 120 in other ways. In one example the cylindrical tube 119 may be welded to the end cap 120.

The supporting of the solar energy collector assembly 102 by a single physical connection through the cylindrical tube 119 may increase the efficiency with which heat can be collected from incident solar energy by the solar energy collector assembly 102. Having the solar energy collector assembly 102 supported by a single physical connection through the cylindrical tube 119 may reduce conductive heat loss from the solar energy collector assembly 102 into the supporting structure outside the transparent tube.

In the second embodiment the heat transport element 104 has a substantially flat upper surface 104*a*. Each of the photovoltaic elements 105 is square, and the width of the heat transport element 104 is the same as the width of each square photovoltaic element 105. Five square photovoltaic elements 105 are mounted side by side to one another along the length of the heat transport element 104. Substantially the entire upper face of the heat transport element 104 is covered by the photovoltaic elements 105. Covering a large proportion of the upper surface 104*a* of the heat transport element 104 with photovoltaic elements 105 may increase the efficiency of the hybrid solar energy converter 101.

In one example the square photovoltaic elements 105 may each be a 125 mm by 125 mm square and 0.2 mm thick. In another example the square photovoltaic elements may each be a 156 mm by 156 mm square. In other examples, photovoltaic elements having other sizes or shapes may be used.

Figure 11:
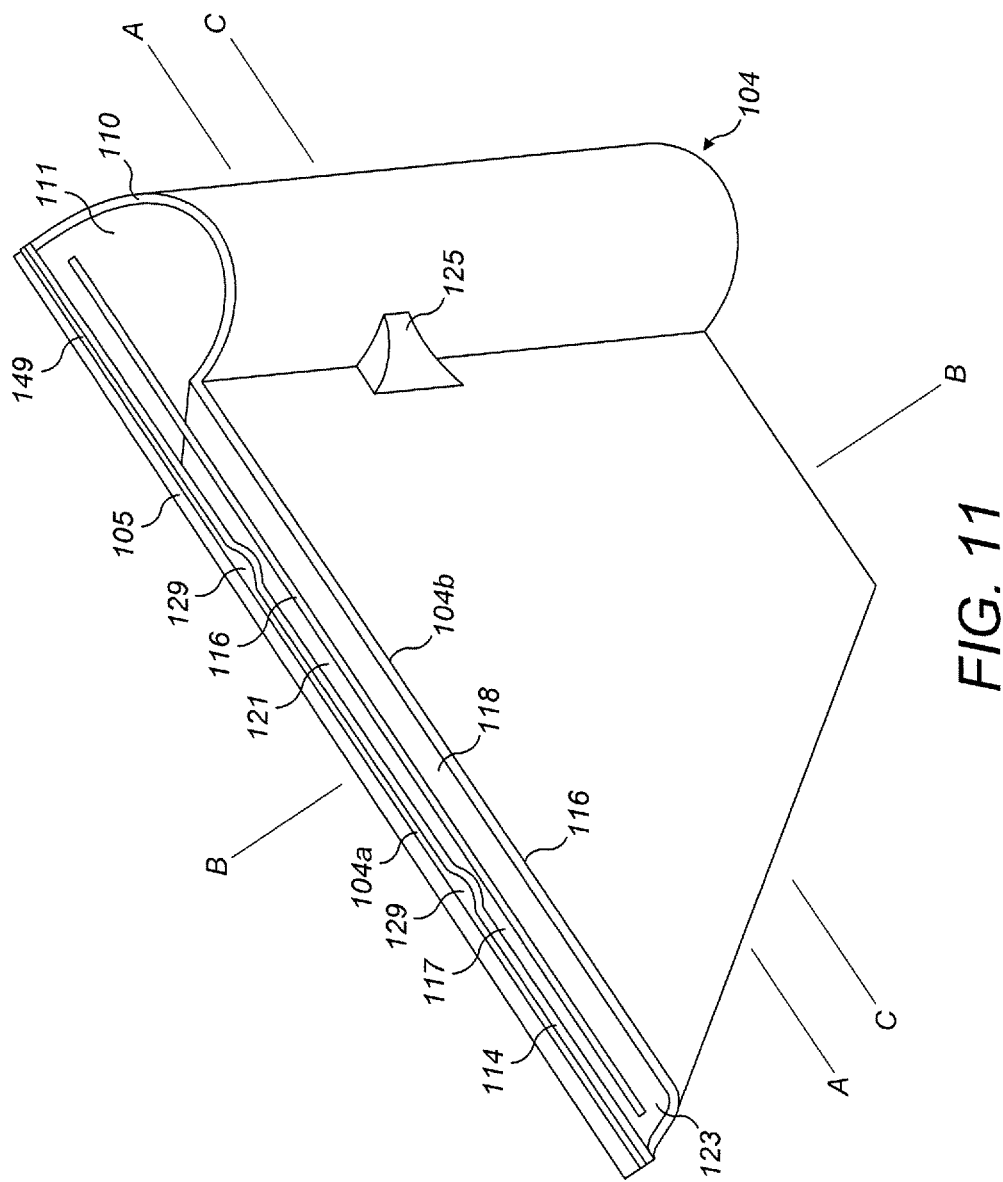
FIG. 11 is a cut away diagram of a solar energy collector assembly useable in the hybrid solar energy converter of FIG. 10.

The photovoltaic elements 105 are bonded to the substantially flat upper surface 104*a* of the heat transport element 104 using a layer 149 of heat conducting adhesive in a similar manner to the first embodiment. This thermally conductive adhesive bonding layer 149 is shown in FIG. 11. The adhesive bonding layer 149 is electrically insulating. The adhesive bonding layer 149 between the photovoltaic elements 105 and the heat transport element 104 is arranged to be thin. This may improve the degree of thermal conduction between the photovoltaic elements 105 and the heat transport element 104. This may increase the rate of heat transfer laterally across the photovoltaic elements 105. An adhesive material loaded with solid spheres of a predetermined size may be used to form the adhesive bonding layer 149. This may allow a thin adhesive layer 149 to be consistently and reliably formed. The adhesive bonding layer 149 is formed of a flexible or "forgiving" adhesive material. This may relieve stresses in the assembled solar energy collector assembly 102 and reduce any stress applied to the photovoltaic elements 105.

The photovoltaic elements 105 are semiconductor photovoltaic elements formed of silicon. In one embodiment the photovoltaic elements are formed of single-crystal silicon. In one embodiment the photovoltaic elements are formed of amorphous silicon. In one embodiment the photovoltaic elements are formed of polycrystalline silicon, or polysilicon. In other embodiments alternative types of semiconductor photovoltaic elements may be used.

As discussed above, in operation of the hybrid solar energy converter 101 the photovoltaic elements 105 are cooled by the heat transport element 104. This cooling may allow the temperature of the photovoltaic elements 5 to be maintained at a desired value.

This cooling may provide the advantage that the appearance of hot spots or regions in the photovoltaic elements 105 can be reduced or eliminated, and the temperature of the photovoltaic elements 105 maintained at a uniform desired value. Such hot spots or regions may for example be produced by heating by incident solar radiation, by inhomogeneities or faults in the photovoltaic elements 105, or by a combination of, or interaction between, these causes.

Such hot spots or regions can reduce the efficiency of the photovoltaic elements 105. It is believed that hot spots in the photovoltaic elements 105 may reduce the efficiency of the photovoltaic elements 105 in the short term, and may also degrade the performance of the photovoltaic elements 105 in the longer term. As discussed above, the efficiency of photovoltaic elements reduces as the temperature increases. In the short term a hot spot in a photovoltaic element may reduce the output of the photovoltaic element because the material forming the hot spot is at a higher temperature than the rest of the photovoltaic element, and so has a reduced efficiency compared to the rest of the photovoltaic element. Further, in the longer term the degrading of the performance of the photovoltaic element may also take place more rapidly at a hot spot because the material forming the hot spot is at a higher temperature than the rest of the photovoltaic element.

Accordingly, maintaining the photovoltaic elements 105 at a more uniform temperature value and reducing, or eliminating, hot spots or regions may improve the efficiency of the photovoltaic elements 105 at a specific temperature, and may reduce the amount of degradation of the photovoltaic elements 105 caused by higher temperatures.

This may allow the photovoltaic elements 105 to operate at a higher overall temperature than would otherwise be the case. This may be understood by considering that where hot spots exist in the photovoltaic elements 105 it may be the temperature induced reduction in efficiency and temperature induced degradation in these hot spots that limits the maximum operating temperature of the photovoltaic element 105 as a whole. As a result, reducing, or eliminating, these hotspots may allow the maximum operating temperature of the photovoltaic element 105 as a whole to be raised.

The illustrated example of the second embodiment has a solar energy collector assembly 102 supported by a single physical connection through the cylindrical tube 119. In other examples alternative supporting arrangements may be used. In some examples the solar energy collector assembly 102 may be supported by two physical connections, one at each end of the solar energy collector assembly 102. In some examples, one of the two physical connections may be the through the cylindrical tube. In general, it is advantageous to minimize the number of physical supports in order to minimize the escape of heat from the solar energy collector assembly by conduction through the physical supports.

In other examples the number of photovoltaic elements 105 mounted on the heat transport element 104 may be different. In other examples the relative sizes of the photovoltaic elements 105 and the heat transport element 104 may be different.

In some examples the adhesive layer 149 may comprise an epoxy resin which remains non-brittle after curing.

In other examples the adhesive layer 149 may be formed by a double sided adhesive tape.

Heat Transport Element

Figure 12:
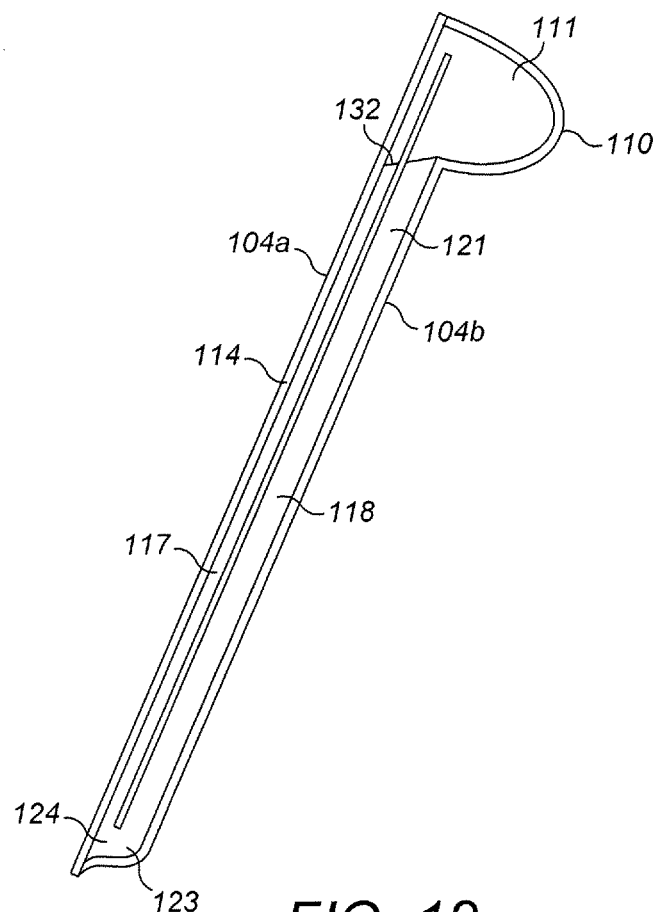
FIG. 12 is a transverse cross-section along the line A-A of the solar energy collector assembly of FIG. 11.
Figure 13:
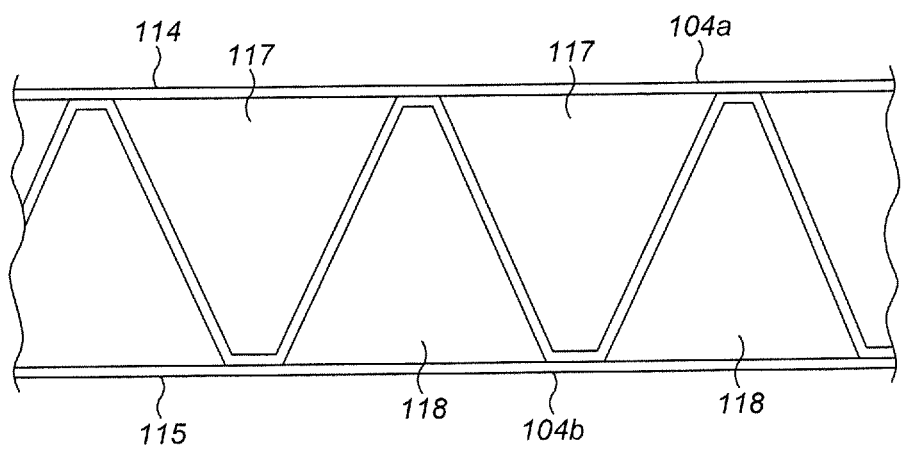
FIG. 13 is a longitudinal cross-sectional diagram along the line B-B of the solar energy collector assembly of FIG. 11.

The heat transport element 104 according to the second embodiment is shown in more detail in a cut away view in FIG. 11, and in transverse and longitudinal cross-sectional views in FIGS. 12 and 13 respectively. The transverse cross section of FIG. 12 is taken along the line A-A in FIG. 11. The longitudinal cross section of FIG. 13 is taken along the line B-B in FIG. 11.

In the second embodiment, the heat transport element 104 is generally rectangular. The heat transport element 104 has a flat upper surface 104a and a lower surface 104b which is flat across most of its area, and has an outwardly projecting section 110 along one edge 104c of the heat transport element 104. The outwardly projecting section 110 contains and defines a vapor manifold 111. In operation the heat transport element 104 is arranged to be transversely sloping, so that the side edge 104c of the heat transport element 104 bearing the outwardly projecting section 110 is higher than the opposite side edge 104d of the heat transport element 104, for reasons which will be explained in detail below. The inclination angle of the heat transport element 104 to the horizontal may be small. An inclination of about 5° is sufficient. Larger angles of inclination may be used if desired. An angle of inclination up to and including 90° may be used, i.e. the heat transport element 104 may be arranged transversely vertically.

The heat transport element 104 has an upper surface 104a formed by an upper sheet 114 and a lower surface 104b formed by a lower sheet 115. A central sheet 116 is located between the upper sheet 114 and the lower sheet 115, so that fluid flow passages 117 and 118 running transversely across the heat transport element 104 are defined between the central sheet 116 and each of the upper sheet 114 and the lower sheet 115. The fluid flow passages 117 and 118 are sloped along their lengths. In the illustrated example the heat transport element 104 is transversely sloping, and as a result the fluid flow passages 117 and 118 running transversely across the heat transport element 104 will be sloped along their lengths.

Figure 14:
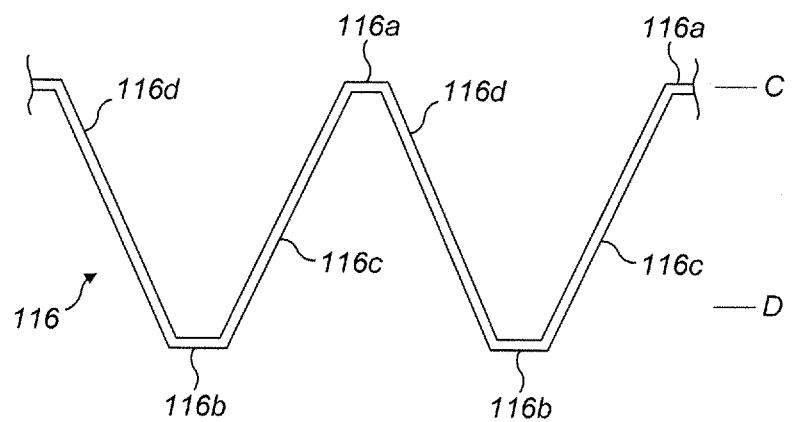
FIG. 14 is a diagram of a central sheet useable in the solar energy collector assembly of FIG. 11.

FIG. 14 shows the profile of the central sheet 116 in more detail. FIG. 14 shows a longitudinal cross section along the line B-B in FIG. 11. The central sheet 116 is formed with a corrugated profile having ridges and troughs which run transversely across the heat transport element 104. The cross-sectional profile of the corrugated central sheet 116 can be understood as a zig-zag profile with the points of the zig-zag forming the peaks and troughs being flattened. Accordingly, the upper and lower fluid flow passages 117 and 118 are interleaved. The upper and lower fluid flow passages 117 and 118 are arranged side by side in a planar array with upper fluid flow passages 117 and lower fluid flow passages 118 arranged alternately.

To be more specific, in the illustrated example of the second embodiment the central sheet 116 comprises a plurality of flat surfaces connected by folds running transversely across the heat transport element 104. The central sheet 116 comprises a first series of first coplanar surfaces 116a spaced apart equidistantly in a first plane C and a second series of second coplanar surfaces 116b spaced apart equidistantly in a second plane D, each of the first and second coplanar surfaces 116a and 116b having the same width, and the separation between successive coplanar surfaces 116a or 116b of each of the first and second series of first and second coplanar surfaces 116a and 116b being larger than the width of the coplanar surfaces 116a and 116b. The first and second planes C and D are parallel and spaced apart. The first and second series of coplanar surfaces are arranged so that in plan view, i.e. when viewed perpendicularly to the first and second planes C and D, each of the first coplanar surfaces 116a is located equidistantly between two of the second coplanar surfaces 116b, and vice-versa. The first and second coplanar surfaces 116a and 116b are interconnected by a first series of first parallel linking surfaces 116c and a second series of second parallel linking surfaces 116d.

As is shown particularly in FIG. 13, the central sheet 116 is arranged with the first surfaces 116a contacting an inner face of the upper sheet 114 and the second surfaces 116b contacting an inner face of the lower sheet 115. The first surfaces 116a of the central sheet are bonded to the upper sheet 114 and the second surfaces 116b of the central sheet 116 are bonded to the lower sheet 115. Accordingly, the upper lower, and central sheets 114, 115, 116 define a plurality of trapezoid cross-section upper fluid flow channels 117 and lower fluid flow channels 118 between them. The upper fluid flow channels 117 are defined between the upper sheet 114 and the central sheet 116. The lower fluid flow channels 118 are defined between the lower sheet 115 and the central sheet 116. The trapezoid upper fluid flow channels are arranged so that the larger one of the two parallel faces of the trapezoid channel is formed by the upper sheet 114.

The edges of the heat transport element 104 are formed by upwardly bent parts of the lower sheet 115, which are bonded to the upper sheet 114. The photovoltaic elements 105 are bonded to the upper sheet 114. At the edges of the heat transport element 104, the upper sheet 114 is bonded directly to the lower sheet 115, the central sheet 116 is not located between the upper and lower sheets 114 and 115 at their edges.

In some examples the central sheet 116 may extend at least partially between the upper and lower sheets 114 and 115 at the end edges of the heat transport element 104 so that the upper and lower sheets 114 and 115 are both bonded to the central sheet 116. This may assist in locating and securing the central sheet 116 relative to the upper and lower sheets 114 and 115.

As discussed above, the heat transport element 104 has an outwardly projecting section 110 along the upper side edge 104c of the heat transport element 104. The outwardly projecting section 110 is substantially semi-cylindrical and is formed by an outwardly projecting part of the lower sheet 115. The outwardly projecting section 110 defines a vapor manifold 111. The fluid flow channels 117 and 118 connect to the vapor manifold 111. It should be noted that the central sheet 116 extends across most of the width of the vapor manifold 111. Accordingly, the upper fluid flow channels 117 defined between the upper sheet 114 and the central sheet 116 connect to the vapor manifold 111 towards the top of the vapor manifold 111, while the lower fluid flow channels 118 defined between the lower sheet 115 and the central sheet 116 connect to the vapor manifold 111 towards the bottom of the vapor manifold 111. All of the upper and lower fluid flow channels 117 and 118 are interconnected by the vapor manifold 111.

At the lower side edge 104d of the heat transport element 104 opposite the outwardly projecting section 110, there is a gap 123 between the edge of the central sheet 116 and the side edge 104c of the heat transport element 104 formed by an upwardly bent part of the lower sheet 115. This gap 123 allows water to flow between different ones of the fluid flow channels 117 and 118. The gap 123 extends along the side edge 104d of the heat transport element 104, and forms a fluid manifold 124 interconnecting all of the upper and lower fluid flow channels 117 and 118.

At an end of the heat transport element 104 adjacent the open end of the glass tube 103 and the end cap 120 the substantially semi-cylindrical outwardly projecting section 110 extending most of the length of the heat transport element 104 transitions to a projecting cylindrical tube 119. The upper and lower sheets 114 and 115 are sealed to the cylindrical tube 119 so that the interior of the heat transport element 104 is sealed. The cylindrical tube 119 passes through the end cap 12 and into the heat exchange assembly 106. The central bore of the cylindrical tube 119 is connected to the vapor manifold 111 and acts to carry heat energy from the heat transport element 104 to the heat exchange assembly 106, as will be explained below.

The cylindrical tube 119 physically supports the solar energy collector assembly 102 within the sealed transparent tube 103. There is no other physical support of the solar energy collector assembly 102. This may reduce conductive heat losses from the solar energy collector assembly 102, which may increase the amount of useful heat energy produced by the hybrid solar energy converter 101.

The fluid flow channels 117 and 118 are at least partially filled with degassed distilled water 121 as a working fluid and the interior of the heat transport element 104 including the fluid flow channels 117 and 118, the vapor manifold 111, and the tube 119 are at least partially evacuated. That is, the interior of the heat transport element 104 is at a pressure below normal atmospheric pressure. The interior of the heat transport element 104 may be under a vacuum at a pressure of $10^{-3}$ mbar. The heat transport element 104 is arranged to be laterally inclined to the horizontal with the side 104a of the heat transport element 104 where the vapor manifold 111 is located being arranged to be higher than the opposite side 104b of the heat transport element 104.

In the illustrated second embodiment the amount of water 121 in the fluid flow channels 117 and 118 is such that an upper surface 132 of the water 121 in the lower fluid flow channels 118 is level with the ends of the lower fluid flow channels 118 where the lower fluid flow channels 118 connect to the vapor manifold 111. In the illustrated second embodiment the level of the surface 132 of the water 121 in the upper fluid flow channels 117 and lower fluid flow channels 118 is substantially the same. Accordingly, in the illustrated second embodiment the lower fluid flow channels are filled with liquid water, while the upper fluid flow channels 117 are only partially filled with liquid water.

In other examples the level of the water 121 may be different. In some examples the upper surface 132 of the water 121 in the lower fluid flow channels 118 may be below the vapor manifold 111. In some examples the upper surface 132 of the water 121 in the lower fluid flow channels 118 may be above the bottom of the vapor manifold 111, with some water being present in the bottom of the vapor manifold 111.

It is expected that in practice the heat transport element 104 will operate most efficiently with the upper surface 122 of the water being at, or close to, the point where the lower fluid flow channels 118 contact the vapor manifold 111. If the level of the water in the heat transport element 104 is too high, so that the upper surface 122 of the water is too high within the vapor manifold 111, the efficiency of operation of the heat transport element 104 may be reduced, as will be discussed in more detail below.

The upper surface 132 of the water 121 in the upper fluid flow channels 117 may be higher than in the lower fluid flow channels 118 as a result of capillary action. The extent of this capillary effect in any specific example will depend upon the dimensions of the upper fluid flow channels 117. In the illustrated second embodiment some of the inner surface of the upper sheet 114, that is, the surface forming a part of the upper fluid flow channels 117, is above the surface of the water 121. In some examples the upper fluid flow channels 117 may have a small enough cross-sectional area that the upper surface 123 of the water 121 in the upper fluid flow channels 117 is at the ends of the upper fluid flow channels 117 due to capillary action.

It should be noted that, unlike the first embodiment, it is not necessary that the inner surface of the upper sheet 114, that is, the surface forming a part of the upper fluid flow channels 117, is below the upper surface 132 of the water 121 at a position corresponding to the location of the uppermost parts of the photovoltaic elements 105. However, in some embodiments this may be the case.

In operation of the second embodiment, when the solar energy collector assembly 102 is exposed to incident solar radiative energy, the photovoltaic elements 105 absorb some of this energy, converting a part of the absorbed energy into electrical energy. The remainder of the absorbed energy is converted into heat energy, raising the temperature of the photovoltaic elements 105. The absorbed heat energy flows from the photovoltaic elements 105 into the heat transport element 104, being transmitted through the upper sheet 114 and into the water 121 inside the upper fluid flow channels 117, which water is in contact with the inner surface of the upper metal sheet 114 across the larger parallel faces of the trapezoid upper fluid flow channels 117.

Figure 15:
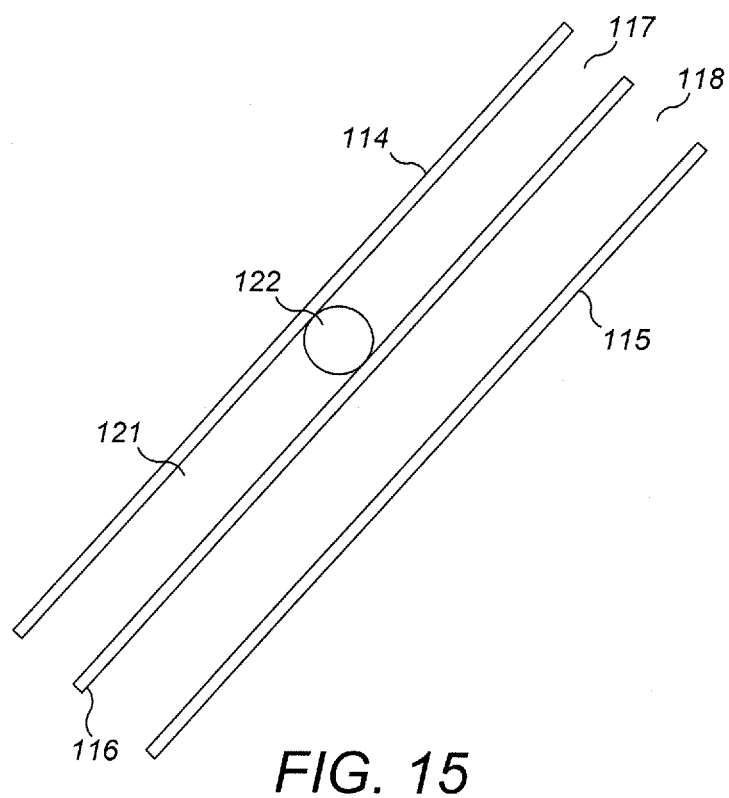
FIG. 15 is an explanatory diagram illustrating the operation of the solar energy collector assembly of FIG. 11.

The liquid water 121 inside the upper fluid flow channels 117 absorbs the heat energy from the photovoltaic elements 105 passing through the upper sheet 114 and vaporizes, producing bubbles 122 of steam or water vapor, as shown in FIG. 15. The liquid water may vaporize and produce bubbles as a result of either or both of convection boiling and nucleation. At the vacuum pressure of $10^{-3}$ mbar inside the upper fluid flow channels 117 water boils from around 0° C., so that the water 121 vaporizes readily at the normal operating temperatures of the hybrid solar energy converter 101.

The bubbles 122 of water vapor are less dense than the liquid water 121. Further, as explained above the upper fluid flow channels 117 are sloping along their lengths. Accordingly, as a result of this density difference the water vapor bubbles 122 travel upwards along the upper fluid flow channels 117 towards the upper side edge 104c of the heat transport element 104 and the surface of the water 121. When a bubble 122 of water vapor reaches the surface of the water 121 the vapor is released into the vacuum above the water 121 in the vapor manifold 111. Further, as a bubble 122 travels upwards along a fluid flow channel 117 the bubble 122 will act as a piston to drive the liquid water, and any other bubbles 122 above it, upwardly along the upper fluid flow channel 117. This pistonic driving may tend to accelerate the speed with which the vapor bubbles 122 move upward along the upper fluid flow channels 117. This pistonic driving may act to pump liquid water upwards along the upper fluid flow channels 117 to the ends of the upper fluid flow channels 117, where the liquid water will be ejected from the upper fluid flow channels 117 into the vapor manifold 111. In the illustrated second embodiment, where some of the inner surface of the upper sheet 114 is above the surface of the water 121, this pumping of liquid water upwards along the upper flow channels 117 ensures that the part of the inner surface of the upper sheet 114 above the surface of the water 121 is in contact with a flow of water so that it can be cooled.

The amount of the pistonic driving produced by the bubbles 122 will depend upon the relative sizes of the bubbles 122 compared to the cross-sectional areas of the upper fluid flow channels 117. The amount of pistonic driving produced by the bubbles 122 may be increased where the size of the bubbles is relatively large compared to the cross-sectional areas of the upper fluid flow channels 117. The pistonic driving produced by the bubbles 122 may be particularly effective in examples where the size of the bubbles 122 of water vapor is equal to, or only a little smaller than, the cross sectional areas of the upper fluid flow channels 117.

In practice the sizes of individual water vapor bubbles will vary. However, the likely average sizes of the bubbles and the likely variability in their sizes can be determined in any specific case, based on the operating parameters to be used in the hybrid solar energy converter.

The bursting of the bubbles of water vapor at the water surface and any pistonic pumping of liquid water out of the ends of the upper fluid flow channels 117 may generate droplets of liquid water, and may project at least some of these water droplets into the vacuum within the vapor manifold 111 above the water surface. As a result, the heat transfer mechanism may be a multi-phase system comprising liquid water, water vapor and droplets of liquid water, and not just a two-phase system comprising liquid water and water vapor only. The presence of such droplets of water in the vacuum, and any pumping of liquid water out of the ends of the upper fluid flow channels 117, may enhance the rate of vaporization by increasing the surface area of the water exposed to the vacuum.

Similarly to the first embodiment, the water vapor in the vacuum within the vapor manifold 111 travels at a very high speed through the vacuum along the vapor manifold 111, along the tube 119 and into the heat exchange assembly 106. The travel speed of the hot water vapor in the vacuum is very fast, approximating to the thermal speed of the water vapor molecules. Inside the heat exchange assembly 106 the water vapor condenses on a heat exchange surface of one of the primary and secondary heat exchangers 107 and 108. The condensed water flows back out of the heat exchange assembly 106 down the tube 119, along the bottom of the vapor manifold 111, and is returned back into the water 121 within the lower fluid flow channels 118. This generating of hot water vapor within the upper fluid flow channels 117 and the vapor manifold 111, and subsequent travel of hot water vapor from the vapor manifold 111 to the heat exchange assembly 106 where it condenses, followed by return of the condensed water, transfers heat energy from the heat transfer element 104 to the operating fluids in the heat exchange assembly 106.

Any liquid water ejected from the upper fluid flow channels 117 into the vapor manifold 111 which does not vaporize will also fall to the bottom of the vapor manifold 111, and is returned back into the water 121 within the lower fluid flow channels 118.

As is explained above, all of the upper and lower fluid flow channels 117 and 118 are interconnected by the fluid manifold 124 formed by the gap 123. Accordingly, it is not important which of the lower fluid flow channels 118 is entered by any liquid water returning from the vapor manifold 111.

As is clear from the description above, the vapor manifold 111 generally includes liquid water in addition to water vapor when the hybrid solar energy converter 101 is operating. However, as is also discussed above, if the level of the water in the heat transport element 104 is too high, so that the upper surface 122 of the water is too high within the vapor manifold 111, the efficiency of operation of the heat transport element 104 may be reduced. This reduction in efficiency of operation may occur because there is insufficient space within the vapor manifold 111 above the surface of the water for the movement and evaporation of the droplets of liquid water. This reduction in efficiency of operation may occur because the droplets of liquid water and waves and splashing upwardly of the liquid water surface may reduce the open, or water free, cross sectional area of the vapor manifold at some locations to a relatively small amount, or even to zero, momentarily closing the vapor manifold. This reduction in the open, or water free, cross sectional area of the vapor manifold may interfere with the movement of the water vapor in the vacuum within the vapor manifold 111.

The bubbles 122 of water vapor will tend to move upwardly through the liquid water in the upper fluid flow channel 117 because of the lower density of the water vapor compared to the liquid water 121, which will result in an upward buoyancy force on each bubble 122. Further, the movement of the bubbles 122 of water vapor will tend to drive the liquid water 121 in the upper fluid flow channel 117 upwardly, particularly in examples where pistonic driving takes place. As a result, the bubbles 122 of water vapor cause the water 121 in the upper and lower fluid flow channels 117 and 118 to circulate, with relatively hot liquid water and bubbles 122 of water vapor flowing upwards along the upper fluid flow channels 117, and relatively cool liquid water flowing downwards along the lower fluid flow channels 118. The upper and lower fluid flow channels 117 and 118 are interconnected by the vapor manifold 111 and the fluid manifold 124, as explained above. Accordingly, the relatively hot liquid water flowing upwards along the upper fluid flow channels is continuously replaced by relatively cool liquid water from the lower fluid flow channels 118. This circulation is driven primarily by the difference in density between the water vapor and the liquid water. However, this circulation may also be driven by convection as a result of the difference in density between the relatively hot liquid water in the upper fluid flow channels 117 and the relatively cool liquid water in the lower fluid flow channels 118, in a similar manner to a thermosiphon. Accordingly, the upper fluid flow channels 117 may be regarded as riser channels, while the lower fluid flow channels 118 may be regarded as sinker channels or return channels.

As the bubbles 122 of water vapor travel upwardly along the upper fluid flow channels 117 the pressure head acting on the bubbles 122 decreases, so that the bubbles 122 tend to expand. As a result, the tendency of the vapor bubbles 122 to collapse and implode is reduced by the effects of the expansion and decreasing pressure as the bubbles 122 move upwardly. When considering this point, it should be remembered that when the heat transport element 104 is operating the bubbles 122 will be forming within an established density driven circulation fluid flow and will move upwardly carried by this flow in addition to the bubbles movement due to their own buoyancy relative to the liquid water. Further, it is believed that expansion of the bubbles 122 as they move upwardly will further increase the speed of the density driven circulation flow by increasing the buoyancy of the expanding bubbles 122. In some examples expansion of the bubbles as they move upwardly may also increase the degree of pistonic driving.

This density driven circulation may form a highly effective heat transport mechanism because water has a relatively high enthalpy of vaporization, so that the movement of the bubbles 122 of water vapor may carry a large amount of heat energy, in addition to the heat energy carried by the movement of relatively hot water out of the upper fluid flow channels 117, and its replacement by cooler water. In arrangements where pistonic driving of the flow of the liquid water by the water vapor bubbles takes place the effectiveness of the heat transport mechanism may be further increased by the increase in the flow rate of the liquid water caused by the pistonic driving. This pistonic driving is a component of the overall density driving producing the density driven circulation. The pistonic driving is caused by the density difference between the liquid water and the bubbles of water vapor.

In general, the speed of the density driven circulation increases and the effectiveness of the heat transport mechanism increases as the temperature of the upper sheet 114 of the heat transport element 104 increases.

The density driven circulation of the water 121 within the fluid flow channels 117 and 118 is a vapor driven circulating or rolling flow.

The density driven circulation of the water 121 within the fluid flow channels 117 and 118 becomes particularly vigorous, and becomes particularly effective as a heat transport mechanism, when the temperature of the upper sheet 114 of the heat transport element 104 becomes sufficiently high that the water 121 within the fluid flow channels 117 and 118 enters a rolling boil state. The effectiveness of the heat transport mechanism significantly increases when rolling boiling of the water 121 commences. In general, when other parameters of the system remain constant, entry into the rolling boil state will take place when the temperature of the upper sheet 114 of the heat transport element 104 reaches a specific temperature.

In the illustrated example using water, the water 121 within fluid flow channels 117 and 118 may enter a rolling boil state at a temperature of about 40° C.

The arrangement of fluid flow channels 117 extending laterally across the heat transport element 104 may allow the vertical height of the liquid water in the heat transport element 104 to be reduced compared to embodiments in which the density driven flow extends along the length of a heat transport element, and so reduce the pressure head acting on the liquid water at the bottom of the heat transport element 104. In general, increased pressure reduces the tendency of liquids to vaporize and so increases the boiling point of liquids. Accordingly, reducing the pressure head acting on the liquid water at the bottom of the heat transport element 104 may increase the tendency of the liquid water 121 towards the lower ends of the upper fluid flow channels 117 to vaporize and produce bubbles 122, and so may improve the efficiency and effectiveness of the heat transport element 104.

In particular, the reduction of the pressure head acting on the liquid water at the bottom of the upper fluid flow channels 117 may reduce any temperature differential along the lengths of the upper fluid flow channels between their the top and bottom ends by reducing any difference in the tendency of the liquid water to vaporize due to differences in pressure. This may reduce temperature differentials between the different points on the heat transport element 104 and may assist in reducing or avoiding the formation of hot spots in the photovoltaic elements 105.

In general the forming of hot spots in the photovoltaic elements 105 is undesirable because these may lead to a reduction in the efficiency of electrical energy generation in the photovoltaic elements 105, which reduction in efficiency may be permanent.

The arrangement of the upper fluid flow channels 117 extending laterally across the heat transport element 104 and interconnected by a vapor manifold 111 extending longitudinally along the heat transport element 104 may allow a very rapid flow of heat energy along the heat transport element 104 away from any upper fluid flow channel 117 having a higher temperature. This may reduce temperature differentials between the different points on the heat transport element 104 and may reduce, or avoid, the formation of hot spots in the photovoltaic elements 105.

The provision of the two separate heat transport mechanisms of the movement of water vapor along the vapor manifold 111 and the density driven flow of liquid water and water vapor along each of the upper fluid flow channels 117, respectively acting longitudinally and transverse the length of the heat transport element 104, may tend to equalize the temperature across the entire upper surface of the heat transport element, and thus tend to equalize the temperature across the photovoltaic elements 105 and reduce, or avoid, the formation of hot spots.

The movement of water vapor along the vapor manifold 111 provides a very rapid heat transport mechanism that tends, by the vaporization and condensation of water, to move heat energy from relatively hot locations to relatively cold locations. As a result, the movement of water vapor along the vapor manifold 111 may tend to equalize the temperature of the liquid water surface at different positions along the heat transfer element 104, in addition to transporting heat energy from the heat transport element 104, and specifically from the upper surface 104a of the heat transport element 104, to the heat exchange assembly 106. This temperature equalization may have the effect of removing more heat energy from hotter parts of the upper surface 104a of the heat transport element 104, and so tending to equalize the temperature across the upper surface 104a. It is clear that such isothermal cooling will tend to reduce, or avoid, the formation of hot spots, for example in any photovoltaic element attached to the upper surface 104a.

Figure 16:
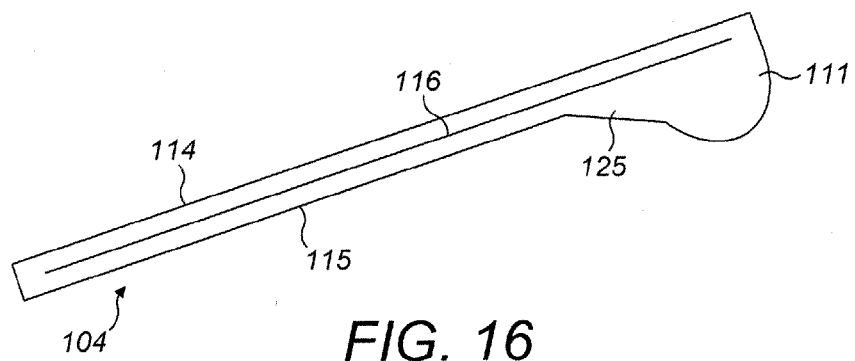
FIG. 16 is a transverse cross section along the line C-C of the solar energy collector assembly of FIG. 11.

The lower sheet 115 of the heat transport element 104 has a plurality of hollow ridges 125 extending between the flat part of the lower surface 104b and the semi-cylindrical surface of the outwardly projecting section 110. Each hollow ridge 125 has a 'V' profile, and the hollow ridges 125 are located spaced apart at regular intervals along the length of the heat transport element 104. FIG. 16 shows a transverse cross section of the heat transport element 104 taken along the line C-C in FIG. 11. The line C-C of FIG. 16 is parallel to the line A-A of FIG. 12, but passes through one of the hollow ridges 125. The hollow ridges 125 act as supports for the outwardly projecting section 110, acting as buttresses and helping to keep the curved part of the lower sheet 115 forming the outwardly projecting section 110 fixed relative to the flat part of the lower metal sheet 115 and the other parts of the heat transport element 104.

The hollow ridges 125 also act as drains to return liquid water from the vapor manifold 111 into the lower fluid flow channels 118, as will be explained in more detail below.

As explained above, the vapor manifold 111 is semi-cylindrical, being defined by the semi-cylindrical outwardly projecting section 110 formed by a curved part of the lower sheet 115. Further, as explained above, the heat transport element 104 is transversely sloping so that the side edge 104c of the heat transport element 104 bearing the outwardly projecting section 110 is higher than the other side edge 104d of the heat transport element 104. As a result, depending upon the transverse inclination angle of the heat transport element 104 there may, or may not, be parts of the vapor manifold 111 which are located below the ends of the lower fluid flow channels 118 where the lower fluid flow channels 118 connect to the vapor manifold 111.

Figure 17A:
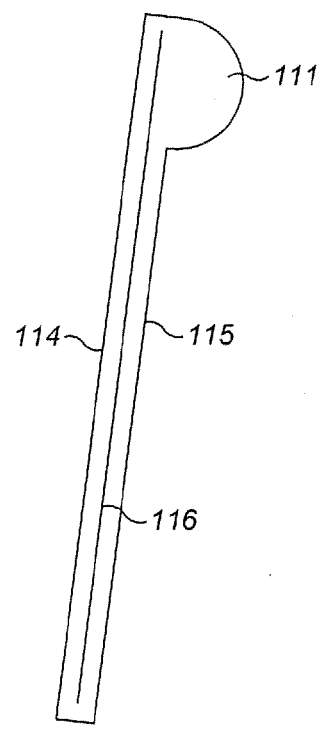
FIG. 17A is an explanatory diagram of the solar energy collector assembly of FIG. 11.
Figure 17B:
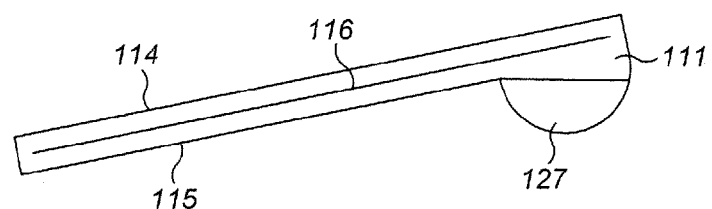
FIG. 17B is an explanatory diagram of the solar energy collector assembly of FIG. 11.

FIGS. 17A and 17B are explanatory diagrams, each showing a transverse cross sectional view of the heat transport element 104 corresponding to the view shown in FIG. 12. FIG. 17A shows the heat transport element 104 inclined at a relatively large angle to the horizontal, while FIG. 17B shows the heat transport element 104 inclined at a relatively small angle to the horizontal.

When the heat transport element is inclined at a relatively small angle to the horizontal, as shown in FIG. 17A, the lower fluid flow channels 118 connect to the vapor manifold 111 at the lowest point of the semi-cylindrical outwardly projecting section 110 of the lower sheet 115 defining the vapor manifold 111. In this position all liquid water within the vapor manifold 111 will drain directly into the lower fluid flow channels 118. In contrast, when the heat transport element 104 is inclined at a relatively large angle to the horizontal, as shown in FIG. 17B, the part of the semi-cylindrical outwardly projecting section 110 of the lower sheet 115 defining the vapor manifold 111 is located below the point at which the lower fluid flow channels 118 connect to the vapor manifold. In this position, in the absence of the hollow ridges 125, some liquid water within the vapor manifold 111, specifically liquid water below the horizontal line 126, could be retained within the vapor manifold 111 and not drain into the lower fluid flow channels 118.

The hollow ridges 125 form a drain path for liquid water in the vapor manifold 111 to return to the lower fluid flow channels 118 and so prevent the retention of a reservoir of liquid water within the vapor manifold 111 which might otherwise occur.

As discussed above, the heat transport assembly 104 can operate with liquid water within the vapor manifold 111. However, in the absence of the hollow ridges 125 the existence and size of any reservoir of liquid water retained in the vapor manifold 111 will vary depending on the angle of inclination to the horizontal of the heat transport element 104, and the resulting changes in the liquid water level in the fluid flow channels 117 and 118 at different angles of inclination may adversely affect the operation of the heat transport element 104 at some angles of inclination and so limit the range of angles of inclination at which the heat transport element 104 can be used.

Accordingly, the hollow ridges 125 may extend the range of angles of inclination at which the heat transport element 104 can be used.

Depending upon the geometry of the different parts of the heat transport element 104 in any specific design, even when the hollow ridges 125 are used there may still be a minimum angle of inclination at which the heat transport element 104 can operate without the retention of liquid water in the vapor manifold 111 having adverse effects on operation of the heat transport element 104.

In the illustrated example of the second embodiment the hollow ridges 125 act as supports for the outwardly projecting section 110 and also act as drains to return liquid water from the vapor manifold 111 into the lower fluid flow channels 118. In some examples these functions may be carried out by separate dedicated structures.

The corrugated profile of the central sheet 116 and the bonding of the first and second surfaces 116a and 116b of the central sheet 116 to the upper sheet 114 and the lower sheet 115 so that the linking surfaces 116c and 116d of the central sheet 116 interconnect the upper and lower sheets 114 and 115 increases the strength and rigidity of the heat transport element 104. This may make the heat transport element 104 a more rigid structure. This may tend to reduce the amount of flexing of the heat transport element 104 in use. This may prevent damage to the photovoltaic elements 105 by reducing the amount of mechanical stress applied to the photovoltaic elements 105. This may allow the upper, lower, and/or central metal sheets 114, 115, 116, to be thinner, which may reduce weight and costs. This may allow the upper metal sheet 114 to be thinner, which may improve the transfer of heat from the photovoltaic elements 105 into the liquid water within the upper fluid flow channels 117.

The heat transport element 104 is a substantially rigid structure. This may minimize changes in the level of the upper surface 132 of the water 121 due to flexing of the components of the heat transport element 104, such as the upper and lower sheets 114 and 115. Such changes in the level of the upper surface 132 of the water 121 may affect the efficiency of the cooling of the photovoltaic elements 105.

As is explained above, the interior of the heat transport element 104 is evacuated, and the heat transport element 104 is located within an evacuated tube 103. Usually the heat transport element 104 and the evacuated tube 103 are evacuated to the same pressure. In the illustrated example of the second embodiment described above this pressure may be $10^{-3}$ mbar.

When the water within the heat transport element 104 is heated the proportion of the water in a vapor phase will increase and the proportion in a liquid phase will decrease. As a result the pressure within the heat transport element 104 will increase, producing a pressure differential between the interior and exterior of the heat transport element 104. This pressure differential may cause the upper and lower metal sheets 114 and 115 to 'balloon', or bend outwards. The interconnection of the upper and lower metal sheets 114 and 115 by the linking surfaces 116c and 116d of the central metal sheet 116 may resist such ballooning of the upper and lower metal sheets 114 and 115 and reduce or prevent ballooning. Arranging for the linking surfaces 116c and 116d of the central metal sheet 116 to be straight may increase the resistance to ballooning. Reducing or preventing ballooning may prevent damage to the photovoltaic elements 105 by reducing the amount of mechanical stress applied to the photovoltaic elements 105. This may allow the upper metal sheet 114 to be thinner, which may reduce weight and costs and/or may improve the transfer of heat from the photovoltaic elements 105 into the liquid water within the upper fluid flow channels 117.

The above description of the operation of the heat transfer element 104 according to the second embodiment describes the transfer of heat energy from the photovoltaic elements 105 through the upper metal sheet 114 and into the water within the upper fluid flow channels 117. In addition, in the regions of the upper metal sheet 114 bonded to the first surfaces 116a, some heat energy will pass through the upper metal sheet 114 and the central metal sheet 116 into the water within the lower fluid flow channels 118. Although this transfer of heat energy will cool the photovoltaic elements 105, the heating of the water in the lower fluid flow channels 118 is generally undesirable because it will tend to counteract and slow the density driven circulation of water produced by the heating of the water in the upper fluid flow channels 117 described above. Accordingly, it is preferred for the sizes of the first surfaces 116a of the central metal sheet 116 in contact with the upper metal sheet 114 to be as small as possible, subject to the contact area between the first surfaces 116a and the upper metal sheet 114 being sufficiently large to form a reliable bond of the required strength.

Unlike the first embodiment, it is not necessary for the heat transport element 104 according to the second embodiment to be inclined to the horizontal along its longitudinal axis. In other words, unlike the first embodiment, it is not necessary for the end of the heat transport element 104 adjacent the heat exchange assembly 106 to be higher than the end of the heat transport element 104 remote from the heat exchange assembly 106.

In the illustrated second embodiment the heat transport element 104 is arranged to be horizontal along its longitudinal axis. That is, the end of the heat transport element 104 adjacent the heat exchange assembly 106 should be at the same height as the end of the heat transport element 104 remote from the heat exchange assembly 106. However, in practice some deviation from the horizontal may be tolerated without significant impact on the operation of the heat transport element 104. Such deviation from the horizontal will result in differences in the level of the liquid water surface relative to the structure of the heat transport element 104 at different positions along the length of the heat transport element 104. As is explained above, the level of the liquid water surface may be varied. Accordingly, the minor differences in level caused by small deviations from the horizontal may be accommodated.

In some examples the hybrid solar energy converter 101 may be arranged so that the tube 119 and the internal passages of the heat exchanger assembly 106 are inclined at an angle to the horizontal downwardly from the heat exchanger assembly 106 towards the heat transport element 104 in order to assist the return flow of condensed liquid water from the primary and secondary heat exchangers 108 and 109 to the vapor manifold 111 of the heat transport element 104.

Figure 18A:
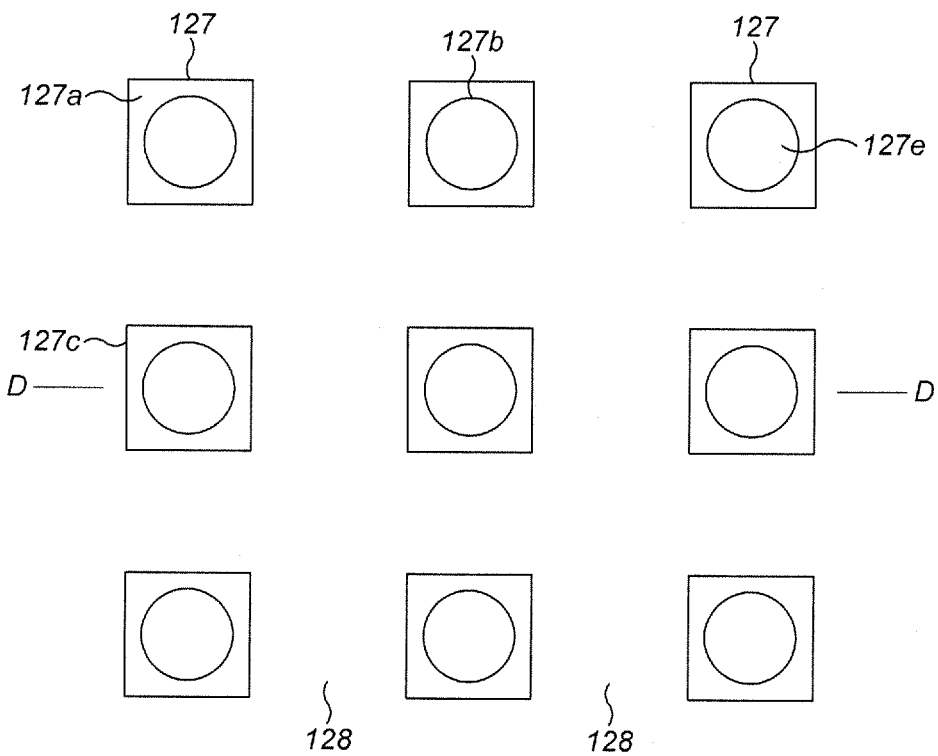
FIG. 18A is a detailed plan view of a part of the solar energy collector assembly of FIG. 11.
Figure 18B:
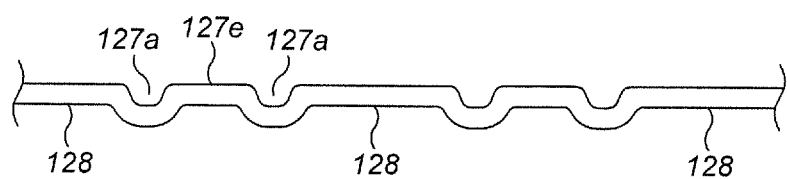
FIG. 18B is a cross section along the line D-D of a the part of the solar energy collector assembly of FIG. 11.

In the illustrated example, each of the upper and lower sheets 114 and 115 has a dimpled profile. This dimpled profile is shown in more detail in FIGS. 18A and 18B. FIG. 18A shows a plan view from above of a part of the upper sheet 114. FIG. 18B shows a cross section through the upper sheet 114 along the line D-D in FIG. 18A.

As is shown in FIG. 18A, a plurality of dimples 127 are formed in the flat upper surface 104a of the heat transport element 104 in the upper sheet 114. The dimples 127 are formed in straight rows and columns to form a regular two dimensional square array, and are spaced apart leaving a flat strip 128 between each row of dimples 127.

Each dimple 127 comprises a looped recess 127a having a circular inner perimeter 127b and a square outer perimeter 127c. The square outer perimeter 127c has rounded off corners 127d. Within the circular inner perimeter 127b a circular region 127e is raised relative to the looped recess 127. The circular region 127e is at the same level as the surface 104a of the flat strips of the upper sheet 115 outside the dimple 127.

The flat strips 128 run transversely across the upper sheet 114 and have the same width as the width of the first coplanar surfaces 116a of the central sheet 116. The flat strips 128 provide flat areas for bonding with the first surfaces 116a of the central sheet 116. The flat strips 128 may allow reliable and strong bonds to be made between the first surfaces 116a and the upper sheet 114. The flat strips 128 may allow a good seal to be formed between adjacent upper fluid flow passages 117.

A plurality of dimples 129 are formed in the lower sheet 115. The dimples 129 are formed in straight rows and columns to form a regular two dimensional square array, and are spaced apart leaving a flat strip 130 between each row of dimples 129. The dimples 129 in the lower sheet 115 are the same as the dimples 127 in the upper sheet 114. The flat strips 128 run transversely across the upper metal sheet 114 and have the same width as the width of the first and second coplanar surfaces 116a and 116b. The flat strips 130 provide flat areas for bonding with the second surfaces 116b of the central sheet 116. The flat strips 130 may allow reliable and strong bonds to be made between the second surfaces 116b and the lower sheet 115.

In the illustrated example of the second embodiment of the invention both the dimples 127 in the upper sheet 114 and the dimples 130 in the lower sheet 115 are formed by downward recesses. Accordingly, the dimples 127 in the upper sheet 114 have recesses extending into the heat transport element 104, while the dimples 130 in the lower sheet 115 have recesses extending out of the heat transport element 104. In other examples the dimples 127 and 130 may be formed by recesses extending upwardly, or by recesses extending in opposite directions.

The array of dimples 130 on the lower metal sheet 115 extends across the flat part of the lower sheet 115, but does not extend into the semi-cylindrical surface of the outwardly projecting section 110. Further, the array of dimples 130 on the lower sheet 115 has dimples omitted from the array at the locations of the hollow ridges 125.

The dimples 127 and 130 may increase the rigidity of the upper and lower sheets 114 and 115. This may tend to reduce the amount of flexing of the heat transport element 104 in use. This may prevent damage to the photovoltaic elements 105 by reducing the amount of mechanical stress applied to the photovoltaic elements 105. This may allow the upper, lower, and/or central sheets 114, 115, 116, to be thinner, which may reduce weight and costs. This may allow the upper sheet 114 to be thinner, which may improve the transfer of heat from the photovoltaic elements 105 into the liquid water within the upper fluid flow channels 117.

The surfaces of the dimples 127 may provide additional nucleation sites for the formation of water vapor bubbles 122, which may improve efficiency.

In examples where adhesive is used to attach the photovoltaic elements 105 to the heat transport element 104 the dimples 127 on the flat upper surface 104a of the heat transport element 104 may provide reservoirs for the adhesive. This may allow more secure attachment of the photovoltaic elements 105. This may allow a thinner layer of adhesive to be used, which may improve the transfer of heat from the photovoltaic elements 105 into the liquid water within the upper fluid flow channels 117.

Figure 19:
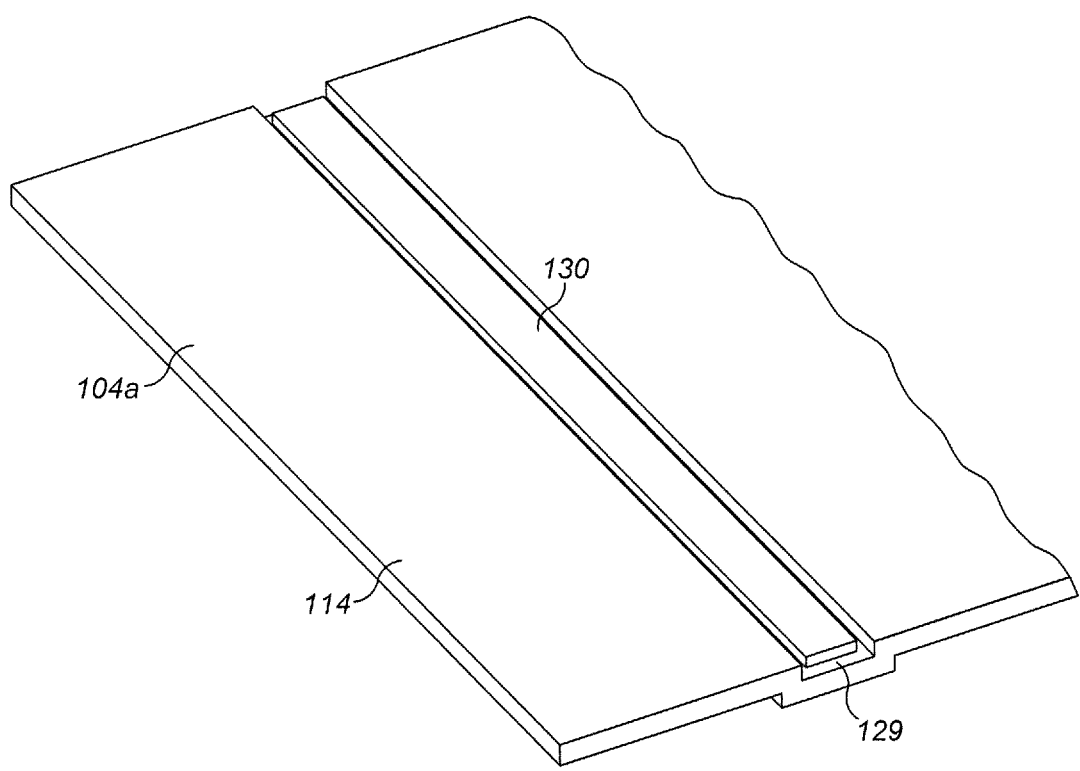
FIG. 19 is a diagram showing a part of the solar energy collector assembly of FIG. 11 with the photovoltaic elements removed.

As discussed above the heat transport element 104 has a flat upper surface 104a formed by an upper sheet 114 with a dimpled profile. In addition the upper sheet 114 is has two longitudinal recesses 129 running across in its upper surface 104a which form two parallel troughs running along the upper surface 104a of the heat transport element 104. FIG. 19 shows one of these recesses 129. Electrically conductive ribbons or wires 130 run along the longitudinal recesses 129 between the heat transport element 104 and the photovoltaic elements 105. The wires 130 are electrically connected to the photovoltaic elements 105 and to the conductors 21 which pass through the cap 12 to provide a conductive path to carry the electrical power generated by the photovoltaic elements 105 out of the sealed transparent tube 103. This electrical power may be supplied to an inverter for voltage conversion and/or for conversion to alternating current for supply to a domestic or mains electrical system.

In examples where adhesive is used to attach the photovoltaic elements 105 to the heat transport element 104, an electrically insulating adhesive can be used to electrically insulate the electrically conductive ribbons or wires 130 from the photovoltaic elements 105 and from the upper surface 104a of the heat transport element 104. The electrically insulating adhesive can also be used to electrically insulate the photovoltaic elements 105 from the upper surface 104a of the heat transport element 104.

In the second embodiment the longitudinal recesses 129 run perpendicularly to the fluid flow channels 117 and 118. Accordingly, each of the first surfaces 116a of the central metal sheet 116 has two recesses to receive the longitudinal recesses 129.

In the illustrated example of the second embodiment each dimple 127 comprises a looped recess with a circular inner perimeter 127b and a square outer perimeter 127c, with the circular region 127e at the same level as the surface 104a of the flat strips of the upper metal sheet 115 outside the dimple 127. In some examples the circular region 127e may not be at the same level as the surface 104a of the flat strips of the upper metal sheet 115 outside the dimple 127. In other examples different dimple shapes and/or profiles may be used. In some examples the perimeters may have different shapes. In some examples the circular region 127e may not be at the same level as the surface 104a of the flat strips of the upper metal sheet 115 outside the dimple 127. In some examples the dimples may simply comprise a recessed region, rather than a recessed outer region surrounding a relatively raised inner region.

In the illustrated example of the second embodiment 0.2 mm thick tin coated mild steel sheets are used to form the different sheets of the heat transport element. In alternative examples other thicknesses may be used, in particular 0.1 mm thick tin coated mild steel sheets may be used. The use of a thinner upper metal sheet may improve the rate of heat energy transfer from the photovoltaic elements to the water inside the upper fluid flow channels. In other examples the different sheets may have different thicknesses.

In the illustrated example of the second embodiment the spacing between the upper sheet 114 and the parallel lower sheet 115 is 1.8 mm at the locations of the longitudinal recesses 129. Accordingly, the thickness of the fluid flow channels 117 and 118 at the locations of the longitudinal recesses 129 is 1.6 mm, since the thickness of the central sheet is 0.2 mm.

The use of mild steel may avoid or reduce problems produced by differential thermal expansion of the silicon semiconductor photovoltaic elements 105 and the heat transport element 104 because the coefficients of thermal expansion of silicon and mild steel are similar.

The sheets used to form the heat transport element may be shaped by pressing.

In other examples different materials may be used, in particular sheets of other metals or metal alloys, such as copper or brass may be used. In other examples the upper, lower and/or partition sheets may be formed from materials which are not metals. In other examples there may be openings in the upper sheet allowing the water inside the upper fluid flow channels to directly contact the back surfaces of the photovoltaic elements to maximize heat transfer. In such examples the thickness or material used to form the upper sheet could be selected without having to take thermal conductivity into account.

In the second embodiment of the invention the roughening of the surfaces of the upper sheet 114 produced by the tin coating may provide nucleation sites, increasing the tendency of the liquid water 121 to vaporize and form bubbles 122 of water vapor. In the second embodiment of the invention the roughening of the surfaces of the central sheet 116 produced by the tin coating may provide nucleation sites, increasing the tendency of the liquid water 121 to vaporize and form bubbles 122 of water vapor.

In some examples other coatings may be added to the surfaces of the upper sheet 114 in order to promote or increase nucleation and formation of bubbles of water vapor. In some examples these coatings may be of metals, or plastics. In some examples these coatings may be of PTFE.

In the illustrated example of the second embodiment the different sheets are soldered together.

In alternative embodiments different bonding techniques may be used. In some examples the different sheets may be bonded by techniques including spot welding, roller welding or adhesive.

In the illustrated example of the second embodiment inner faces of the upper and lower sheets 114 and 115, and both faces of the central metal sheet 116, are coated with a solder layer. In the illustrated example the solder layers are 2 to 6 microns thick. Other examples may have different thicknesses.

The edges of the upper and lower sheets 114 and 115 are then soldered together to form a gas tight seal between them, and to form a gas tight seal between the upper and lower sheets 114 and 115 and the tube 119. As is explained above, the central metal sheet 116 is not located between the upper and lower metal sheets 114 and 115 at their edges.

The heat transport element 104 is then heated in an oven to a sufficiently high temperature to reflow the solder layers on the upper, lower and central sheets 114, 115, 116, and is simultaneously evacuated.

This manufacturing procedure may ensure good solder bonding between the central sheet 116 and the upper and lower sheets 114 and 115. This manufacturing procedure may allow a better level of vacuum to be achieved within the heat transport element 104 by evacuating the heat transport element 104 at a high temperature when out-gassing by the metal sheets and solder is taking place.

The solder may microscopically roughen the surfaces of the upper and central sheets 114 and 116. This may provide nucleation sites, increasing the tendency of the liquid water 121 to vaporize and form bubbles 122 of water vapor.

In other examples, a solder layer is formed on the central sheet 116 only on the parts of the central metal sheet which contact the upper or lower sheets 114 and 115. As can be understood from a comparison of FIGS. 13 and 14 this will be the contact faces of the first and second surfaces 116a and 116b. Similarly, in some examples a solder layer is formed on the surfaces of the upper sheet 114 and the lower sheet 115 only on the parts of the surfaces which will contact one of the other sheets. Reducing the amount of solder used may reduce costs.

In one example the upper sheet 114 only is coated in solder across its entire surface, while the central sheet and lower sheet 116 and 115 are coated in solder only on the parts of the surfaces which will contact one of the other sheets. This may allow the solder layer to provide nucleation sites on the surface of the upper sheet 114 forming parts of the upper fluid flow channels, while reducing the total amount of solder used.

As explained above, in the illustrated example of the second embodiment the flow of water vapor and liquid water through the heat transport element 104 tends to keep the cooled upper surface of the heat transport element 104 at a uniform operating temperature during operation. That is, the cooled upper surface of the heat transport element 104 tends to be kept isothermal. The isothermal nature of the cooled upper surface of the heat transport element 104 tends to give rise to isothermal cooling of the photovoltaic elements 105, where hotter parts of the photovoltaic elements 105 tend to be preferentially cooled so that the photovoltaic elements 105 themselves tend to become isothermal.

Such isothermal cooling provides further advantages in addition to those provided by cooling.

Isothermal cooling may provide the advantage that the appearance of hot spots or regions in the photovoltaic elements 105 produced by heating by incident solar radiation can be reduced or eliminated. Such hot spots or regions can reduce the efficiency of the photovoltaic elements 105.

Isothermal cooling may simplify the control and wiring arrangements of the photovoltaic elements 105 by reducing or eliminating any requirement for compensation for differences in the performance of the different parts of the photovoltaic elements 105 that are at different temperatures.

Isothermal cooling tends to reduce, or prevent, the formation of hot spots or regions in the photovoltaic elements 105. As is explained above, this may allow the efficiency of the photovoltaic elements 105 to be improved at a specific temperature. Further, this may reduce the amount of degradation of the photovoltaic elements 105 caused by higher temperatures.

Still further, this may allow the photovoltaic elements 105 to operate with a given degree of efficiency at a higher temperature than would otherwise be the case. This may allow the solar energy collector assembly 102 including the photovoltaic elements 105 to be operated at a higher temperature without reducing the efficiency with which the photovoltaic elements 105 produce electrical energy.

One example of this effect of isothermal cooling is that the general figure quoted above for silicon photovoltaic elements that the efficiency of electrical energy generation generally drops by about 0.35% to 0.5% for each degree centigrade of temperature increase above 25° C. may not apply to silicon photovoltaic elements that are isothermally cooled. Such isothermally cooled silicon photovoltaic elements having hotspots eliminated or reduced may have a higher threshold temperature at which the efficiency of electrical energy generation begins to drop and/or may have a reduced rate of reduction in efficiency for each degree centigrade of temperature increase above the threshold temperature. Further, the temperature at which there is a risk of permanent degradation of the silicon photovoltaic elements may also be increased for isothermally cooled silicon photovoltaic elements. Similar effects may be found in photovoltaic elements formed of other semiconductor materials.

In some examples, one or more layers of heat conductive material may be located between the upper sheet 114 and the photovoltaic elements 105. Such layers of heat conductive material may increase the rate of heat transfer between the photovoltaic elements 105 and the upper sheet 114, and thus the rate of heat transfer between the photovoltaic elements 105 and the liquid within the upper fluid flow channels 117. Such layers of heat conductive material may also increase the rate of heat transfer laterally across the photovoltaic elements 105.

Accordingly, providing a layer of heat conductive material may increase the degree of isothermal cooling and further tend to reduce, or eliminate, the formation of hot spots or regions in the photovoltaic elements 105.

Heat Exchange Assembly

The heat exchange assembly 106 of the second embodiment may be essentially the same as the heat exchange assembly 6 of the first embodiment. As explained above, in the second embodiment the heat exchange assembly 106 includes a primary heat exchanger 107 and a secondary heat exchanger 108 separated by a heat transfer control valve 109. These are similar to, and operate similarly to, the heat exchange assembly 6 including a primary heat exchanger 7 and a secondary heat exchanger 8 separated by a heat transfer control valve 9 according to the first embodiment.

In the illustrated example of the second embodiment the trigger temperature of the heat transfer control valve 109 is predetermined. In some examples the trigger temperature may be settable in use, or on installation or manufacture of the hybrid solar energy converter 101. In some examples the trigger temperature may be settable to different values depending on the intended maximum water temperature of the water to be heated. In particular, in some examples the trigger temperature may be settable to 65° C. when the hybrid solar energy converter is to be used to heat water for a domestic hot water system and may be settable to 135° C. when the hybrid solar energy converter is to be used to heat water for an industrial hot water system.

In some examples the trigger temperature of the heat transfer control valve may be selected to maximize the generation of electrical energy by the photovoltaic elements 105. In some examples the trigger temperature value may be selected to increase the amount of heat energy transferred to the first operating fluid. In some examples the trigger temperature may be selected to optimize the overall production of energy, taking into account both the amount of electrical energy produced by the photovoltaic elements 105 and the amount of heat energy transferred to the first operating fluid. In some examples the optimizing may maximize the total production of energy. In some examples the optimum overall production of energy may take into account the relative demand for, or value of, the different types of energy, rather than simply maximizing the total amount of energy produced.

As explained above, the isothermal cooling tends to reduce, or prevent, the formation of hot spots or regions in the photovoltaic elements 105. This may allow the solar energy collector assembly 102 including the photovoltaic elements 105 to be operated at a higher temperature without reducing the efficiency with which the photovoltaic elements 105 produce electrical energy. This may allow the temperature of the collector assembly to be increased to produce more useable heat energy without the increase in temperature reducing the efficiency with which the photovoltaic elements 105 produce electrical energy. This may allow the trigger temperature to be increased.

In some examples the trigger temperature may be set to different temperatures during use of the hybrid solar energy converter 101. This may allow the temperature of the collector assembly to be controlled to produce different amounts of useable heat energy or electricity depending upon which type of energy is most in demand at a specific time.

For example, when hot water is more in demand than electricity the valve 109 may be closed to pass hot water vapor from the heat transport element 104 only to the primary heat exchanger 107 to maximize the amount of heat applied to the water acting as the first operating fluid regardless of any temporary reduction in efficiency of the photovoltaic elements 105 as a result of any resulting increase in temperature of the collector assembly. Further, when hot water is less in demand than electricity, the valve 109 may be opened in order to pass hot water vapor from the heat transport element 104 to both of the primary and secondary heat exchangers 107 and 108 in order to cool the photovoltaic elements 105 as much as possible and maximize the efficiency of electricity generation regardless of the effects on the temperature of the water acting as the first operating fluid.

In the illustrated example of the first embodiment the temperature of the solar energy collector assembly 102, and thus the temperature of the photovoltaic elements 105, is controlled by operating the heat transfer control valve 109 to selectively enable or disable the transfer of heat energy from the solar energy collector assembly 102 to the secondary heat exchanger 108.

In other examples other control methods can be used additionally or alternatively to control the temperature of the solar energy collector assembly 102. In some examples the temperature of the solar energy collector assembly 102 may be controlled by changing the rate of removal of heat energy from the solar energy collector assembly 102.

In some examples the rate of removal of heat energy from the solar energy collector assembly 102 can be controlled by altering the flow rate of the first operating fluid passing through the primary heat exchanger 107. In some examples the rate of removal of heat energy from the solar energy collector assembly 102 can be controlled by altering the surface area over which the first operating fluid is in contact with the primary heat exchanger 107, for example by selectively opening or closing fluid flow passages of the first operating fluid within the primary heat exchanger 102.

In some examples the rate of removal of heat energy from the solar energy collector assembly 102 can be controlled by altering the vacuum pressure within the tube 103. This may change the rate of convective heat loss from the solar energy collector assembly 102 to the tube 103. In general, heat transferred to the tube 103 will be rapidly lost to the outside environment by convection and/or conduction.

In some examples the rate of removal of heat energy from the solar energy collector assembly 102 can be controlled by altering the vacuum pressure within the heat transport element 104. In general, the tendency of the liquid water within the upper fluid flow channel 117 to vaporize and form bubbles of vapor 122 will increase as the vacuum pressure is reduced, and the tendency of the liquid water within the upper fluid flow channel 117 to vaporize and form bubbles of vapor 122 will decrease as the vacuum pressure is increased. As is explained above, the density driven circulation of water around the upper and lower fluid flow channels 117 and 118 and the transport of heat energy along the vapor manifold 111 and the tube 119 are both driven by water vapor. Accordingly, altering the tendency of the liquid water to vaporize by altering the vacuum pressure may allow the rate of removal of heat energy from the solar energy collector assembly 102, and the rate of removal of heat energy from the photovoltaic elements 105 to be controlled, and so allow the temperature of the solar energy collector assembly 102 and photovoltaic elements 105 to be controlled.

Further, the temperature at which rolling boiling of the water 121 within the upper fluid flow channel 117 commences will tend to increase as the vacuum pressure is increased, and will tend to decrease as the vacuum pressure is decreased. Accordingly, in examples where the vacuum pressure within the heat transport element 104 is altered the temperature at which the water 121 within the upper fluid flow channel 117 commences rolling boiling can be changed.

As is explained above, the density driven circulation of water around the upper and lower fluid flow channels 117 and 118 becomes particularly vigorous, and becomes particularly effective as a heat transport mechanism, when the water 121 within the upper fluid flow channel 117 enters a rolling boil state. Accordingly, altering the temperature at which the water 121 within the upper fluid flow channel 117 commences rolling boiling by altering the vacuum pressure may allow the rate of removal of heat energy from the solar energy collector assembly 102 and photovoltaic elements 105 to be controlled, and so allow the temperature of the solar energy collector assembly 102 and photovoltaic elements 105 to be controlled.

In some examples the temperature of the solar energy collector assembly 102 may be controlled by changing the amount of solar energy incident on the solar energy collector assembly 102, and so changing the rate of absorption of heat energy by the solar energy collector assembly 102.

In some examples the amount of incident solar energy may be controlled by changing the orientation of the solar energy collector assembly relative to the direction of the incident solar energy. This can be carried out using a drive mechanism able to rotate the solar energy collector assembly about one or more axes.

In some examples the amount of incident solar energy may be controlled using adjustable light intercepting or blocking mechanisms in the path of the incident solar energy. In some examples variable filters, shutters, stops, or the like may be used. In some examples these adjustable light intercepting or blocking mechanisms may comprise physical devices. In some examples these adjustable light intercepting or blocking mechanisms may comprise devices having electronically controlled optical characteristics, such as liquid crystals.

In examples where the temperature of the solar energy collector assembly and/or the photovoltaic elements are to be controlled, a temperature sensor and a temperature controller may be provided, together with a temperature control mechanism arranged to carry out one, some, or all, of the methods of controlling temperature described above.

The temperature sensor is arranged to measure the temperature of the solar energy collector assembly and provide this temperature value to the temperature controller. The temperature controller can then operate the temperature control mechanism in a suitable manner to control the temperature of the solar energy collector assembly to the desired value.

Examples where the temperature of the photovoltaic elements is to be controlled a temperature sensor arranged to measure the temperature of a photovoltaic element or elements and provide this temperature value to the temperature controller may be provided. This may be additional to, or instead of, the temperature sensor arranged to measure the temperature of the solar energy collector assembly. The temperature controller can then operate the temperature control mechanism in a suitable manner to control the temperature of the photovoltaic element or elements to the desired value.

In some examples the temperature sensor can be provided on the upper surface of the solar energy collector assembly. In some examples the temperature sensor can be formed on the same semiconductor wafer as a photovoltaic element.

Conveniently, the temperature controller may be a suitably programmed general purpose computer.

The illustrated second embodiment is a hybrid solar energy converter comprising photovoltaic elements and arranged to convert incident solar radiation into outputs of both electrical energy and hot water. In other examples the photovoltaic elements may be omitted to provide a solar energy converter arranged to convert incident solar radiation into an output of hot water.

Third Embodiment

Figure 20:
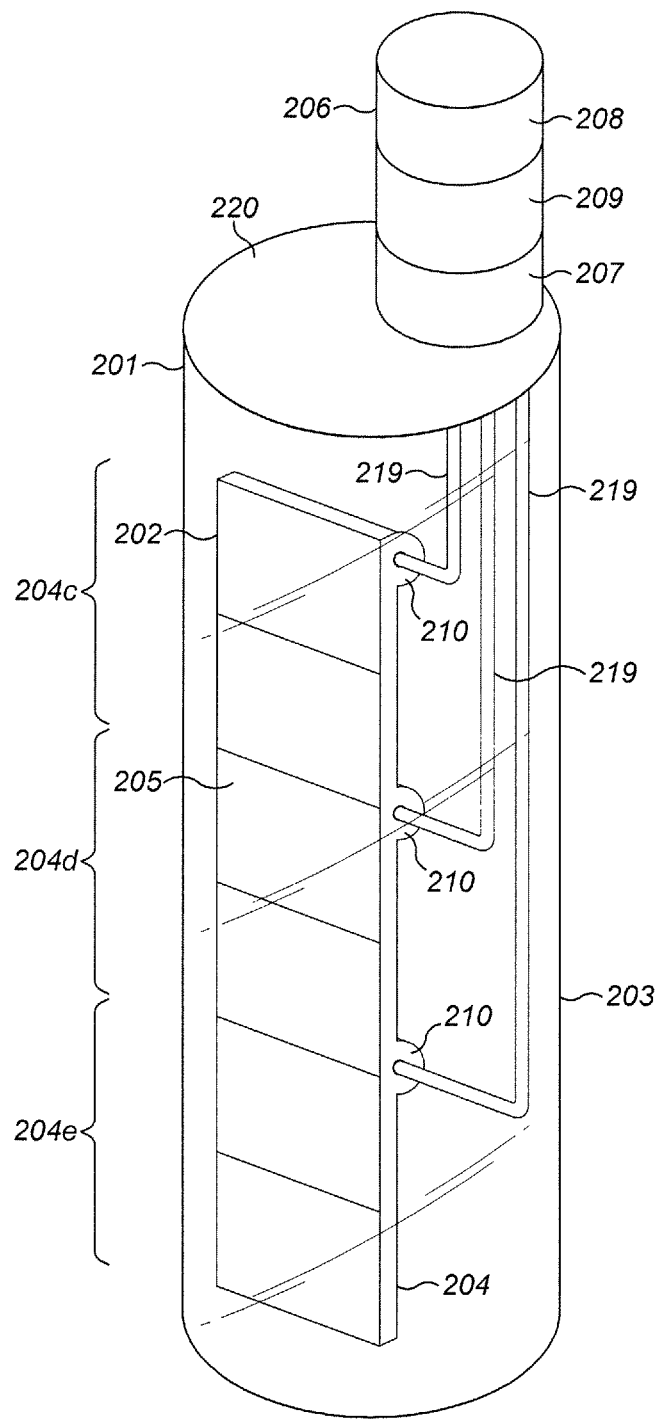
FIG. 20 is a diagram of a third embodiment of a hybrid solar energy converter according to the invention.

Apparatus according to a third embodiment of the present invention is illustrated in FIG. 20. FIG. 20 shows a general exterior view of a third embodiment of a hybrid solar energy converter 201 according to the present invention.

Overview

In the third embodiment, the hybrid solar energy converter 201 includes a solar energy collector assembly 202 housed within a sealed transparent tube 203. The solar energy collector assembly 202 includes a heat transport element 204 and an array of photovoltaic elements 205 mounted on an front surface of the heat transport element 204, the front surface being the surface exposed to incident solar radiation in use. The hybrid solar energy converter 201 also includes a heat exchange assembly 206 at one end of the transparent tube 203. One end of the solar energy collector assembly 202 is connected to the heat exchange assembly 206. Similarly to the first and second embodiments, in different examples the photovoltaic elements 205 may be formed of silicon, or gallium arsenide, or other suitable semiconductor materials. In other examples organic photovoltaic elements may be used. In other examples hybrid photovoltaic elements may be used.

In the third embodiment, the heat exchange assembly 206 includes a primary heat exchange assembly 207 arranged to transfer heat energy from the heat transport element 204 to a first fluid, and a secondary heat exchange assembly 208 arranged to transfer heat energy from the heat transport element 204 to a second fluid. The primary heat exchange assembly 207 and the secondary heat exchange assembly 208 are separated by a heat transfer control valve assembly 209 able to selectively allow, or prevent, the transfer of heat energy from the heat transport element 204 to the secondary heat exchange assembly 208.

In one possible example, in use the hybrid solar energy converter 201 may be mounted on a wall. Accordingly, suitable mounting brackets may be provided.

In overview, the operation of the hybrid solar energy converter 201 of the third embodiment is similar to operation of the hybrid solar energy converter 1 and 101 of the first and second embodiments. Solar energy incident on the hybrid solar energy converter 201 passes through the sealed transparent tube 203 and is incident on the photovoltaic elements 205 of the solar energy collector assembly 202. The photovoltaic elements 205 convert a part of the energy of the incident solar energy into electrical energy, and convert a part of the energy of the incident solar energy into heat energy. A further part of the incident solar energy may be incident on any parts of the solar energy collector assembly 202 which are not covered by the photovoltaic elements 205, and this further part of the incident solar energy may also be converted into heat energy.

In general, it is desirable to maximize the proportion of the surface of the solar energy collector assembly 202 exposed to incident solar energy which is covered by the photovoltaic elements 205, and to minimize the proportion which is not so covered. However, in some circumstances it may be preferred to leave some parts of this exposed surface uncovered, for example to simplify manufacture and/or assembly of the solar energy collector assembly 202 and attachment of the photovoltaic elements 205 to the solar energy collector assembly 202.

The electrical energy produced by the photovoltaic elements 205 is carried along the heat transport element 204 by electrical conductors and away from the solar energy converter 201 for use. The heat energy absorbed by the photovoltaic elements 205 is transferred into the heat transport element 204, cooling the photovoltaic elements 205, and then carried to the heat exchange assembly 206.

Similarly to the first and second embodiments, the heat transfer control valve 209 is able to selectively allow, or prevent, the transfer or transport of heat energy from the heat transport element 204 to the secondary heat exchanger 208. Accordingly, the degree of cooling applied to the photovoltaic elements 205 can be varied.

In one typical arrangement, the hybrid solar energy converter 201 may be used to generate electricity, and to generate hot water. Similarly to the first embodiment, in this arrangement the heat energy transferred to the primary heat exchange assembly 207 is transferred into a pumped water supply flowing through the primary heat exchange assembly 207 to heat the water. This heated water is then used by a domestic or industrial hot water system, and the electrical energy produced by the photovoltaic elements 205 is supplied to an electrical supply system. In some arrangements the heat energy transferred to the secondary heat exchange assembly 208 is transferred into ambient air and allowed to escape and the secondary heat exchange assembly 208 is used, under the selective control of the heat transfer control valve assembly 209, to release heat energy in order to regulate the temperature of the solar energy collector assembly 202.

Transparent Tube

In the third embodiment illustrated in FIG. 20 the sealed transparent tube 203 is similar to the sealed transparent tube 3 of the first embodiment, having one closed domed end and one open end sealed by an end cap 220. The interior of the tube 203 is at least partially evacuated. That is, the interior of the tube 203 is below normal atmospheric pressure.

The pressure of the vacuum within the tube 203 may be $10^{-3}$ mbar. Other pressures may be used, as discussed regarding the first and second embodiments. In some examples the vacuum pressure may be in the range $10^{-2}$ mbar to $10^{-6}$ mbar. In general, it is expected that lower vacuum pressure, or in other words a harder vacuum, will provide greater insulating benefits. Further, it is expected that lower vacuum pressure, or in other words a harder vacuum, will provide greater protection from environmental damage in examples where the photovoltaic elements are not encapsulated. In practice the benefits of using a lower vacuum pressure may need to be balanced against the increased cost of achieving a lower vacuum pressure. In some examples a vacuum pressure of $10^{-2}$ mbar, or lower, may be used.

In an alternative example the sealed transparent tube 203 may be filled with an inert gas instead of being evacuated. In particular, the inert gas may be nitrogen.

In another alternative example the sealed transparent tube 203 may be filled with an inert gas at a reduced pressure. In some examples this may be achieved by filling the tube 203 with the inert gas and then evacuating the tube 203. In particular, the inert gas may be nitrogen.

In the illustrated third embodiment the tube 203 is cylindrical having a circular cross section. Similarly to the first and second embodiments, in alternative examples the tube 203 may have other shapes. In some examples the cross sectional size and/or shape of the tube 203 may vary at different positions along its length. In an alternative example the tube 203 may have an elliptical cross section. In particular, the tube 203 may have an elliptical cross section with the long axis of the ellipse aligned with the plane of the solar energy collector assembly 202.

In the illustrated second embodiment the tube 203 is formed of glass. In alternative examples suitable transparent plastics materials or laminated structures may be used to form the tube 203.

In the illustrated second embodiment the tube 203 is transparent. In alternative examples the tube may be only partially transparent.

In the illustrated second embodiment the metal end cap 220 may be bonded to the glass tube 203 by adhesive. In other embodiments alternative glass to metal bonding techniques may be used, for example welding, brazing or soldering.

Similarly to the first embodiment the tube 203 has a metal end cap 220 at one end. In alternative examples the end cap 220 may be made of other materials. In some examples the end cap 220 may be made of glass. This may reduce conductive heat losses from the collector assembly 202.

Collector Assembly

In the third embodiment, the solar energy collector assembly 202 includes a heat transport element 204 and an array of photovoltaic elements 205 mounted on one surface of the heat transport element 204. In order to allow radiant solar energy to be incident on the photovoltaic elements 205 the array of photovoltaic elements 205 are mounted on the surface of the heat transport element 204 which is exposed to the incident radiant solar energy in operation of the hybrid solar energy converter 201. In the third embodiment the heat transport element 204 may be mounted vertically. In examples where the heat transport element 204 is not mounted vertically the surface which is exposed to the incident radiant solar energy in operation will usually be the upper surface of the heat transport element 204.

In some arrangements the surface of the heat transport element 204 exposed to the incident radiant solar energy may not be the upper surface. In particular, this would be the case if the incident solar radiant energy was incident horizontally or from below, for example after redirection by an optical system such as a mirror.

In the illustrated example of the third embodiment, the solar energy collector assembly 202 is supported by cylindrical tubes 219 of the heat transport element 204. The cylindrical tubes 219 pass through the end cap 220 and into the heat exchange assembly 206, as will be explained in more detail below. Where the cylindrical tube 219 passes through the end cap 220 the cylindrical tube 119 is soldered to the end cap 220 to retain the cylindrical tube 119 in place and support the solar energy collector assembly 102.

In alternative examples the cylindrical tube 219 may be secured to the end cap 220 in other ways. In one example the cylindrical tube 119 may be welded to the end cap 220.

The supporting of the solar energy collector assembly 202 by physical connections through the cylindrical tubes 219 may increase the efficiency with which heat can be collected from incident solar energy by the solar energy collector assembly 202. Having the solar energy collector assembly 202 supported by physical connections only through the cylindrical tubes 219 may reduce conductive heat loss from the solar energy collector assembly 202 into the supporting structure outside the transparent tube.

In the illustrated example of the third embodiment the heat transport element 204 has a substantially flat front surface 204a. Each of the photovoltaic elements 205 is square, and the width of the heat transport element 204 is the same as the width of each square photovoltaic element 205. Six square photovoltaic elements 105 are mounted side by side to one another along the length of the heat transport element 204. Substantially the entire front face of the heat transport element 204 is covered by the photovoltaic elements 205. Covering a large proportion of the upper surface 204a of the heat transport element 204 with photovoltaic elements 205 may increase the efficiency of the hybrid solar energy converter 201.

In one example the square photovoltaic elements 205 may each be a 125 mm by 125 mm square and 0.2 mm thick. In another example the square photovoltaic elements may each be a 156 mm by 156 mm square. In other examples, photovoltaic elements having other sizes or shapes may be used.

The photovoltaic elements 205 are bonded to the substantially flat upper surface 204a of the heat transport element 204 using a layer of heat conducting adhesive in a similar manner to the first and second embodiments. The adhesive bonding layer is electrically insulating. The adhesive bonding layer between the photovoltaic elements 205 and the heat transport element 204 is arranged to be thin. This may improve the degree of thermal conduction between the photovoltaic elements 205 and the heat transport element 204. This may increase the rate of heat transfer laterally across the photovoltaic elements 205. An adhesive material loaded with solid spheres of a predetermined size may be used to form the adhesive bonding layer. This may allow a thin adhesive layer to be consistently and reliably formed. The adhesive bonding layer is formed of a flexible or "forgiving" adhesive material. This may relieve stresses in the assembled solar energy collector assembly 202 and reduce any stress applied to the photovoltaic elements 205.

The photovoltaic elements 205 are semiconductor photovoltaic elements formed of silicon. In one embodiment the photovoltaic elements are formed of single-crystal silicon. In one embodiment the photovoltaic elements are formed of amorphous silicon. In one embodiment the photovoltaic elements are formed of polycrystalline silicon, or polysilicon. In other embodiments alternative types of semiconductor photovoltaic elements may be used.

Similarly to the first and second embodiments, in operation of the hybrid solar energy converter 201 the photovoltaic elements 205 are cooled by the heat transport element 204, which may provide similar advantages to those discussed above. This cooling may allow the temperature of the photovoltaic elements 5 to be maintained at a desired value.

This cooling may provide the advantage that the appearance of hot spots or regions in the photovoltaic elements 205 can be reduced or eliminated, and the temperature of the photovoltaic elements 205 maintained at a uniform desired value. Such hot spots or regions may for example be produced by heating by incident solar radiation, by inhomogeneities or faults in the photovoltaic elements 205, or by a combination of, or interaction between, these causes.

As discussed above regarding the first and second embodiments, such hot spots or regions can reduce the efficiency of the photovoltaic elements 205 in the short term, and may also degrade the performance of the photovoltaic elements 205 in the longer term.

Accordingly, maintaining the photovoltaic elements 205 at a more uniform temperature value and reducing, or eliminating, hot spots or regions may improve the efficiency of the photovoltaic elements 205 at a specific temperature, and may reduce the amount of degradation of the photovoltaic elements 205 caused by higher temperatures.

This may allow the photovoltaic elements 205 to operate at a higher overall temperature than would otherwise be the case, for the same reasons as discussed regarding the first and second embodiments.

The illustrated example of the third embodiment has a solar energy collector assembly 202 supported only by physical connections through the cylindrical tubes 219. In other examples alternative supporting arrangements may be used. In some examples the solar energy collector assembly 202 may be supported by a physical connections both ends of the solar energy collector assembly 202. In some examples, the physical connections at one end of the solar energy collector assembly may be the through the cylindrical tubes 219. In general, it is advantageous to minimize the number of physical supports in order to minimize the escape of heat from the solar energy collector assembly by conduction through the physical supports.

In other examples the number of photovoltaic elements 205 mounted on the heat transport element 204 may be different. In other examples the relative sizes of the photovoltaic elements 205 and the heat transport element 204 may be different.

In some examples the adhesive layer may comprise an epoxy resin which remains non-brittle after curing.

In other examples the adhesive layer may be formed by a double sided adhesive tape.

Heat Transport Element

Figure 21:
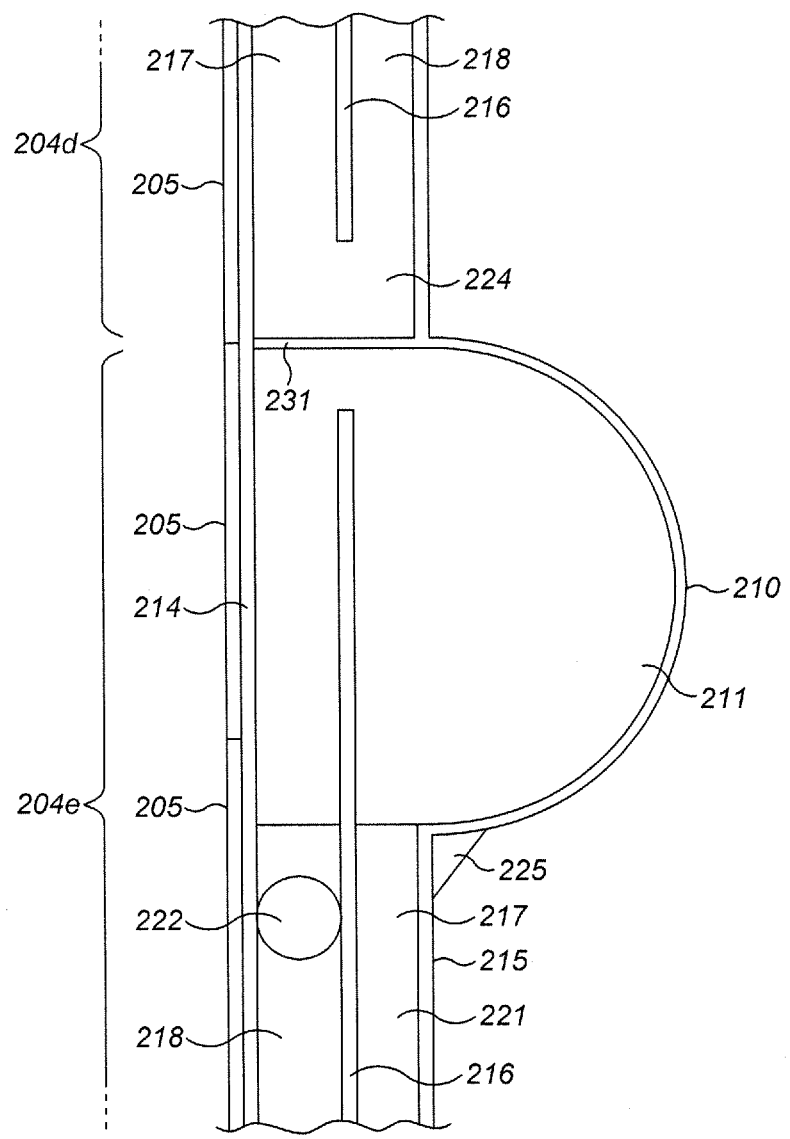
FIG. 21 is a cut away diagram of a part of a solar energy collector assembly useable in the hybrid solar energy converter of FIG. 20.

The heat transport element 204 according to the third embodiment is shown in more detail in a cut away view in FIG. 21.

In the third embodiment, the heat transport element 204 is generally rectangular. The heat transport element 204 has a flat front surface 204a and a rear surface 204b which is flat across most of its area, and has three outwardly projecting sections 210 spaced out along its length, with a first outwardly projecting section 210 at an upper end of the heat transport element 204, a second outwardly projecting section 210 located one third of the way along the length of the heat transport element 204, and a third outwardly projecting section 210 located two thirds of the way along the length of the heat transport element 204.

The heat transport element 204 is divided into three sections, an upper section 204c, a central section 204d, and a lower section 204e. Each section 204c to 204e is cooled by a separate density driven circulation acting as a heat transport mechanism similar to the mechanism of the second embodiment and comprising a respective one of the three outwardly projecting sections 210. Each of the three sections 204c to 204e supports and cools two of the six photovoltaic elements 205.

Each outwardly projecting section 210 contains and defines a vapor manifold 211. In operation the heat transport element 204 is arranged to be longitudinally sloping, so that the heat transport element 204 has an upper end and a lower end. The heat transport element 204 may be arranged longitudinally vertically, or at an angle to the vertical.

The heat transport element 204 has a front surface 204a formed by a front sheet 214 and a rear surface 204b formed by a rear sheet 215. Three central sheets 216 are located between the front sheet 214 and the rear sheet 215, with one of the central sheets 216 in each of the sections 204a to 204c, so that fluid flow passages 217 and 218 running longitudinally along the heat transport element 204 are defined between each central sheet 216 and each of the front sheet 214 and the rear sheet 215. Since the heat transport element 204 is longitudinally sloping the fluid flow passages 217 and 218 running longitudinally along the heat transport element 204 will be sloped along their lengths.

Each central sheet 216 has a similar profile to the central sheet 116 of the second embodiment, except that, compared to the second embodiment, the profile of the central sheets 216 of the third embodiment is rotated through 90° to define flow channels running longitudinally along the heat transport element 204. The cross-sectional profile of the corrugated central sheets 216 can be understood as a zig-zag profile with the points of the zig-zag forming the peaks and troughs being flattened.

To be more specific, in the illustrated example of the third embodiment the central sheets 216 each comprise a plurality of flat surfaces connected by folds running longitudinally along the heat transport element 204. Accordingly, the front, rear, and central sheets 214, 215, 216 define a plurality of trapezoid cross-section front fluid flow channels 217 and rear fluid flow channels 218 between them. The front fluid flow channels 217 are defined between the front sheet 214 and the central sheets 216. The rear fluid flow channels 218 are defined between the rear sheet 215 and the central sheets 216. The trapezoid front fluid flow channels 271 are arranged so that the larger one of the two parallel faces of each trapezoid channel 217 is formed by the upper sheet 214.

The front and rear fluid flow channels 217 and 218 of the third embodiment respectively correspond in function to the upper and lower fluid flow channels 117 and 118 of the second embodiment.

The edges of the heat transport element 204 are formed by bent parts of the rear sheet 215, which are bonded to the front sheet 214. The photovoltaic elements 205 are bonded to the front sheet 214. At the edges of the heat transport element 204, the front sheet 214 is bonded directly to the rear sheet 215, the central sheets 216 are not located between the front and rear sheets 214 and 215 at their edges.

In some examples the central sheets 216 may extend at least partially between the front and rear sheets 214 and 215 at the side edges of the heat transport element 204 so that the front and rear sheets 214 and 215 are both bonded to the central sheets 216. This may assist in locating and securing the central sheets 216 relative to the front and rear sheets 214 and 215.

As discussed above, the heat transport element 204 has three outwardly projecting sections 210 each running transversely across the rear surface 204b of the heat transport element 204. Each outwardly projecting section 210 is substantially semi-cylindrical and is formed by an outwardly projecting part of the rear sheet 215. Each outwardly projecting section 210 defines a vapor manifold 211. The fluid flow channels 217 and 218 connect to the vapor manifolds 211. It should be noted that the central sheets 216 extend across most of the width of the vapor manifolds 211. Accordingly, the front fluid flow channels 217 defined between the front sheet 214 and the central sheets 216 connect to the vapor manifolds 211 towards the top of each vapor manifold 211, while the rear fluid flow channels 218 defined between the rear sheet 215 and the central sheets 216 connect to the vapor manifolds 211 towards the bottom of each vapor manifold 211.

The front and rear fluid flow channels 217 and 218 are formed into three groups with the front and rear fluid flow channels 217 and 218 of each group interconnected by one of the vapor manifolds 211. Each group of fluid flow channels 217 and 218 extends along one of the sections 204c to 204e of the heat transport element 204 and, together with the vapor manifold with which they are connected, forms a separate heat transport mechanism cooling the respective section 204c to 204e of the heat transport element 204.

FIG. 21 is an explanatory diagram showing a longitudinal cross section of a part of the heat transport element 204 along the line D-D in FIG. 20. FIG. 21 shows the section of the heat transport element 204 around the boundary between the central section 204d and the lower section 204e. The boundary between the central section 204d and the upper section 204c is identical.

At the top of the lower section 204e of the heat transport element 204, at the top of the outwardly projecting section 110, there is a wall 231 extending transversely across the interior of the heat transport element 204. The wall 231 contacts and is bonded to the front and rear sheets 214 and 215 and forms a fluid tight seal between the fluid flow channels 217 and 218 of the central section 204d of the heat transport element 204 and the vapor manifold 211 of the lower section 204e of the heat transport element 204. The walls 131 divide the interior of the heat transport element 204 into three separate fluid circulation regions corresponding to the sections 204c to 204e of the heat transport element 204.

There is a gap 223 between the edge of the central sheet 216 of the central section 204d of the heat transport element 204 and the wall 231. This gap 223 allows water to flow between different ones of the fluid flow channels 217 and 218. The gap 223 extends along the side wall 231, and forms a fluid manifold 224 interconnecting all of the front and rear fluid flow channels 217 and 218 of the central section 204d.

At one edge of the heat transport element 204 each of the substantially semi-cylindrical outwardly projecting sections 210 transitions to a projecting cylindrical tube 219. The front and rear sheets 214 and 215 are sealed to the cylindrical tubes 219 so that the interior of the heat transport element 204 is sealed. The cylindrical tubes 219 pass through the end cap 12 and into the heat exchange assembly 206. The central bore of each of the cylindrical tubes 219 is connected to one of the vapor manifolds 111 and acts to carry heat energy from the heat transport element 204 to the heat exchange assembly 206, as will be explained below.

The cylindrical tubes 219 physically support the solar energy collector assembly 202 within the sealed transparent tube 203. There is no other physical support of the solar energy collector assembly 202. As in the previous embodiments this may reduce conductive heat losses from the solar energy collector assembly 202, which may increase the amount of useful heat energy produced by the hybrid solar energy converter 201.

The fluid flow channels 217 and 218 are at least partially filled with degassed distilled water 221 as a working fluid and the interior of the heat transport element 204 including the fluid flow channels 217 and 218, the vapor manifolds 211, and the tubes 219 are at least partially evacuated. That is the interior of the heat transport element 204 is below normal atmospheric pressure. the interior of the heat transport element 104 may be under a vacuum at a pressure of $10^{-3}$ mbar.

In the third embodiment the amount of water 221 in the fluid flow channels 217 and 218 is similar to the second embodiment except that the interior of each of the sections 204c to 204e is sealed off from the others so that the level of the water 221 is independent in each of the sections 204c to 204e of the heat transfer element 204.

In each of the three sections 204c to 204e the level of the water 221 in the fluid flow channels 217 and 218 is such that the upper surface of the water 221 in the rear fluid flow channels 218 is level with the ends of the rear fluid flow channels 218 where they connect to the vapor manifold 211. In the illustrated third embodiment the level of the surface of the water 221 in the front fluid flow channels 217 and rear fluid flow channels 218 is the same. Accordingly, in the illustrated third embodiment the rear fluid flow channels 218 are filled with liquid water, while the front fluid flow channels 217 are only partially filled with liquid water.

Similarly to the second embodiment, in other examples the level of the water 221 may be different. In some examples the upper surface of the water 221 in the rear fluid flow channels 218 may be below the vapor manifold 211. In some examples the upper surface of the water 221 in the rear fluid flow channels 218 may be above the bottom of the vapor manifold 211, with some water being present in the bottom of the vapor manifold 211.

It is expected that in practice the heat transport element 204 will operate most efficiently with the upper surface of the water being at, or close to, the point where the lower fluid flow channels 218 contact the vapor manifold 211. If the level of the water in the heat transport element 204 is too high, so that the upper surface of the water is too high within the vapor manifold 211, the efficiency of operation of the heat transport element 204 may be reduced, for the same reasons as are discussed regarding the second embodiment.

The upper surface of the water 221 in the front fluid flow channels 217 may be higher than in the rear fluid flow channels 218 as a result of capillary action. The extent of this capillary effect in any specific example will depend upon the dimensions of the front fluid flow channels 217. In the illustrated second embodiment some of the inner surface of the upper sheet 214, that is, the surface forming a part of the upper fluid flow channels 217, is above the surface of the water 221. In some examples the front fluid flow channels 217 may have a small enough cross-sectional area that the upper surface of the water 221 in the front fluid flow channels 217 is at the ends of the front fluid flow channels 217 due to capillary action.

Similarly to the second embodiment, and unlike the first embodiment, it is not necessary that the inner surface of the front sheet 214, that is, the surface forming a part of the front fluid flow channels 217, is below the surface of the water 221 at a position corresponding to the location of the uppermost parts of the photovoltaic elements 205 for each of the sections 204c to 204e of the heat transport element 204. However, in some embodiments this may be the case.

In operation of the third embodiment, when the solar energy collector assembly 202 is exposed to incident solar radiative energy, the photovoltaic elements 205 absorb some of this energy, converting a part of the absorbed energy into electrical energy. The remainder of the absorbed energy is converted into heat energy, raising the temperature of the photovoltaic elements 205. The absorbed heat energy flows from the photovoltaic elements 205 into the heat transport element 204, being transmitted through the front sheet 214 and into the water 221 inside the front fluid flow channels 217, which water is in contact with the inner surface of the front metal sheet 214 across the larger parallel faces of the trapezoid front fluid flow channels 217.

The liquid water 221 inside the front fluid flow channels 217 absorbs the heat energy from the photovoltaic elements 205 passing through the front sheet 214 and vaporizes, producing bubbles 222 of steam or water vapor. At the vacuum pressure of $10^{-3}$ mbar inside the front fluid flow channels 217 water boils from around 0° C., so that the water 221 vaporizes readily at the normal operating temperatures of the hybrid solar energy converter 201.

As discussed above regarding the second embodiment, the bubbles 222 of water vapor are less dense than the liquid water 221. Further, as explained above the front fluid flow channels 117 are sloping along their lengths. Accordingly, as a result of this density difference the water vapor bubbles 222 travel upwards along the front fluid flow channels 217 towards the top of the heat transport element 204 and the surface of the water 221. When a bubble of water vapor 222 reaches the surface of the water 221 the vapor is released into the vacuum above the water 221 in the respective vapor manifold 211. Further, the bubbles 222 will give rise to pistonic driving in a similar manner to the second embodiment. In the illustrated third embodiment, where some of the inner surface of the upper sheet 214 is above the surface of the water 221, this pumping of liquid water upwards along the upper flow channels 217 ensures that the part of the inner surface of the upper sheet 214 above the surface of the water 221 is in contact with a flow of water so that it can be cooled.

The bursting of the bubbles of water vapor at the water surface and any pistonic pumping of liquid water out of the ends of the front fluid flow channels 217 may generate droplets of liquid water, and may project at least some of these water droplets into the vacuum within the respective vapor manifold 211 above the water surface. As a result, the heat transfer mechanism may be a multi-phase system comprising liquid water, water vapor and droplets of liquid water, and not just a two-phase system comprising liquid water and water vapor only. The presence of such droplets of water in the vacuum, and any pumping of liquid water out of the ends of the front fluid flow channels 217, may enhance the rate of vaporization by increasing the surface area of the water exposed to the vacuum.

Similarly to the first and second embodiment, the water vapor in the vacuum within each vapor manifold 211 travels at a very high speed through the vacuum along the vapor manifold 211, along the respective tube 219 and into the heat exchange assembly 206. The travel speed of the hot water vapor in the vacuum is very fast, approximating to the thermal speed of the water vapor molecules. Inside the heat exchange assembly 206 the water vapor from each tube 219 condenses on a respective heat exchange surface of one of the primary and secondary heat exchange assemblies 207 and 208. The condensed water flows back out of the heat exchange assembly 206 down the same respective tube 219 to the respective vapor manifold, along the bottom of the vapor manifold 211, and is returned back into the water 121 within the rear fluid flow channels 218 associated with that vapor manifold 211. This generating of hot water vapor within the front fluid flow channels 217 and the vapor manifolds 211, and subsequent travel of hot water vapor from the vapor manifolds 211 to the heat exchange assembly 206 where it condenses, followed by return of the condensed water, transfers heat energy from the heat transfer element 204 to the operating fluids in the heat exchange assembly 206.

The tubes 219 are not interconnected within the heat exchange assembly 206. The respective heat exchange surfaces of the primary and secondary heat exchange assemblies 207 and 208 connected to each of the tubes 219 are separate from one another so that liquid water and water vapor cannot be transferred between different ones of the separate heat transport mechanisms cooling the respective sections 204c to 204e of the heat transport element 204.

Any liquid water ejected from the front fluid flow channels 217 into a vapor manifold 211 which does not vaporize will also fall to the bottom of the respective vapor manifold 211, and is returned back into the water 221 within the rear fluid flow channels 218 associated with that vapor manifold 211.

As is explained above all of the front and rear fluid flow channels 217 and 218 in each section 204c to 204e of the heat transfer element 204 are interconnected by the respective fluid manifold 224 formed by the respective gap 223. Accordingly, within each section 204c to 204e of the heat transfer element 204, it is not important which of the rear fluid flow channels 218 is entered by any liquid water returning from the respective vapor manifold 211.

As is clear from the description above, each vapor manifold 211 generally includes liquid water in addition to water vapor when the hybrid solar energy converter 201 is operating. However, as is also discussed above, if the level of the water in a section 204c to 204e of the heat transport element 204 is too high, so that the upper surface of the water is too high within the respective vapor manifold 211, the efficiency of operation of the heat transport element 204 may be reduced. This reduction in efficiency of operation may occur because there is insufficient space within the vapor manifold 211 above the surface of the water for the movement and evaporation of the droplets of liquid water. This reduction in efficiency of operation may occur because the droplets of liquid water and waves and splashing upwardly of the liquid water surface may reduce the open, or water free, cross sectional area of the vapor manifold at some locations to a relatively small amount, or even to zero, momentarily closing the vapor manifold. This reduction in the open, or water free, cross sectional area of the vapor manifold may interfere with the movement of the water vapor in the vacuum within the vapor manifold 211.

In a similar manner to the second embodiment the bubbles 222 of water vapor will tend to move upwardly through the liquid water in the front fluid flow channel 217 because of the lower density of the water vapor compared to the liquid water 221, which will result in an upward buoyancy force on each bubble 222. Further, the movement of the bubbles 222 of water vapor will tend to drive the liquid water 221 in the front fluid flow channel 217 upwardly, particularly in examples where pistonic driving takes place. As a result, the bubbles 222 of water vapor cause the water 221 in the front and rear fluid flow channels 217 and 218 in each section 204c to 204e to circulate, with relatively hot liquid water and bubbles 222 of water vapor flowing upwards along the front fluid flow channels 217, and relatively cool liquid water flowing downwards along the rear fluid flow channels 218. The front and rear fluid flow channels 217 and 218 are interconnected by the vapor manifold 211 and the fluid manifold 224, as explained above. Accordingly, the relatively hot liquid water flowing upwards along the front fluid flow channels is continuously replaced by relatively cool liquid water from the rear fluid flow channels 218. This circulation is driven primarily by the difference in density between the water vapor and the liquid water. However, this circulation may also be driven by convection as a result of the difference in density between the relatively hot liquid water in the front fluid flow channels 217 and the relatively cool liquid water in the rear fluid flow channels 218, in a similar manner to a thermosiphon. Accordingly, the front fluid flow channels 217 may be regarded as riser channels, while the rear fluid flow channels 218 may be regarded as sinker channels or return channels.

As the bubbles 222 of water vapor travel upwardly along the front fluid flow channels 217 the pressure head acting on the bubbles 222 decreases, so that the bubbles 222 tend to expand. As a result, the tendency of the vapor bubbles 222 to collapse and implode is reduced by the effects of the expansion and decreasing pressure as the bubbles 222 move upwardly. When considering this point, it should be remembered that when the heat transport element 204 is operating the bubbles 222 will be forming within established density driven circulation fluid flows and will move upwardly carried by these flows in addition to the bubbles movement due to their own buoyancy relative to the liquid water. Further, it is believed that expansion of the bubbles 222 as they move upwardly will further increase the speed of the density driven circulation flow by increasing the buoyancy of the expanding bubbles 222. In some examples expansion of the bubbles as they move upwardly may also increase the degree of pistonic driving.

This density driven circulation may form a highly effective heat transport mechanism because water has a relatively high enthalpy of vaporization, so that the movement of the bubbles 222 of water vapor may carry a large amount of heat energy, in addition to the heat energy carried by the movement of relatively hot water out of the front fluid flow channels 217, and its replacement by cooler water. In arrangements where pistonic driving of the flow of the liquid water by the water vapor bubbles takes place the effectiveness of the heat transport mechanism may be further increased by the increase in the flow rate of the liquid water caused by the pistonic driving. This pistonic driving is a component of the overall density driving producing the density driven circulation. The pistonic driving is caused by the density difference between the liquid water and the bubbles of water vapor.

In general, the speed of the density driven circulation increases and the effectiveness of the heat transport mechanism increases as the temperature of the upper sheet 214 of the heat transport element 204 increases.

The density driven circulation of the water 221 within the fluid flow channels 217 and 218 is a vapor driven circulating or rolling flow.

The density driven circulation of the water 221 within the fluid flow channels 217 and 218 becomes particularly vigorous, and becomes particularly effective as a heat transport mechanism, when the temperature of the upper sheet 214 of the heat transport element 204 becomes sufficiently high that the water 221 within the fluid flow channels 217 and 218 enters a rolling boil state. The effectiveness of the heat transport mechanism significantly increases when rolling boiling of the water 221 commences. In general, when other parameters of the system remain constant, entry into the rolling boil state will take place when the temperature of the front sheet 214 of the heat transport element 204 reaches a specific temperature.

In the illustrated example using water, the water 221 within fluid flow channels 217 and 218 may enter a rolling boil state at a temperature of about 40° C.

The arrangement of the heat transfer element 204 into sections 204c to 204e with separate fluid flow channels 217 extending along the heat transport element 104 may allow the vertical height of the liquid water in each section 204c to 204e of the heat transport element 204 to be reduced compared to embodiments in which the density driven flow extends along the length of a heat transport element, and so reduce the pressure head acting on the liquid water at the bottom of the heat transport element 204. In general, increased pressure reduces the tendency of liquids to vaporize and so increases the boiling point of liquids. Accordingly, reducing the pressure head acting on the liquid water at the bottom of the heat transport element 204 may increase the tendency of the liquid water 221 in the front fluid flow channels 217 to vaporize and produce bubbles 222, and so may improve the efficiency and effectiveness of the heat transport element 204.

In particular, the reduction of the pressure head acting on the liquid water at the bottom of the front fluid flow channels 217 may reduce any temperature differential along the lengths of the front fluid flow channels between their the top and bottom ends by reducing any difference in the tendency of the liquid water to vaporize due to differences in pressure. This may reduce temperature differentials between the different points on the heat transport element 204 and may avoid the formation of hot spots in the photovoltaic elements 205. Accordingly, reducing the pressure head acting on the liquid water at the bottom of the heat transport element 204 may make the temperature of the front sheet 214 of the heat transport element 204 more isothermal.

The arrangement of fluid flow channels 217 extending longitudinally along the heat transport element 204 and interconnected by vapor manifolds 211 extending laterally across the heat transport element 204 may allow a very rapid flow of heat energy along the heat transport element 204 away from any fluid flow channel 217 having a higher temperature. This may reduce temperature differentials between the different points on the heat transport element 204 and may reduce, or avoid, the formation of hot spots in the photovoltaic elements 205.

The provision of the two separate heat transport mechanisms of the movement of water vapor along the vapor manifold 211 and the density driven flow of liquid water and water vapor along each of the front fluid flow channels 217, respectively acting longitudinally and transverse the length of the heat transport element 204 may tend to equalize the temperature across the entire upper surface of the heat transport element, and thus tend to equalize the temperature across the photovoltaic elements 205 and reduce, or avoid, the formation of hot spots.

The movement of water vapor along the vapor manifold 211 provides a very rapid heat transport mechanism that tends, by the vaporization and condensation of water, to move heat energy from relatively hot locations to relatively cold locations. As a result, the movement of water vapor along the vapor manifold 211 may tend to equalize the temperature of the liquid water surface at different positions across the heat transfer element 204, in addition to transporting heat energy from the heat transport element 204 to the heat exchange assembly 206. This temperature equalization may have the effect of removing more heat energy from hotter parts of the heat transport element 204, and so tending to equalize the temperature across the front surface of the heat transport element 204. It is clear that such isothermal cooling will tend to reduce, or avoid, the formation of hot spots, for example in any photovoltaic element attached to the front surface of the heat transport element 204.

Similarly to the second embodiment, the rear sheet 215 of the heat transport element 204 has a plurality of hollow ridges 225 extending between the flat part of the rear surface 204b and the semi-cylindrical surface of each outwardly projecting section 210. Each hollow ridge 225 has a 'V' profile, and the hollow ridges 225 are located spaced apart at regular intervals along the length of each outwardly projecting section. The hollow ridges 225 act as supports for the outwardly projecting sections 210, and also act as drains to return liquid water from the vapor manifolds 211 into the rear fluid flow channels 218 in a similar manner to the hollow ridges 125 of the second embodiment.

The hollow ridges 225 may extend the range of angles of inclination at which the heat transport element 204 can be used, as explained above regarding the second embodiment.

Depending upon the geometry of the different parts of the heat transport element 204 in any specific design, even when the hollow ridges 225 are used there may still be a minimum angle of inclination at which the heat transport element 204 can operate without the retention of liquid water in the vapor manifolds 211 having adverse effects on operation of the heat transport element 204.

The corrugated profile of the central sheet 216 and the bonding of the central sheets 216 to the front sheet 214 and the rear sheet 215 increases the strength and rigidity of the heat transport element 204, and may reduce or prevent ballooning for the reasons discussed regarding the second embodiment. This may make the heat transport element 204 a more rigid structure. This may tend to reduce the amount of flexing of the heat transport element 204 in use. This may prevent damage to the photovoltaic elements 205 by reducing the amount of mechanical stress applied to the photovoltaic elements 105. This may allow the front, rear, and/or central sheets 214, 215, 216, to be thinner, which may reduce weight and costs. This may allow the front sheet 214 to be thinner, which may improve the transfer of heat from the photovoltaic elements 205 into the liquid water within the front fluid flow channels 217.

The heat transport element 204 is a substantially rigid structure. This may minimize changes in the level of the upper surface 232 of the water 221 due to flexing of the components of the heat transport element 204, such as the upper and lower sheets 214 and 215. Such changes in the level of the upper surface 232 of the water 221 may affect the efficiency of the cooling of the photovoltaic elements 205.

As is explained above, the interior of the heat transport element 204 is evacuated, and the heat transport element 104 is located within an evacuated tube 203. Usually the heat transport element 204 and the evacuated tube 203 are evacuated to the same pressure. In the illustrated example of the second embodiment described above this pressure may be $10^{-3}$ mbar.

The interconnection of the front and rear sheets 214 and 215 by the linking surfaces of the central sheet 216 may resist ballooning of the front and rear sheets 214 and 215 and reduce or prevent ballooning. Arranging for the linking surfaces of the central sheet 216 to be straight may increase the resistance to ballooning. Reducing or preventing ballooning may prevent damage to the photovoltaic elements 205 by reducing the amount of mechanical stress applied to the photovoltaic elements 205. This may allow the front sheet 214 to be thinner, which may reduce weight and costs and/or may improve the transfer of heat from the photovoltaic elements 205 into the liquid water within the front fluid flow channels 217.

For the same reasons as explained with regard to the second embodiment it is preferred for the sizes of the surfaces of the central sheets 216 in contact with the front sheet 214 to be as small as possible, subject to the contact area between the central sheets 216 and the upper sheet 214 being sufficiently large to form a reliable bond of the required strength.

In the illustrated example of the third embodiment 0.2 mm thick tin coated mild steel sheets are used to form the different sheets of the heat transport element. In alternative examples other thicknesses may be used, in particular 0.1 mm thick tin coated mild steel sheets may be used.

In the illustrated example of the third embodiment the spacing between the front sheet 214 and the parallel parts of the rear sheet 215 is 1.8 mm at the locations of the recesses. Accordingly, the thickness of the fluid flow channels 217 and 218 at the locations of the recesses is 1.6 mm, since the thickness of the central sheet is 0.2 mm.

The sheets used to form the heat transport element may be shaped by pressing.

In the illustrated third embodiment the heat transport element 204 is arranged to be horizontal transversely to longitudinal axis. That is, the vapor manifolds 211 should be horizontal. However, in practice some deviation from the horizontal may be tolerated without significant impact on the operation of the heat transport element 204. Such deviation from the horizontal will result in differences in the level of the liquid water surface relative to the structure of the heat transport element 204 at different positions along the length of each vapor manifold 211. As is explained above, the level of the liquid water surface may be varied. Accordingly, the minor differences in level caused by small deviations from the horizontal may be accommodated.

In some examples the hybrid solar energy converter 201 may be arranged so that the tubes 219 and the internal passages of the heat exchanger assembly 206 are inclined at an angle to the horizontal downwardly from the heat exchanger assembly 206 towards the heat transport element 204 in order to assist the return flow of condensed liquid water from the primary and secondary heat exchangers 208 and 209 to the vapor manifold 211 of the heat transport element 204.

The front and rear sheets 214 and 215 of the third embodiment have a dimpled profile similarly to the upper and lower metal sheets 114 and 115 of the second embodiment.

As discussed above the heat transport element 204 has a flat front surface 204a formed by a front sheet 214 with a dimpled profile. In addition, the front sheet 214 is has two longitudinal recesses running across in its front surface 204a which form two parallel troughs running along the upper surface 204a of the heat transport element 204 behind the photovoltaic elements 205. Similarly to the preceding embodiments electrically conductive ribbons or wires run along the longitudinal recesses between the heat transport element 204 and the photovoltaic elements 205. The wires are electrically connected to the photovoltaic elements 205 and to the conductors 21 which pass through the cap 12 to provide a conductive path to carry the electrical power generated by the photovoltaic elements 205 out of the sealed transparent tube 203. This electrical power may be supplied to an inverter for voltage conversion and/or for conversion to alternating current for supply to a domestic or mains electrical system.

In examples where adhesive is used to attach the photovoltaic elements 205 to the heat transport element 204, an electrically insulating adhesive can be used in a similar manner to the second embodiment.

In the third embodiment the longitudinal recesses run parallel to the fluid flow channels 217 and 218. Accordingly, each of the longitudinal recesses can be accommodated by reducing the thickness of one of the front fluid flow channels 217 in each section 204c to 204e of the heat transfer element 204.

In the illustrated example of the third embodiment the spacing between the front sheet 214 and the parallel rear sheet 215 is 1.8 mm at the locations of the longitudinal recesses 129. Accordingly, the thickness of the front fluid flow channels 217 at the locations of the longitudinal recesses is 1.6 mm, since the thickness of the central sheet is 0.2 mm.

The heat transport element of the third embodiment may be formed using the same materials and bonding techniques as in the second embodiment.

In the illustrated example of the third embodiment the flow of water vapor and liquid water through the heat transport element 204 tends to keep the cooled front surface of the heat transport element 204 at a uniform operating temperature during operation. That is, the cooled upper surface of the heat transport element 104 tends to be kept isothermal. The isothermal nature of the cooled upper surface of the heat transport element 104 tends to give rise to isothermal cooling of the photovoltaic elements 105, where hotter parts of the photovoltaic elements 105 tend to be preferentially cooled so that the photovoltaic elements 105 themselves tend to become isothermal Such isothermal cooling provides further advantages in addition to those provided by cooling.

Isothermal cooling may provide the advantage that the appearance of hot spots or regions in the photovoltaic elements 205 produced by heating by incident solar radiation can be reduced or eliminated. Such hot spots or regions can reduce the efficiency of the photovoltaic elements 205.

Isothermal cooling may simplify the control and wiring arrangements of the photovoltaic elements 205 by reducing or eliminating any requirement for compensation for differences in the performance of the different parts of the photovoltaic elements 205 that are at different temperatures.

Isothermal cooling tends to reduce, or prevent, the formation of hot spots or regions in the photovoltaic elements 205. As is explained above, this may allow the efficiency of the photovoltaic elements 205 to be improved at a specific temperature. Further, this may reduce the amount of degradation of the photovoltaic elements 205 caused by higher temperatures.

Still further, this may allow the photovoltaic elements 205 to operate with a given degree of efficiency at a higher temperature than would otherwise be the case. This may allow the solar energy collector assembly 202 including the photovoltaic elements 205 to be operated at a higher temperature without reducing the efficiency with which the photovoltaic elements 205 produce electrical energy.

One example of this effect of isothermal cooling is that the general figure quoted above for silicon photovoltaic elements that the efficiency of electrical energy generation generally drops by about 0.35% to 0.5% for each degree centigrade of temperature increase above 25° C. may not apply to silicon photovoltaic elements that are isothermally cooled. Such isothermally cooled silicon photovoltaic elements having hotspots eliminated or reduced may have a higher threshold temperature at which the efficiency of electrical energy generation begins to drop and/or may have a reduced rate of reduction in efficiency for each degree centigrade of temperature increase above the threshold temperature. Further, the temperature at which there is a risk of permanent degradation of the silicon photovoltaic elements may also be increased for isothermally cooled silicon photovoltaic elements. Similar effects may be found in photovoltaic elements formed of other semiconductor materials.

In some examples, one or more layers of heat conductive material may be located between the upper sheet 214 and the photovoltaic elements 205. Such layers of heat conductive material may increase the rate of heat transfer between the photovoltaic elements 205 and the front sheet 214, and thus the rate of heat transfer between the photovoltaic elements 205 and the liquid within the front fluid flow channels 217. Such layers of heat conductive material may also increase the rate of heat transfer laterally across the photovoltaic elements 205.

Accordingly, providing a layer of heat conductive material may increase the degree of isothermal cooling and further tend to reduce, or eliminate, the formation of hot spots or regions in the photovoltaic elements 205.

Heat Exchange Assembly

The heat exchange assembly 206 of the third embodiment may be the similar to the heat exchange assemblies of the first and second embodiments.

In the third embodiment the general arrangement and operation of the heat exchange assembly 206 is similar to that in the first and second embodiments. As explained above, in the third embodiment the heat exchange assembly 206 includes a primary heat exchange assembly 207 and a secondary heat exchange assembly 208 separated by a heat transfer control valve assembly 209. These are similar to, and operate similarly to, the heat exchange assembly 6 including a primary heat exchanger 7 and a secondary heat exchanger 8 separated by a heat transfer control valve 9 according to the first embodiment.

In the third embodiment there are three separate pipes 219 respectively connecting the respective vapor manifolds 211 of the three separate heat transfer mechanisms to the heat exchange assembly 206. Each of the three heat transfer mechanisms is connected by a respective pipe 219 to a respective fluid flow passage through the primary heat exchange assembly 207, secondary heat exchange assembly 208 and valve assembly 209. These fluid flow passages are kept separate within the heat exchange assembly 206 by gas tight barriers so that no exchange of material, and in particular no exchange of liquid water or water vapor, can occur between the different heat transfer mechanisms.

If an exchange of liquid water or water vapor between the different heat transfer mechanisms was possible, this transfer of water could result in the liquid water level in one or more of the heat transfer systems becoming too high or too low for efficient operation. This could result in the different sections 204c to 204e of the heat transport element 204 being at different temperatures.

In the third embodiment the primary heat exchange assembly 206 comprises three primary heat exchangers each having a plurality of heat transfer fins extending into a flow channel, or channels, carrying a first operating fluid. In the illustrated example of the third embodiment the first operating fluid is a pumped flow of water forming part of a domestic hot water and/or heating system. The secondary heat exchange assembly comprises three secondary heat exchangers each having a plurality of heat transfer fins extending into a second operating fluid. In the illustrated example of the third embodiment the second operating fluid is ambient air.

Each of the pipes 219 is connected to a respective one of the primary heat exchangers and a respective one of the secondary heat exchangers by a fluid flow passage. Each of these fluid flow passages is selectively blockable between the primary and secondary heat exchangers by a respective heat transfer control valve of the heat transfer control valve assembly 209. The three heat control valves are all operated simultaneously by the heat control valve assembly to ensure that the different sections 204c to 204e of the heat transport element 204 are maintained at the same temperature.

In some examples the three primary heat exchangers may be physically combined together. In some examples the three secondary heat exchangers may be physically combined together.

In other examples the three pipes 219 may be connected to a single fluid flow passage through the primary and secondary heat exchangers and heat transfer control valve so that the exchange of water between the different heat transfer mechanisms is possible. In such examples means for equalizing the water levels in the different heat transfer mechanisms may be provided.

In the third embodiment the trigger temperature of the heat transfer control valve assembly 209 may be predetermined. In some examples the trigger temperature may be settable in use, or on installation or manufacture of the hybrid solar energy converter 201. In some examples the trigger temperature may be settable to different values depending on the intended maximum water temperature of the water to be heated. In particular, in some examples the trigger temperature may be settable to 65° C. when the hybrid solar energy converter is to be used to heat water for a domestic hot water system and may be settable to 135° C. when the hybrid solar energy converter is to be used to heat water for an industrial hot water system.

In some examples the trigger temperature of the heat transfer control valve may be selected to maximize the generation of electrical energy by the photovoltaic elements 205. In some examples the trigger temperature value may be selected to increase the amount of heat energy transferred to the first operating fluid. In some examples the trigger temperature may be selected to optimize the overall production of energy, taking into account both the amount of electrical energy produced by the photovoltaic elements 205 and the amount of heat energy transferred to the first operating fluid. In some examples the optimizing may maximize the total production of energy. In some examples the optimum overall production of energy may take into account the relative demand for, or value of, the different types of energy, rather than simply maximizing the total amount of energy produced.

As explained above, the isothermal cooling tends to reduce, or prevent, the formation of hot spots or regions in the photovoltaic elements 205. This may allow the solar energy collector assembly 202 including the photovoltaic elements 205 to be operated at a higher temperature without reducing the efficiency with which the photovoltaic elements 205 produce electrical energy. This may allow the temperature of the collector assembly to be increased to produce more useable heat energy without the increase in temperature reducing the efficiency with which the photovoltaic elements 205 produce electrical energy. This may allow the trigger temperature to be increased.

In some examples the trigger temperature may be set to different temperatures during use of the hybrid solar energy converter 201. This may allow the temperature of the collector assembly to be controlled to produce different amounts of useable heat energy or electricity depending upon which type of energy is most in demand at a specific time.

For example, when hot water is more in demand than electricity the valve assembly 209 may be closed to pass hot water vapor from the heat transport element 204 only to the primary heat exchanger assembly 207 to maximize the amount of heat applied to the water acting as the first operating fluid regardless of any temporary reduction in efficiency of the photovoltaic elements 205 as a result of any resulting increase in temperature of the collector assembly. Further, when hot water is less in demand than electricity, the valve assembly 209 may be opened in order to pass hot water vapor from the heat transport element 204 to both of the primary and secondary heat exchanger assemblies 207 and 208 in order to cool the photovoltaic elements 205 as much as possible and maximize the efficiency of electricity generation regardless of the effects on the temperature of the water acting as the first operating fluid.

In the illustrated example of the third embodiment the temperature of the solar energy collector assembly 202, and thus the temperature of the photovoltaic elements 205, is controlled by operating the heat transfer control valve assembly 209 to selectively enable or disable the transfer of heat energy from the solar energy collector assembly 202 to the secondary heat exchanger 208.

In other examples other control methods can be used additionally or alternatively to control the temperature of the solar energy collector assembly 202. In some examples the temperature of the solar energy collector assembly 202 may be controlled by changing the rate of removal of heat energy from the solar energy collector assembly 202.

In some examples the rate of removal of heat energy from the solar energy collector assembly 202 can be controlled by altering the flow rate of the first operating fluid passing through the primary heat exchanger assembly 207. In some examples the rate of removal of heat energy from the solar energy collector assembly 202 can be controlled by altering the surface area over which the first operating fluid is in contact with the primary heat exchanger assembly 207, for example by selectively opening or closing fluid flow passages of the first operating fluid within the primary heat exchanger assembly 202.

In some examples the rate of removal of heat energy from the solar energy collector assembly 202 can be controlled by altering the vacuum pressure within the tube 203. This may change the rate of convective heat loss from the solar energy collector assembly 202 to the tube 203. In general, heat transferred to the tube 203 will be rapidly lost to the outside environment by convection and/or conduction.

In some examples the rate of removal of heat energy from the solar energy collector assembly 202 can be controlled by altering the vacuum pressure within sections 204c to 204e of the heat transport element 204. In general, the tendency of the liquid water within the front fluid flow channel 217 to vaporize and form bubbles of vapor 222 will increase as the vacuum pressure is reduced, and the tendency of the liquid water within the front fluid flow channel 217 to vaporize and form bubbles of vapor 222 will decrease as the vacuum pressure is increased. As is explained above, the density driven circulation of water around the front and rear fluid flow channels 217 and 218 and the transport of heat energy along the vapor manifolds 211 and the tubes 219 are both driven by water vapor. Accordingly, altering the tendency of the liquid water to vaporize by altering the vacuum pressure may allow the rate of removal of heat energy from the solar energy collector assembly 202, and the rate of removal of heat energy from the photovoltaic elements 205 to be controlled, and so allow the temperature of the solar energy collector assembly 202 and photovoltaic elements 205 to be controlled.

Further, the temperature at which rolling boiling of the water 221 within the front fluid flow channels 217 commences will tend to increase as the vacuum pressure is increased, and will tend to decrease as the vacuum pressure is decreased. Accordingly, in examples where the vacuum pressure within the heat transport element 204 is altered the temperature at which the water 221 within the front fluid flow channels 217 commences rolling boiling can be changed.

As is explained above, the density driven circulation of water around the front and rear fluid flow channels 217 and 218 becomes particularly vigorous, and becomes particularly effective as a heat transport mechanism, when the water 221 within the front fluid flow channels 217 enters a rolling boil state. Accordingly, altering the temperature at which the water 221 within the front fluid flow channels 217 commences rolling boiling by altering the vacuum pressure may allow the rate of removal of heat energy from the solar energy collector assembly 202 and photovoltaic elements 205 to be controlled, and so allow the temperature of the solar energy collector assembly 202 and photovoltaic elements 205 to be controlled.

In some examples the temperature of the solar energy collector assembly 202 may be controlled by changing the amount of solar energy incident on the solar energy collector assembly 202, and so changing the rate of absorption of heat energy by the solar energy collector assembly 202.

In some examples the amount of incident solar energy may be controlled by changing the orientation of the solar energy collector assembly relative to the direction of the incident solar energy. This can be carried out using a drive mechanism able to rotate the solar energy collector assembly about one or more axes.

In some examples the amount of incident solar energy may be controlled using adjustable light intercepting or blocking mechanisms in the path of the incident solar energy. In some examples variable filters, shutters, stops, or the like may be used. In some examples these adjustable light intercepting or blocking mechanisms may comprise physical devices. In some examples these adjustable light intercepting or blocking mechanisms may comprise devices having electronically controlled optical characteristics, such as liquid crystals.

In examples where the temperature of the solar energy collector assembly and/or the photovoltaic elements are to be controlled, a temperature sensor and a temperature controller may be provided, together with a temperature control mechanism arranged to carry out one, some, or all, of the methods of controlling temperature described above.

The temperature sensor is arranged to measure the temperature of the solar energy collector assembly and provide this temperature value to the temperature controller. The temperature controller can then operate the temperature control mechanism in a suitable manner to control the temperature of the solar energy collector assembly to the desired value.

Examples where the temperature of the photovoltaic elements is to be controlled a temperature sensor arranged to measure the temperature of a photovoltaic element or elements and provide this temperature value to the temperature controller may be provided. This may be additional to, or instead of, the temperature sensor arranged to measure the temperature of the solar energy collector assembly. The temperature controller can then operate the temperature control mechanism in a suitable manner to control the temperature of the photovoltaic element or elements to the desired value.

In some examples the temperature sensor can be provided on the upper surface of the solar energy collector assembly. In some examples the temperature sensor can be formed on the same semiconductor wafer as a photovoltaic element.

Conveniently, the temperature controller may be a suitably programmed general purpose computer.

In the illustrated third embodiment, the heat transport element 204 is divided into three sections 204c to 204e, each of which has a separate heat transfer system comprising a number of front and rear fluid flow channels 217 and 218, a vapor manifold 211, and a tube 219. Each of these separate heat transfer systems operates in a similar manner to the second embodiment described above. In other examples the heat transport element 204 may be divided into a different number of sections, each having a separate heat transfer system.

In the illustrated third embodiment the tubes 219 each extend outwardly from the side of the heat transport element 204, then turn through a right angle and extend parallel to the axis of the tube 203 to pass through the end cap 220 of the tube 203.

In other examples, the tubes 219 may be arranged differently. In some examples the tubes 219 may be interconnected for mutual support. This may improve the support provided to the heat transport element 204.

In the illustrated third embodiment the tubes 219 each extend outwardly from the end of a respective vapor manifold 211. In some examples the tubes 219 may extend from a different part of the respective vapor manifolds 211. In some examples the tubes 219 may extend from different parts of the respective vapor manifolds 211 from one another.

In the illustrated third embodiment the different sections 204c to 204e of the heat transport element 204 are each divided by a wall 231 extending between the front and rear sheets 214 and 215 to form a fluid tight seal between the fluid flow channels of the different sections. In other examples a different sealing structure could be used. In some examples the front and rear sheets 214 and 215 could be brought into contact to form the fluid tight seal. In some examples the rear sheet 215 could be bent towards the flat front sheet 214 to contact the front sheet 214 and form the fluid tight seal. In some examples the rear sheet 215 may be shaped by pressing.

The illustrated third embodiment is a hybrid solar energy converter comprising photovoltaic elements and arranged to convert incident solar radiation into outputs of both electrical energy and hot water. In other examples the photovoltaic elements may be omitted to provide a solar energy converter arranged to convert incident solar radiation into an output of hot water.

Alternative Collector Arrangements

The illustrated embodiments all employ a single substantially flat collector assembly within a tube. Other arrangements may be used.

In some examples the collector assembly may be curved. The curved collector assembly may be arranged to have a curved outer surface concentric with a cylindrical tube within which the collector assembly is mounted. This may allow a collector assembly having a greater surface area to be fitted within a cylindrical tube of a particular size. The curved collector assembly may have curved photovoltaic elements mounted on it.

Some examples may mount multiple collector assemblies within a single tube.

Some examples may mount multiple collector assemblies at different angles within a single tube. In examples where the collector assemblies and the tube are fixed this may allow the efficiency of the collector to be increased by arranging the different collector assemblies at angles adapted to more efficiently collect energy at different times of day.

In some examples mirrors and/or lenses may be associated with the hybrid solar energy converter to direct or focus incident solar energy onto the collector assembly. Such mirrors may be flat or curved. Such mirrors and/or lenses may be fixed or moveable. In some examples moveable mirrors or lenses may be arranged to track the sun.

In some examples the transparent tube may incorporate a lens to direct or focus incident solar energy onto the collector assembly. In some examples the transparent tube may incorporate a Fresnel lens.

Alternative Tube Arrangement

Figure 22:
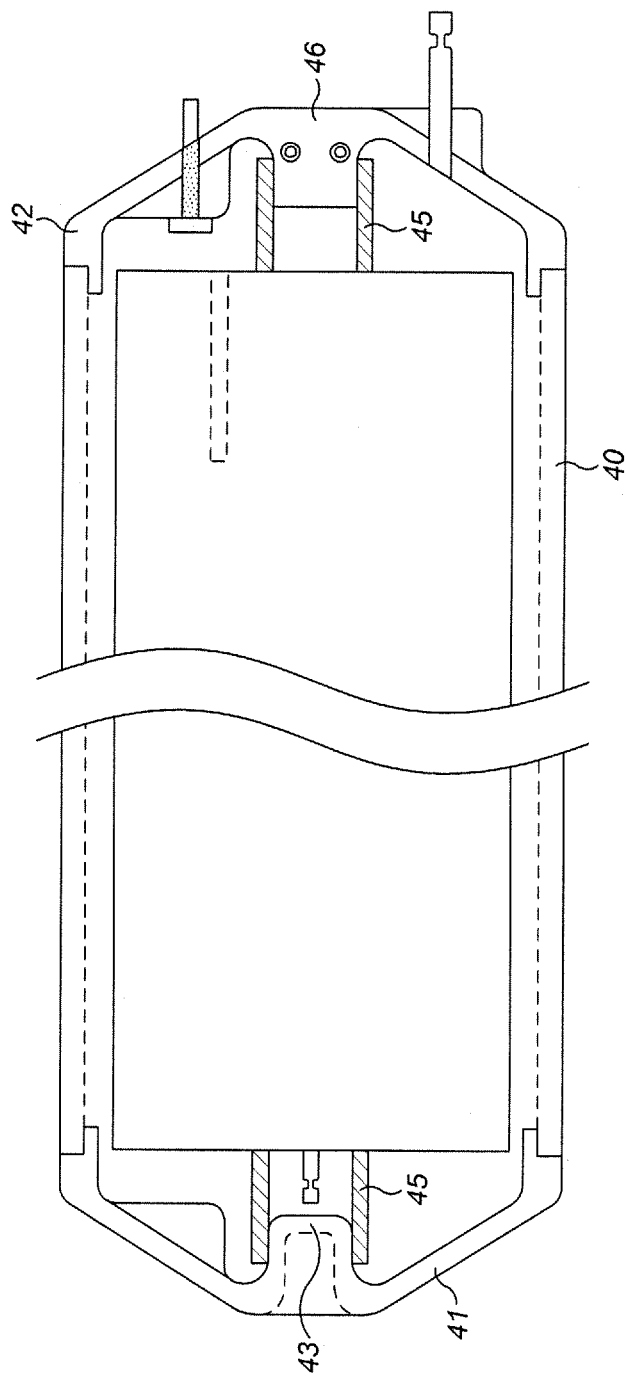
FIG. 22 is a diagram of an alternative transparent tube useable in a hybrid solar energy converter according to the invention.

FIG. 22 illustrates an alternative arrangement of the transparent tube. In this arrangement, the transparent tube is formed by a cylindrical glass tube 40 having a first glass end cap 41 and a second glass end cap 42.

The first and second end caps 41 and 42 each have a respective central spigot 43 and 44 extending inwardly along the axis of the cylindrical glass tube 40. In this arrangement the heat transport element 4 has a bearing 45 at each end. Each of the bearings 45 fits over one of the spigots 43 and 44 to rotatably support the solar energy collector assembly 2 within the transparent tube 3. In the illustrated arrangement the solar energy collector assembly 2 is supported at both ends by the bearings 45, and is not supported, or is not wholly supported, through the cylindrical tube 13.

The spigot 44 of the end cap 42 at the end of the tube 3 adjacent the heat exchange assembly 6 has a central through bore 46 allowing the tube 13 of the heat transport element 4 to reach the heat exchange assembly 6. The end cap 42 adjacent the heat exchange assembly 6 also has electrical conductors 47 passing through the end cap 42 to carry the electrical energy generated by the photovoltaic elements 5 away from the solar energy collector assembly 2.

In this arrangement the solar energy collector assembly 2 may be rotated within the cylindrical glass tube 40, and independently of the cylindrical glass tube 40, to suit the geography of the location at which it is mounted in order to maximize exposure of the solar energy collector assembly 2 to incident solar radiation.

In some examples the cylindrical tube 13 may be connected to the heat exchange assembly 6 through a rotating seal or joint to allow the solar energy collector assembly 2 to rotate within the cylindrical glass tube 40 independently of the heat exchange assembly 6.

In the illustrated arrangement shown in FIG. 22 the alternative transparent tube is shown in combination with the solar energy collector assembly 2 according to the first embodiment. The illustrated alternative transparent tube can also be combined with the solar energy collector assemblies according to the other embodiments.

Sun Tracking

The embodiments described above are solar energy converters which convert incident solar radiation into useable electrical and/or heat energy.

In some examples the collector assemblies of the solar energy converters may be arranged to change their orientation to follow the apparent movement of the sun across the sky, or track the sun. This may increase the amount of solar radiation energy incident on the collector assemblies, for well-known geometric reasons, and so may increase the amount of useable electrical and/or heat energy produced.

Figure 23:
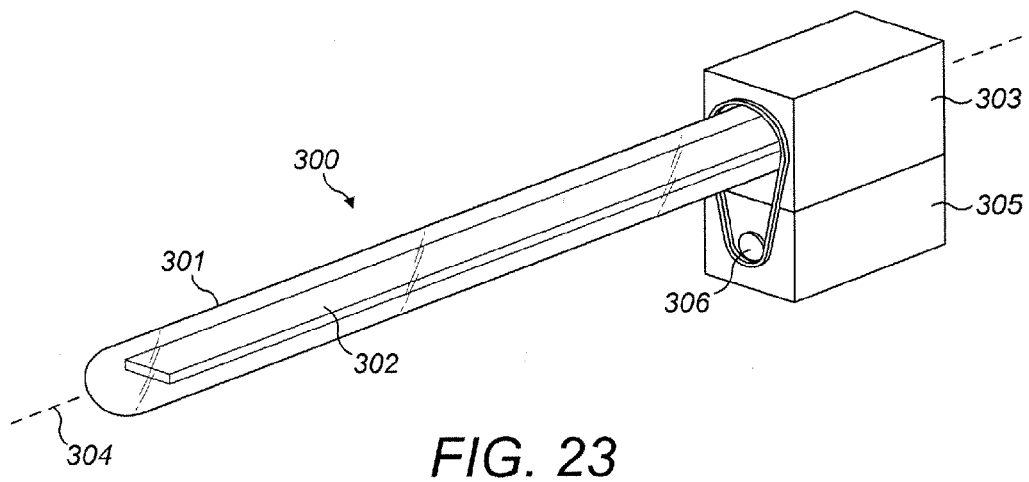
FIG. 23 is a diagram of a solar energy collector arranged for rotation about a single axis.

FIG. 23 shows a general view of a solar energy converter 300 arranged to be able to change orientation to track the sun.

The solar energy converter 300 comprises a sealed transparent tube 301 containing a solar energy collector assembly 302 and mounted to a heat exchange assembly 303. The solar energy converter 300 may be a solar energy converter according to any of the embodiments disclosed herein. Sun tracking arrangements may be added to any of the embodiments.

In the example of FIG. 23 the sealed transparent tube 301 is cylindrical and has an axis 304. The sealed transparent tube 301 is mounted for rotation about the axis 304 together with the solar energy collector assembly 302 mounted within the tube 301. A drive motor 305 is arranged to rotationally drive the tube 301 through a transmission mechanism 306. In the illustrated example the transmission mechanism 306 is a cog and chain transmission mechanism.

By selectively operating the drive motor 305 based on the time and date, the sealed transparent tube 301 and solar energy collector assembly 302 can be rotated to follow the sun as the apparent position of the sun changes as a result of the rotation of the earth.

Adding such a solar tracking drive system may increase the amount of energy gathered by the solar energy collector assembly by about 20%.

Figure 24:
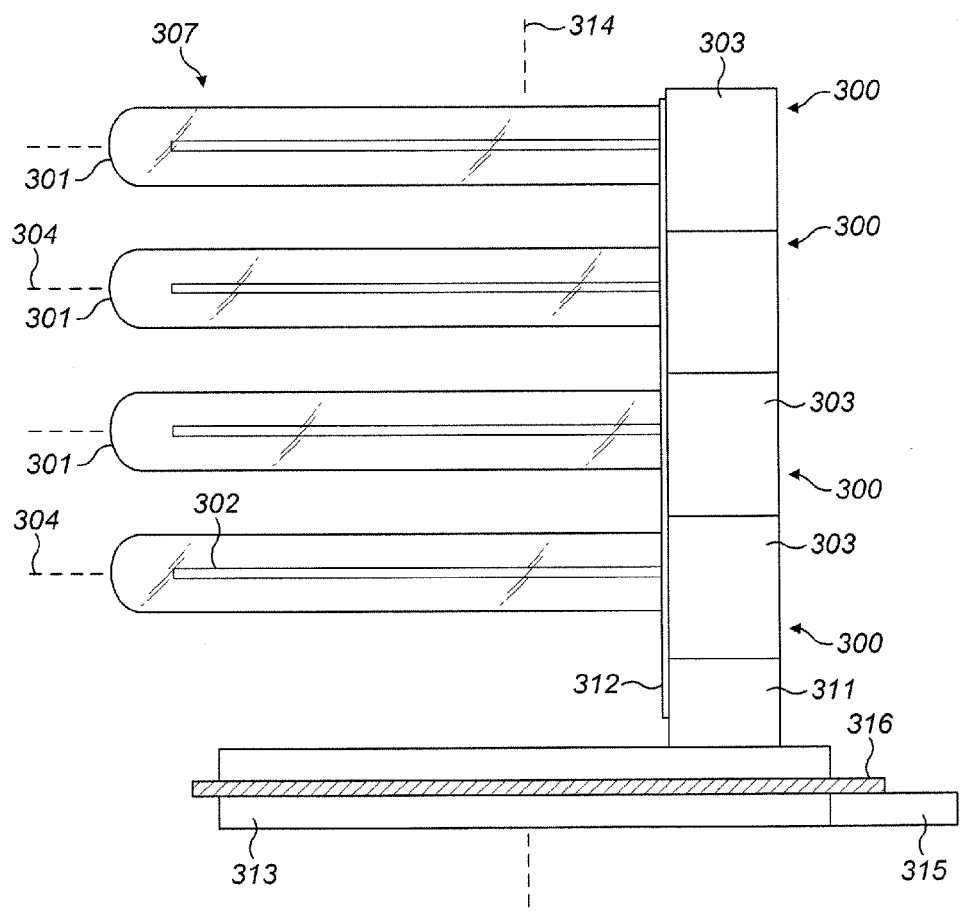
FIG. 24 is a diagram of a solar energy collector array arranged for rotation about two axes.

In the example of FIG. 24, a plurality of solar energy converters 300 are mounted to form an array 307. Each of the solar energy converters 300 comprises a sealed transparent tube 301 containing a solar energy collector assembly 302 and mounted to a heat exchange assembly 303. Each sealed transparent tube 301 is mounted for rotation about an axis 304 together with the solar energy collector assembly 302 mounted within the tube 301. The transparent tubes 302 are mounted on the array 310 so that their respective axes of rotation 304 are parallel.

A drive motor 311 is arranged to rotationally drive the tubes 301 of the array 310 in synchrony through a transmission mechanism 312. In the illustrated example the transmission mechanism 312 is a cog and chain transmission mechanism.

The array 310 is mounted on a turntable 313 for rotation about an axis 314 perpendicular to the axes 304. A drive motor 315 is arranged to rotationally drive the turntable 313 through a transmission mechanism 316. In the illustrated example the transmission mechanism 316 is a geared transmission mechanism.

By selectively operating the drive motors 305 and 315 based on the time and date, the sealed transparent tubes 301 and solar energy collector assemblies 302 of the array 310 can be rotated to follow the sun as the apparent position of the sun changes as a result of the rotation of the earth.

Adding such a dual axis solar tracking drive system may increase the amount of energy gathered by the solar energy collector assemblies 302 by up to about 48%.

In the examples of FIGS. 23 and 24, the operating of the drive motor or motors should take into account the location of the solar energy converter or converters 300.

In other examples the array 310 can be rotated about one or two axes to follow the sun. Rotation about a single axis may increase the amount of energy gathered by up to about 20%, while rotation about two axes may increase the amount of energy gathered by up to about 48%.

In other examples the solar energy collector assembly may be mounted within the tube for rotation relative to the tube and a drive motor arranged to rotationally drive the solar energy collector assembly only. In such examples a drive mechanism which will not allow air leakage, which would destroy the vacuum within the tube, should be used.

In other examples the solar energy collector assembly, or the solar energy collector assembly together with the tube, may be rotated about an axis other than the axis of the tube.

General

In the description above the level of water within the heat transport elements of the different embodiments is referred to. The references to the level of water refer to the level of water when the heat transport element is cold and the liquid water contains essentially no bubbles of water vapor. It will be understood from the above description that the level of the water will vary during operation of the heat transport elements as water vapor bubbles are formed in the liquid water and burst, and as the liquid water is vaporized and the water vapor condenses.

In the illustrated embodiments primary and secondary heat exchangers separated by a heat transfer control valve are used. As is explained above, this arrangement may provide advantages in preventing stagnation, limiting the maximum temperature of the solar energy collector assembly and any attached components such as photovoltaic elements, and controlling a hybrid solar energy collector to selectively maximize production of electricity or useable heat energy. In other examples a primary heat exchanger or exchangers only may be used, and the arrangement of a secondary heat exchanger switched by a heat transfer control valve may be omitted.

In some examples, one or more of the arrangements described above for controlling the temperature of the solar energy collector may be used instead of, or in addition to, the provision of a secondary heat exchanger and a heat transfer control valve.

In the illustrated embodiments the heat transport elements may have an operating temperature range from just over 0° C. to about 270° C. In practice, the operating temperature range for domestic instillations may be limited to a maximum temperature of 95° C., or of 65° C., for safety, and to comply with legal requirements in some jurisdictions. Where silicon photovoltaic elements are used the optimum temperature range to maximize the generation of electricity may be in the range 20° C. to 65° C., or in the range 20° C. to 30° C., or in the range 25° C. to 30° C.

In the illustrated embodiments the heat exchangers are connected to the vapor manifold or liquid passage by a tube or channel so that only water vapor contacts the heat exchanger surfaces and is condensed to transfer heat to the heat exchanger. In other examples the, or each, heat exchanger may be located so that some liquid water contacts the heat exchanger. The, or each, heat exchanger may be partially immersed in the liquid water. This would also apply is other working fluids were used instead of water.

The heat transfer rate of the primary and secondary heat exchangers, that is the rate at which the heat exchangers can transfer heat energy from the heat transfer element to their respective operating fluids, may be matched to the heat transfer rate of the heat transfer element, that is the rate at which the heat transfer element can transfer heat from the isothermally cooled face of the collector assembly to the heat exchanger assembly, at the expected operating temperature, or over the expected operating temperature range, of the system. This may improve efficiency.

In the illustrated embodiments the primary operating fluid is water to be heated and the secondary operating fluid is ambient (free) air. In other examples the secondary operating fluid may be ducted air. This may allow the secondary operating fluid air to be used for low level heating such as space heating, and may allow the secondary operating fluid air to be blown past the secondary heat exchanger, which may increase the rate of heat loss from the secondary heat exchanger. In other examples the primary operating fluid may be air. In other examples the secondary operating fluid may be water.

In other examples the primary and/or secondary operating fluids may be fluids other than water and air.

In the illustrated embodiments a transparent tube or envelope is used. In other examples this may be replaced by a translucent or partially opaque tube or envelope.

In general, in all of the embodiments it may be preferred to have the photovoltaic elements as thin as possible to ensure effective cooling of the entire thickness of the photovoltaic elements by the heat transport element. This may assist in preventing localized hot spots of elevated temperature developing within the photovoltaic elements, which hot spots may degrade the performance and reliability of the photovoltaic elements. However, in practice there may be a minimum required thickness of the photovoltaic elements for other reasons, for example physical strength.

In the illustrated embodiments degassed distilled water is used. This may provide the advantage that the tendency to vaporize of the water is maximized, increasing the efficiency of the heat transfer by the thermo siphon. Impurities dissolved in the water, including dissolved gasses, will tend to suppress vaporization of the water.

In some examples the water may contain vaporization enhancing additives to increase the tendency of the water to vaporize. In some embodiments particles of hydrophobic materials may be used, in particular particles of zinc oxide may be used. The particles of hydrophobic molecules may act as nucleating sites, boosting the formation of bubbles of water vapor, without tending to suppress vaporization.

In all of the embodiments, nucleation enhancing structures may be added to the surfaces of the riser channels only, and not the return channels. This may encourage the liquid water to vaporize and form bubbles primarily, or only, in the riser channels even when the water in the riser and return channels are at similar, or the same, temperature. Suitable nucleation enhancing structures may include micropores and/or surface roughening.

In all of the embodiments, pores or apertures may be provided in the sheet separating the riser and return channels to allow water to pass from the return channel to the riser channel. This may improve the circulation of the liquid water and improve the efficiency of the heat transfer.

In the illustrated embodiments water is used as the working fluid within the heat transport element to provide the density driven circulation. In other embodiments other vaporizable liquids, solutions or mixtures may be used. In particular a mixture of water and glycol may be used, ethanol may be used, and a mixture of ethanol and water may be used. Mixtures of dissimilar fluids where one fluid acts as a nucleating agent for another fluid may be used.

In other examples a mixture of 75% water and 25% ethanol may be used as the working fluid within the heat transport element. When a mixture of 75% water and 25% ethanol is used the mixture may enter a rolling boil state at a temperature of about 22° C. In other embodiments the relative proportions of water and ethanol used as the working fluid may be varied in order to set the temperature at which a rolling boil commences to a desired temperature.

As discussed above, the effectiveness of the heat transport mechanism significantly increases when rolling boiling of the working fluid commences. Accordingly, it applications where it is desirable to keep the temperature of the cooled face of the collector assembly below a specific temperature, it may be preferred to select a working fluid, or mixture, which commences rolling boiling at a temperature at or below said specific temperature at the intended vacuum pressure conditions within the heat transfer device.

In examples where the solar energy collector assembly rotates relative to the evacuated tube a rotating vacuum seal must be provided between them. In some examples a rotating vacuum seal may be provided by a multi-stage seal. In particular a multi-stage o-ring seal may be used.

Where a multi-stage o-ring seal is used an advantageous method of manufacture may be to form the o-ring seals of the different stages in order from the interior of the evacuated tube to the exterior while evacuating the tube. This will provide a multi-stage o-ring seal with the regions between the seals initially having the same vacuum pressure as the interior of the tube. Such a multi-stage o-ring seal may support a long lasting vacuum within the tube even when the multi-stage o-ring seal is used as a rotating vacuum seal.

The above embodiments illustrate and describe a single solar energy converter. In practice an array made up of a plurality of such units may be used. In such an array each solar energy converter may have a dedicated electrical inverter. Alternatively, a group of a plurality of solar energy converters may share a common inverter.

In an array of solar energy converters it may be preferred to have a primary operating fluid channel running through the primary heat exchangers of all of the energy converters of the array as a common manifold.

In an array of solar energy converters it may be preferred for adjacent solar energy converters to have their respective inlet opening and outlet opening connected directly together. This may be done by providing a flange around each inlet opening and outlet opening and clamping together the flanges of the adjacent inlet opening and outlet opening of adjacent solar energy converters.

In an array of solar energy converters it may be desirable to be able to extract individual solar energy converters from the array for servicing, or to replace faulty converters, without having to drain all of the fluid from the common manifold. Accordingly, fluid cut off valves may be provided in the primary heat exchanger of each solar energy converter in order to seal the appropriate one of the inlet opening or outlet opening when an adjacent solar energy converter is removed from the array.

The embodiments described above comprise a collector assembly within an evacuated cylindrical tube. In some examples the collector assembly may be located within an enclosure which is not evacuated. In some examples enclosures which are not cylindrical tubes may be used.

The embodiments set out above are described in the context of a hybrid solar energy converter. The different parts of the described hybrid solar energy converter may be useable independently.

In particular, the solar energy collector assembly and the heat exchange assembly may be used in a flat panel device without a separate evacuated transparent tube for the solar energy collector assembly. Such a flat panel device may be evacuated, or alternatively may not be evacuated.

In particular, the collector assembly may be used as a thermal collector to gather heat energy from incident solar radiation without any photovoltaic elements being mounted on the collector assembly.

An array of solar energy converters may comprise both hybrid solar energy converters with photovoltaic elements mounted on the collector assembly and thermal solar energy converters without photovoltaic elements mounted on the collector assembly. Such an array may be used to heat water, with the hybrid solar energy converters heating the water to an intermediate temperature and the thermal solar energy converters heating the water from the intermediate temperature to a high temperature. The thermal solar energy converters without photovoltaic elements may operate at a higher temperature than the hybrid solar energy converters because they do not have any photovoltaic elements to suffer thermal degradation.

In some examples the collector assembly may be used as a thermal collector to heat air or water in industrial or domestic applications. In some examples the collector assembly may be used as a thermal collector to heat water in a desalination or water purifying application.

In particular, the heat exchange assembly may be used separately in solar energy heat collectors without the photovoltaic elements and/or without the heat transport element. This may allow the problem of stagnation to be solved.

In particular, the heat transport element may provide a density driven heat transport mechanism useable in other heat transport applications.

In particular, the heat transport element may provide an isothermal cooled surface useable in other applications.

In particular, the isothermal cooled surface may be curved. This may allow curved objects to be cooled more efficiently.

In one example the heat transport element may be used to cool electrical circuits, for example in a computer.

If the heat transport element is used in other applications, and not in conjunction with photovoltaic elements, the heat transport element may operate at a wider range of temperatures. In one example the heat transport element using water as the working fluid may operate at a temperature of up to 280° C. In other examples other fluids may be used as the working fluid. In one example of a high temperature application sodium may be used as the working fluid within the heat transport element.

In some examples the heat transport element may transport heat to one or more electro-thermal power generators in place of one or both heat exchangers. This may increase the amount of electrical energy generated. In particular the heat transport element may transport heat to a Stirling engine or engines.

In the illustrated embodiment vacuums are used within the heat transport element having a pressure of about $10^{-3}$ mbar. Higher or lower pressures may be used. In general, it is expected that using lower vacuum pressures would improve the performance of the hybrid solar energy converter. In some examples a vacuum pressure of $10^{-2}$ bar or lower may be used. In some examples vacuum pressures of $10^{-6}$ mbar or $10^{-8}$ mbar may be used.

A vacuum pressure of $10^{-3}$ mbar is generally the lowest pressure that can be provided by simple vacuum pumps, so that the use of this vacuum pressure is convenient as the necessary vacuum pumps are readily available. The use of this vacuum pressure may be economically advantageous in commercial scale production of hybrid solar energy converters because of the cost of providing a lower vacuum pressure. In other embodiments higher or lower vacuum pressures may be used.

In the illustrated embodiments the hybrid solar energy converter has roof and/or wall mounting brackets. In other embodiments different mounting methods and components may be used.

The description above describes three embodiments. All of the embodiments are closely related and alternatives, explanations and advantages disclosed in relation to one of the embodiments can generally be applied in an analogous manner to the other embodiments. In particular, elements of one embodiment may be used in the other embodiments, and analogous elements can be exchanged between the embodiments.

The above description uses relative location terms such as upper and lower and front and rear. These are used for clarity to refer to the relative locations of the referenced parts in the illustrated figures, and should not be regarded as limiting regarding the orientation and/or location of parts of embodiments of the invention during manufacture or in use.

Those skilled in the art will appreciate that while the foregoing has described what are considered to be the best mode and, where appropriate, other modes of performing the invention, the invention should not be limited to specific apparatus configurations or method steps disclosed in this description of the preferred embodiment. It is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings. Those skilled in the art will recognize that the invention has a broad range of applications, and that the embodiments may take a wide range of modifications without departing from the inventive concept as defined in the appended claims.

The invention claimed is:

1. A solar energy converter comprising:
    a solar energy absorber, the solar energy absorber comprising a photovoltaic element;
    a heat transfer element in thermal contact with the photovoltaic element of the solar energy absorber; and
    a liquid within the heat transfer element;
    wherein the heat transfer element comprises:
    a first sheet having a first inner surface and a second sheet having a second inner surface;
    a partition having first and second outer surfaces and located between the first and second inner surfaces so as to define a plurality of first fluid flow passages between the first inner surface and the first outer surface and a plurality of second fluid flow passages between the second inner surface and the second outer surface; and
    a third surface arranged to be in thermal contact with the liquid in the first fluid flow passages;
    wherein the photovoltaic element and the first fluid flow passages are on opposite sides of the first sheet;
    wherein the heat transfer element is configured and arranged so that heat energy from the third surface causes a portion of the liquid in the first fluid flow passages to vaporize to form vapor;
    wherein the heat transfer element is further configured and arranged so that the vapor travels upwardly along the first fluid flow passages by way of a rolling boil such that the vapor drives a circulation of non-vaporized portions of the liquid from the plurality of second fluid flow passages to the first fluid flow passages, upwardly along the first fluid flow passages to the plurality of second fluid flow passages, and then downwardly along the plurality of second fluid flow passages;

wherein each of the first fluid flow passages extends in a direction of the circulation of the non-vaporized portions of the liquid through the first fluid flow passages;

wherein the first sheet is bonded to the partition between each adjacent first fluid flow passage and the second sheet is bonded to the partition between each adjacent second fluid flow passage; and whereby the heat transfer element is arranged to transfer heat energy away from the photovoltaic element to cool the photovoltaic element.

2. A solar energy converter according to claim 1, wherein the solar energy absorber is located within an envelope.

3. The solar energy converter according to claim 2, wherein the envelope is a tube.

4. The solar energy converter according to claim 3, wherein the envelope has a circular cross-section.

5. A solar energy converter according claim 2, wherein the envelope is at least partially transparent.

6. The solar energy converter according to claim 2, wherein the envelope is at least partially evacuated.

7. The solar energy converter according to claim 2, wherein the envelope is at a pressure of $10^{-3}$ mbar or less.

8. The solar energy converter according to 2, wherein the envelope is at a pressure of $10^{-6}$ mbar or less.

9. The solar energy converter according to claim 1, wherein the photovoltaic element comprises a semiconductor material.

10. The solar energy converter according to claim 1, wherein the photovoltaic element comprises silicon.

11. The solar energy converter according to claim 1, wherein the photovoltaic element comprises gallium arsenide.

12. The solar energy converter of claim 1, wherein the first sheet is bonded to the partition and the second sheet is bonded to the partition by solder, welding, or adhesive.

13. The solar energy converter according to claim 1, further comprising:
    a first heat exchanger, wherein the first heat exchanger is in thermal contact with the heat transfer element;
    a second heat exchanger; and
    a heat transfer control element configured to selectively place the second heat exchanger in thermal contact with the heat transfer element.

14. The solar energy converter according to claim 13, wherein the first heat exchanger is arranged to transfer heat from the heat transfer element to a first fluid.

15. The solar energy converter according to claim 14, wherein the first fluid is water.

16. The solar energy converter according to claim 15, wherein the second heat exchanger is arranged to transfer heat from the heat transfer element to a second fluid.

17. The solar energy converter according to claim 16, wherein the second fluid is air.

18. The solar energy converter according to claim 13, wherein the heat transfer control element is arranged to selectively place the second heat exchanger either in thermal contact with the heat transfer element or out of thermal contact with the heat transfer element in response to a sensed temperature.

19. The solar energy converter according to claim 18, wherein the sensed temperature is a temperature of the first heat exchanger.

20. The solar energy converter according to claim 13, further comprising a third fluid flow passage in fluid communication with the heat transfer element that extends through the first heat exchanger and into the second heat exchanger.

21. The solar energy converter according to claim 13, wherein the heat transfer control element is arranged to selectively block the liquid in the heat transfer control element from reaching the second heat exchanger.

* * * * *